(12) United States Patent
Nasuno et al.

(10) Patent No.: US 8,957,300 B2
(45) Date of Patent: Feb. 17, 2015

(54) SUBSTRATE FOR PHOTOELECTRIC CONVERSION DEVICE, PHOTOELECTRIC CONVERSION DEVICE, AND STACKED PHOTOELECTRIC CONVERSION DEVICE

(75) Inventors: Yoshiyuki Nasuno, Kashihara (JP); Noriyoshi Kohama, Katsuragi (JP); Kazuhito Nishimura, Katsuragi (JP); Takashi Hayakawa, Kyoto (JP)

(73) Assignee: Sharp Kabushiki Kaisha, Osaka (JP)

( * ) Notice: Subject to any disclaimer, the term of this patent is extended or adjusted under 35 U.S.C. 154(b) by 1850 days.

(21) Appl. No.: 10/587,541

(22) PCT Filed: Jan. 7, 2005

(86) PCT No.: PCT/JP2005/000142
§ 371 (c)(1),
(2), (4) Date: Jul. 28, 2006

(87) PCT Pub. No.: WO2005/081324
PCT Pub. Date: Sep. 1, 2005

(65) Prior Publication Data
US 2007/0151596 A1    Jul. 5, 2007

(30) Foreign Application Priority Data

| Feb. 20, 2004 | (JP) | 2004-044868 |
| Mar. 30, 2004 | (JP) | 2004-100302 |
| Apr. 16, 2004 | (JP) | 2004-122086 |
| Sep. 22, 2004 | (JP) | 2004-275703 |

(51) Int. Cl.
*H01L 25/00* (2006.01)
*H01L 31/0236* (2006.01)
*H01L 31/0224* (2006.01)
*H01L 31/076* (2012.01)
*H01L 31/18* (2006.01)

(52) U.S. Cl.
CPC .... *H01L 31/0236* (2013.01); *H01L 31/022466* (2013.01); *H01L 31/076* (2013.01); *H01L 31/1884* (2013.01); *Y02E 10/548* (2013.01)
USPC ........................................................ 136/243

(58) Field of Classification Search
USPC ........................................................ 136/243
See application file for complete search history.

(56) References Cited

U.S. PATENT DOCUMENTS

| 4,281,208 A * | 7/1981 | Kuwano et al. ............... 136/249 |
| 5,021,100 A | 6/1991 | Ishihara et al. |
| 5,350,459 A * | 9/1994 | Suzuki et al. ................. 136/263 |

(Continued)

FOREIGN PATENT DOCUMENTS

| EP | 1 443 527 A1 | 8/2004 |
| EP | 1 583 155 A1 | 10/2005 |

(Continued)

OTHER PUBLICATIONS

Supplementary European Search Report mailed Nov. 24, 2009 in EP application 05719054.8.

(Continued)

*Primary Examiner* — Shannon Gardner
(74) *Attorney, Agent, or Firm* — Nixon & Vanderhye, P.C.

(57) ABSTRACT

A substrate 1 for a photoelectric conversion device includes a first transparent conductive layer 5 formed on at least a part of the surface region of a transparent substrate 3, the first transparent conductive layer 5 having at least an opening portion 7 exposing the substrate 3.

32 Claims, 11 Drawing Sheets

(56) References Cited

U.S. PATENT DOCUMENTS

| | | | |
|---|---|---|---|
| 6,469,242 B1* | 10/2002 | Kondo | 136/251 |
| 6,750,394 B2 | 6/2004 | Yamamoto et al. | |
| 6,787,692 B2 | 9/2004 | Wada et al. | |
| 2002/0050289 A1* | 5/2002 | Wada et al. | 136/256 |
| 2004/0155236 A1* | 8/2004 | Fujisawa et al. | 257/21 |

FOREIGN PATENT DOCUMENTS

| | | |
|---|---|---|
| JP | 02-237172 | 9/1990 |
| JP | 03-029374 | 2/1991 |
| JP | 4-127580 A | 4/1992 |
| JP | 04-324685 | 11/1992 |
| JP | 09-139515 | 5/1997 |
| JP | 11-186573 | 7/1999 |
| JP | 2000-252500 | 9/2000 |
| JP | 2000-294812 | 10/2000 |
| JP | 2001-176334 A | 6/2001 |
| JP | 2001-284611 A | 10/2001 |
| JP | 2002-141523 | 5/2002 |
| JP | 2002-141524 | 5/2002 |
| JP | 2002-141525 | 5/2002 |
| JP | 2002-280590 | 9/2002 |
| JP | 2002-314109 | 10/2002 |
| JP | 2003-060217 | 2/2003 |
| JP | 2003-124481 | 4/2003 |
| JP | 2003-347572 | 12/2003 |
| JP | 2004-296652 | 10/2004 |
| WO | 03/017378 | 2/2003 |
| WO | 03/036657 A1 | 5/2003 |
| WO | 03/065462 | 8/2003 |
| WO | 2004/064167 A1 | 7/2004 |

OTHER PUBLICATIONS

Japanese Office Action mailed Oct. 27, 2009 in corresponding Japanese application 2006-510167.

English translation of the International Preliminary Report on Patentability mailed Sep. 28, 2006 in corresponding PCT application PCT/JP2005/000142.

International Search Report for PCT/JP2005/000142 dated May 10, 2005.

Nasuno et al., *Effect of perforated transparent electrodes on light transmittance and light scattering in substrates used for microcrystalline silicon thin-film solar cells*, Applied Physics Letter 88, 071909 (2006), 3 pages.

Kohama et al., *Effect of perforated transparent electrodes on light transmittance and light scattering in substrates used for microcrystalline silicon thin-film solar cells*, Extended Abstracts, the 53$^{rd}$ Spring Meeting, 2006; The Japan Society of Applied Physics and Related Societies, p. 973, 23p-Y-15, 4 pages with translation.

* cited by examiner

SUBSTRATE FOR PHOTOELECTRIC CONVERSION DEVICE, PHOTOELECTRIC CONVERSION DEVICE, AND STACKED PHOTOELECTRIC CONVERSION DEVICE

This application is the US national phase of international application PCT/JP2005/000142, filed 7 Jan. 2005, which designated the U.S. and claims priority to JP 2004-044868, filed 20 Feb. 2004; JP 2004-100302, filed 30 Mar. 2004; JP 2004-122086, filed 16 Apr. 2004 and JP 2004-275703, filed 22 Sep. 2004, the entire contents of each of which are hereby incorporated by reference.

TECHNICAL FIELD

The present invention relates to a substrate for a photoelectric conversion device, a photoelectric conversion device, and a stacked photoelectric conversion device, which can attain a high photocurrent and high photoelectric conversion efficiency.

BACKGROUND ART

On fossil fuels such as petroleum and the like, there are a fear of future resource depletion and a problem of carbon dioxide emission causing a global warming phenomenon. In recent years, photo voltaic systems become widespread particularly due to growing environmental concerns and the cost-reduction of systems and are expected as alternative energy sources of fossil fuels such as petroleum and the like.

Common solar cells are classified into a bulk solar cell and a thin film solar cell. The bulk solar cell is made using a semiconductor of a bulk crystal such as monocrystalline silicon or polycrystalline silicon, or a gallium arsenide compound solar cell or the like, and in many of the solar cells, mass production technologies have been established. But, recently, there are problems that raw materials are lacking because of rapidly increasing production of the bulk solar cell and cost reduction is difficult. Contrary, since the thin film solar cell can reduce significantly the quantity of semiconductor to be used, it receives widespread attention as a next-generation solar cell which can resolve the shortages of the raw materials and has the potential for substantially reducing the cost. Specifically, while the above bulk solar cell has a thickness of several hundreds µm, the above thin film solar cell has a semiconductor layer of 10 µm to several µm or less. A structure of the thin film solar cell can be generally classified into the following two types; i.e., a superstrate type in which a transparent conductive layer, a photoelectric conversion layer and a backside electrode layer are stacked in this order on a transparent substrate and light enters a solar cell from a transparent substrate side, and a substrate type in which a backside electrode layer, a photoelectric conversion layer, a transparent conductive layer and a metal grid electrode are stacked in this order on a non-transparent substrate and light enters a solar cell from a metal grid electrode side.

In the thin film solar cell, since the quantity of a semiconductor used is small as described above, technology of making effective use of light entering the semiconductor layer is very important in order to attain high photoelectric conversion efficiency. One example of the techniques for this is an optical confinement technique. The optical confinement technique is a technique in which by forming a structure to scatter or refract light at the interface between the photoelectric conversion layer and a material having a refractive index which is different to that of the photoelectric conversion layer, a substantial optical path length in the photoelectric conversion layer is extended and thereby the quantity of light absorption is increased and the photoelectric conversion efficiency is enhanced.

Particularly in the thin film solar cell of the above-mentioned superstrate type, the above-mentioned transparent conductive layer is required to satisfy the following two effects in order to improve an optical confinement effect. First, light absorption in the above transparent conductive layer is low, that is, the transparent conductive layer has high transmittance. Thereby, the light entering the thin film solar cell from a transparent substrate side can be more sent into the photoelectric conversion layer. Secondly, the transparent conductive layer has a structure capable of scattering or refracting incident light effectively (an optical confinement structure). As this optical confinement structure, a surface texture structure of the above-mentioned transparent substrate, the above-mentioned transparent conductive layer or the like is often used. And, it is generally known that a haze index can be used as one characteristic for evaluating the above-mentioned optical confinement structure, and light scattered or reflected by this optical confinement structure increases as the haze index increases. Further, as the condition required of the above transparent conductive layer in addition to the optical confinement effect, it is also important that an electrical resistance (sheet resistance) is low. Since the above transparent conductive layer also serves as a collector electrode for collecting power generated in the photoelectric conversion layer and taking it out, when the sheet resistance becomes lower, a resistance loss is reduced and high photoelectric conversion efficiency can be attained.

Examples of conventional technologies using the above optical confinement effect include the following technologies. For example, in Japanese Unexamined Patent Publication No.2002-314109, a size or a density of a circular hole formed on the surface of the transparent conductive layer, and further a level difference between projections and depressions of a texture structure and a pitch of projections and depressions of a texture structure formed on the surface of the hole are specified. And, in Japanese Unexamined Patent Publication No.2002-141525, a root-mean-square of the level difference between projections and depressions of a texture structure on the surface of the transparent conductive layer, and an angle of tilt of projections and depressions of a texture structure are specified. However, when a substrate having a surface texture structure in which the level difference between projections and depressions of a texture structure is large and the pitch of projections and depressions of a texture structure is small is used, there are problems that mechanical or electrical defects resulting from the texture structure tends to occur and these defects causes the reduction in the open circuit voltage of the photoelectric conversion device or the reduction in the yield. Therefore, it is thought that this causes variations in the performance of the photoelectric conversion device to be larger. Then, Japanese Unexamined Patent Publication No.2000-252500 proposes to decrease defects of a photoelectric conversion unit layer and reduce variations in photoelectric conversion characteristics by specifying the level difference between projections and depressions of a texture structure of a first layer and that of a second layer, respectively, using a transparent conductive layer having a two layer structure And, the use of a structure of a stacked photoelectric conversion device also constitutes a technology of making effective use of incident light. The structure of a stacked photoelectric conversion device is a structure for splitting an incident light spectrum and receiving the split light spectrum in a plurality of photoelectric conversion layers, and by stacking a plurality of photoelectric conversion layers which use a semiconductor material having a bandgap suitable for absorbing the respective wavelength bands in decreasing order of bandgap from light entrance side, it is possible to absorb the short-wavelength light in the photoelectric conversion layer having a large bandgap and the long-wavelength light in the photoelectric conversion layer having a small bandgap, respectively. Therefore, sunlight having a wider wavelength band can contribute to the photoelectric conversion compared with a device provided with one photoelectric conversion layer, and therefore it becomes possible to enhance the photoelectric conversion efficiency. Here, in the above-mentioned stacked photoelectric conversion device, since a plurality of photoelectric conversion layers are connected in series, an open circuit voltage becomes the sum of the voltages generated in the respective photoelectric conversion layers and makes effective use of these voltages, but the short circuit current density becomes limited to the minimum of photocurrents generated in the respective photoelectric conversion layers. Accordingly, equalization of the values of photocurrent generated in each photoelectric conversion layer is an important factor for making effective use of incident light energy. As a method of equalizing the values of photocurrent generated in each photoelectric conversion layer, a method of controlling a film thickness of each photoelectric conversion layer is common, but a method, in which the quantity of light entering each photoelectric conversion layer is controlled by providing an intermediate layer between adjacent two photoelectric conversion layers, is also known. When the above-mentioned intermediate layer is provided, part of light having reached the intermediate layer is reflected and the remainder of the light passes through the intermediate layer, and therefore the intermediate layer has an effect of controlling the quantity of light entering each photoelectric conversion layer, i.e., an effect of increasing the quantity of incident light entering a photoelectric conversion layer (top cell) on the entrance side of the intermediate layer and on the other hand decreasing the quantity of incident light entering a photoelectric conversion layer (bottom cell) on the opposite side of the intermediate layer. Characteristics of the intermediate layer to be desired are that an optical absorption coefficient is small at least in a wavelength region, light of which can be absorbed in the bottom cell and that the intermediate layer has an electrical conductivity of such a degree that a large series resistance is not produced, and materials satisfying these requirements are preferably used.

Further, as is disclosed in Japanese Unexamined Patent Publication No.2003-347572, when a surface configuration having an average pitch of projections of a texture structure within a range of 10 to 50 nm exists on the top face of the intermediate layer, there are not changes in effect of increasing the quantity of incident light entering a top cell and on the other hand decreasing the quantity of incident light entering a bottom cell, but the values of photocurrent generated in both the top cell and the bottom cell can be respectively enhanced by virtue of the optical confinement effect such as optical scattering, refraction or the like by the surface configuration at the top face of the intermediate layer. Thereby, the photoelectric conversion efficiency of a tandem thin film photoelectric conversion device is improved.

DISCLOSURE OF THE INVENTION

Problems to be Solved by the Inventions (First Problem)

However, as described above, in order to improve an optical confinement effect by bringing a transparent conductive layer into high transmittance and a high haze index, it is necessary to solve the following problems.

First, since to bring a transparent conductive layer into high transmittance as described above is, in other words, to reduce the quantity of light absorption in this transparent conductive layer, it is required to reduce a film thickness of the transparent conductive layer to bring a transparent conductive layer into high transmittance. But, when the film thickness of the transparent conductive layer is reduced, a sheet resistance becomes higher and a series resistance loss increases, and therefore the photoelectric conversion efficiency of a photoelectric conversion device is decreased. And, when the film thickness is reduced, the level difference between projections and depressions in a surface texture structure decreases and the haze index is reduced.

Secondly, it become necessary that the film thickness of the transparent conductive layer is thick in order to form a large configuration of a texture structure for bringing the transparent conductive layer into a high haze index. But, when the film thickness is increased, the quantity of light absorbed in the transparent conductive layer is increased and therefore the transmittance is reduced and the photoelectric conversion efficiency is decreased.

Therefore, it is difficult to prepare a transparent conductive layer which satisfies the conditions of a high haze index and high transmittance, and a low sheet resistance simultaneously.

Conventional technologies described in Japanese Unexamined Patent Publication No.2002-314109 and Japanese Unexamined Patent Publication No.2002-141525 are intended for increasing light scattering by a texture structure on the surface of the transparent conductive layer and the transmittance of the transparent conductive layer cannot be enhanced by these technologies.

And, a conventional technology described in Japanese Unexamined Patent Publication No.2000-252500 can suppress the occurrence of mechanical or electrical defects resulting from a texture structure configuration of the transparent conductive layer but it cannot increase the photocurrent of the photoelectric conversion device because by forming a second transparent conductive layer on a first transparent conductive layer, a film thickness of the overall transparent conductive layer increases and this results in the reduction in the transmittance.

The present invention has been made in view of the above-discussed situations and it is an object of the present invention to provide a substrate for a photoelectric conversion device which can secure high transmittance even when the film thickness of the transparent conductive layer is thick, a substrate for a photoelectric conversion device which can attain both high transmittance and a high haze index, and a substrate for a photoelectric conversion device which can achieve high transmittance, a high haze index and a low sheet resistance simultaneously.

(Second Problem)

And, in the structure of a stacked photoelectric conversion device, since it is inevitable that the quantity of incident light entering the bottom cell is reduced due to optical reflection and light absorption in the intermediate layer when the above-mentioned intermediate layer is provided, as described above, there is a problem that the efficiency in use of light is limited.

The present invention has been made in view of the above-discussed situations and it is an object of the present invention to provide a stacked substrate for a photoelectric conversion device which can suppress the optical reflection on a wavelength, which is available in the bottom cell, in the intermediate layer and increase the quantity of incident light entering the bottom cell increases.

Means for Solving the Problems

The present invention includes at least the first aspect and the second aspect, and the first aspect is provided for solving at least the above-mentioned first problems and the second aspect is provided for solving at least the above-mentioned second problems.
(First Aspect)
A substrate for a photoelectric conversion device of the first aspect includes a first transparent conductive layer formed on at least a part of the surface region of a substrate and the first transparent conductive layer has at least an opening portion exposing the substrate.

And, the first transparent conductive layer preferably has a texture structure on its surface.

Further, preferably, the substrate for a photoelectric conversion device of the first aspect further includes a second transparent conductive layer covering the opening portion of the first transparent conductive layer on the first transparent conductive layer.
(Second Aspect)
A stacked photoelectric conversion device of the second aspect includes a plurality of photoelectric conversion layers with these layers stacked, and an intermediate layer is sandwiched between at least a pair of adjacent photoelectric conversion layers and the intermediate layer has at least an opening portion, and a pair of photoelectric conversion layers, between which the intermediate layer is sandwiched, come into contact with each other through the above-mentioned opening portion.

Effect of the Invention

In accordance with the first aspect, the first transparent conductive layer has at least an opening portion and therefore light can pass through the opening portion at high transmittance. Therefore, in accordance with the first aspect, the transmittance of the first transparent conductive layer can be substantially enhanced even when the film thickness of the first transparent conductive layer is thick. And, when a photoelectric conversion device is fabricated using the substrate for a photoelectric conversion device of the first aspect, the photoelectric conversion efficiency of the photoelectric conversion device can be enhanced.

And, the first transparent conductive layer can have a high haze index by having a texture structure on its surface. Therefore, in this case, it is possible to attain both high transmittance and a high haze index. And, when a photoelectric conversion device is fabricated using this substrate for a photoelectric conversion device, the photoelectric conversion efficiency of the photoelectric conversion device can be further enhanced.

And, by further providing the substrate for a photoelectric conversion device of the first aspect with a second transparent conductive layer covering the opening portion of the first transparent conductive layer on the first transparent conductive layer, a sheet resistance of the overall transparent conductive layer can be reduced. And, the second transparent conductive layer can be formed so as to have a thinner film thickness than that of the first transparent conductive layer, and a reduction in the transmittance of the overall transparent conductive layer can be made small. Accordingly, in this case, it is possible to achieve high transmittance, a high haze index and a low sheet resistance simultaneously. And, when a photoelectric conversion device is fabricated using this substrate for a photoelectric conversion device, the photoelectric conversion efficiency of the photoelectric conversion device can be further enhanced.

Either one of a pair of photoelectric conversion layers, between which the intermediate layer is sandwiched, becomes a top cell, and the other becomes a bottom cell.

In accordance with the second aspect, since the intermediate layer has at least an opening portion, light having reached the intermediate layer can pass through the intermediate layer at high transmittance. Consequently, the quantity of incident light entering the bottom cell increases.

In accordance with the second aspect, the quantity of incident light entering the bottom cell can be controlled by controlling a size, a density or the like of the opening portion formed in the intermediate layer. Therefore, it is possible to form the opening portion in such a way that the short circuit current density of the bottom cell becomes equal to that of the top cell and to obtain a high-efficiency stacked photoelectric conversion device can be obtained.

Generally, the top cell is made of a material having a large bandgap, and therefore much of the short-wavelength light is absorbed in the top cell and the long-wavelength light is not absorbed so much. Accordingly, in this case, much of the long-wavelength light reaches the intermediate layer. When the intermediate layer does not have the opening portions, most of this long-wavelength light is reflected and is not used for the photoelectric conversion. But, in accordance with the second aspect, since the intermediate layer has opening portions, this long-wavelength light passes through the intermediate layer efficiently and contributes to photoelectric conversion in the bottom cell. Thus, in accordance with the second aspect, the efficiency in use of the long-wavelength light can be enhanced.

And, thus, in accordance with the second aspect, since, particularly, the efficiency in use of the long-wavelength light can be enhanced and by controlling a size, a density or the like of the opening portion, high current values can be realized in both the top cell and the bottom cell, a stacked photoelectric conversion device having high photoelectric conversion efficiency can be obtained.

Figure 1:
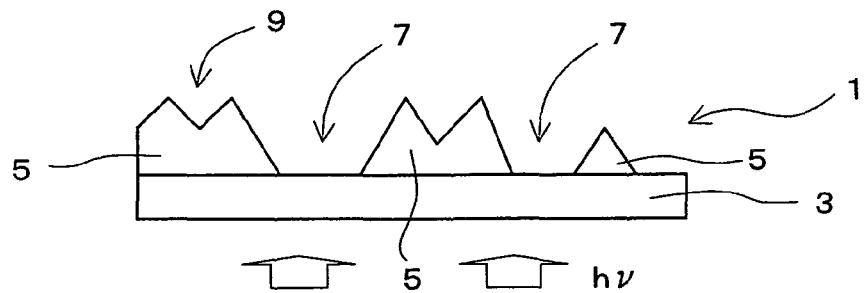
FIG. 1 is a sectional view showing a substrate for a photoelectric conversion device of Example 1 of the first aspect of the present invention.

EXPLANATION OF THE NUMERICAL SYMBOLS 1, 21 substrate for photoelectric conversion device
31, 41 photoelectric conversion device
51, 61, 71, 81, 91, 101, 111, 121 stacked photoelectric conversion device
3 transparent substrate
5 first transparent conductive layer
7 opening portion
9 texture structure
11 second transparent conductive layer
13 photoelectric conversion layer
13a p-type semiconductor layer
13b i-type semiconductor layer
13c n-type semiconductor layer
15 backside electrode layer
15a backside transparent conductive layer
15b conductive layer
23 first photoelectric conversion layer
25 second photoelectric conversion layer
27 first intermediate layer
28 texture structure
29 opening portion
33 second intermediate layer
52 data on conventional example 1
53 data on Examples 13 to 21
54 data on Comparative Example 4
56 data on Example 17
57 data on Examples 22 to 28
201 transparent substrate
203 front transparent conductive layer
205 first photoelectric conversion layer
205a, 209a p-type semiconductor layer
205b, 209b i-type semiconductor layer
205c, 209c n-type semiconductor layer
207, 217, 271, 272, 273 intermediate layer
208, 281, 282, 283, 284 opening portion
209 second photoelectric conversion layer
211 backside electrode layer
211a backside transparent conductive layer
211b conductive layer
214 width of each opening portion (line segment)
215 width of stacked photoelectric conversion device (line segment)

BEST EMBODIMENT FOR CARRYING OUT THE INVENTION

Embodiment of First Aspect

1. First Embodiment

A substrate for a photoelectric conversion device of the first embodiment of the first aspect includes a first transparent conductive layer formed on at least a part of the surface region of a substrate and the first transparent conductive layer has at least an opening portion exposing the substrate.

1-1. Substrate

In a photoelectric conversion device having a substrate structure of a superstrate type, a transparent substrate is employed as the above substrate, but in a photoelectric conversion device having a substrate structure of a substrate type, a non-transparent substrate such as stainless steel or the like may be used as the above substrate. Hereinafter, a substrate for a photoelectric conversion device having a structure of a superstrate type will be described, but these descriptions can also be applied to the case where the photoelectric conversion device has a structure of a substrate type. As a material of the transparent substrate, glass, resin having heat resistance such as polyimide or polyvinyl, or a laminate thereof or the like can be used. Thickness of the transparent substrate is not particularly limited and the substrate may be one having appropriate strength and weight which can support the structure. And, a texture structure may be formed on its surface. Further, its surface may be coated with a metal film, a transparent conductive film, or an insulating film.

1-2. First Transparent Conductive Layer

The first transparent conductive layer may be formed on at least a part of the surface region of a transparent substrate or may be formed on the whole transparent substrate.

The first transparent conductive layer is made of a transparent conductive material, and for example a transparent conductive film of ITO, tin oxide or zinc oxide may be used. Further, materials for the first transparent conductive layers may be doped with a trace of impurities. For example, when zinc oxide is a principal component on this material, if the material contains a Group IIIB element such as gallium, aluminum or boron, or a Group IB element such as copper in an amount about $5\times10^{20}$ to $5\times10^{21}$ cm$^{-3}$, the material is suitable for using as an electrode because relative resistance is reduced. The first transparent conductive layer can be prepared by a publicly known method such as a sputtering method, atmospheric pressure CVD, reduced pressure CVD, MOCVD, electron beam deposition, a sol-gel method, an electrodeposition method, a spraying method or the like. And, the first transparent conductive layer preferably has a film thickness of about 500 to 1300 nm.

1-3. Opening Portion of First Transparent Conductive Layer

The first transparent conductive layer has at least an opening portion. The first transparent conductive layer preferably has a plurality of opening portions in order to effectively improve substantial transmittance of the first transparent conductive layer. At least an opening portion may be formed in at least a part region of the first transparent conductive layer, but the opening portions are preferably distributed evenly throughout the first transparent conductive layer. The opening portion can be identified by observing the transparent conductive layer with an optical microscope. Herein, the above-mentioned opening portion does not include a groove for separating a transparent electrode provided for forming an integrated structure in which a plurality of photoelectric conversion cells are electrically connected in series on an insulating substrate, as described in a paragraph of Prior Art in Japanese Unexamined Patent Publication No. HEI 11 (1999)-186573. More specifically, in the above integrated thin film photoelectric conversion device, by dividing the transparent electrode by laser scribing for the purpose of electrically isolating the above photoelectric conversion cells, an opening portion through, which the insulating substrate is exposed onto the transparent electrode, is formed, but since this is not intended for improving the transmittance of the transparent electrode, this does not apply to the scope of claims of the first aspect.

The opening portion of the first transparent conductive layer can be formed, for example, by forming a resist having opening portions and then performing dry etching, wet etching or the like. As the above-mentioned resist, for example, a photoresist can be employed. And, when the above-mentioned etching is performed without forming a resist, some texture structure is often formed concurrently on the surface of the above first transparent conductive layer. In the above-mentioned dry etching, an etching gas is ionized or converted to radical by a plasma discharge and the resulting gas is irradiated to etch physically or chemically. An inert gas such as argon (Ar) or the like is used as an etching gas for physical etching and a fluorine base gas such as carbon tetrafluoride ($CF_4$), sulfur hexafluoride ($SF_6$) or the like, or a chlorine base gas such as carbon tetrachloride ($CCl_4$), silicon tetrachloride ($SiCl_4$) or the like is used as an etching gas for chemical etching. As the above-mentioned wet etching, for example, a method immersing the first transparent conductive layer in an acid solution or an alkaline solution can be employed. Examples of acid solutions which can be used in this time include hydrochloric acid, sulfuric acid, nitric acid, hydrofluoric acid, acetic acid, formic acid, perchloric acid and the like, and a mixture of two or more species of these acids. Examples of alkaline solutions include sodium hydroxide, ammonium, potassium hydroxide, calcium hydroxide, aluminum hydroxide and the like, and a mixture of two or more species of these alkaline.

In accordance with the first aspect, since light can pass through the opening portion at high transmittance, the transmittance of the first transparent conductive layer can be substantially enhanced even when the film thickness of the first transparent conductive layer is thick.

And, the first transparent conductive layer may have a texture structure on its surface. This texture structure refracts or scatters light entering the photoelectric conversion device at the interface between the first transparent conductive layer and the photoelectric conversion layer formed thereon. Consequently, an optical path length of incident light is extended, and thereby an optical confinement effect is enhanced and the quantity of light, which is substantially available in the above-mentioned photoelectric conversion layer, can be increased.

Since the first transparent conductive layer has opening portions, the transmittance of the first transparent conductive layer can be substantially enhanced even when the film thickness of the first transparent conductive layer is thick, and since the first transparent conductive layer is provided with a texture structure on the surface of its thick transparent conductive layer, its haze index can be enhanced. Therefore, in this case, it is possible to attain both high transmittance and a high haze index.

The texture structure formed on the first transparent conductive layer can be formed by applying dry etching, wet etching or the like to the surface of the first transparent conductive layer as with the above-mentioned formation of the opening portion.

If etching the first transparent conductive layer by such a method, a texture structure is formed on the first transparent conductive layer. When further etching the first transparent conductive layer, the projections and depressions of the texture structure becomes large and ultimately, the depression portion reaches the transparent substrate to form an opening portion in the first transparent conductive layer. The degree of etching can be controlled by an etching time or the like.

Further, a texture structure configuration may be formed at first, and then the opening portion may be formed by the above-mentioned method. Examples of methods of forming the texture structure configuration at the first transparent conductive layer without etching like the above description include a machining method such as sandblast. Further, a method of using a surface texture structure formed by crystal growth of a material for a transparent conductive film during depositing the transparent conductive film by a CVD method or the like, a method of using a regular surface texture structure formed because the plane of crystal growth is oriented, and a method of using a crystal particle size-dependent texture structure formed during forming the transparent conductive film by a sol-gel method or a spraying method can also be employed.

1-4. Aperture Ratio and Average Radius of Opening Portion of First Transparent Conductive Layer It is preferred that an aperture ratio of the first transparent conductive layer is 0.8 to 37% and an average radius of the opening portion of the first transparent conductive layer is 3.13 μm or less. The reason for this is that it is possible to attain both high transmittance and a high haze index under the above-mentioned conditions when a texture structure is formed on the surface of the first transparent conductive layer. And, by forming such an opening portion, it is possible to form, for example, such a substrate for a photoelectric conversion device that a haze index of the first transparent conductive layer is 65 to 78%, and transmittance of light passing through the substrate and the first transparent conductive layer is 78 to 84.3%. "The haze index" and "the transmittance", used here, each are values in measuring using the light of 550 nm in wavelength. In addition, generally, the magnitude of the haze index depends on a measuring wavelength, but it has been experimentally proven that if the haze index at a wavelength of 550 nm is 30% or more, the haze index for the long-wavelength light of not less than 800 nm becomes large. Therefore, the haze index at 550 nm can be used as a measure for an optical confinement effect for a wide range of light from short wavelength to long wavelength. Therefore, only the haze index at 550 nm is measured in Examples described later and this is used as a measure for an optical confinement effect.

The reason why the aperture ratio of the first transparent conductive layer is preferably 0.8 to 37% is that when the aperture ratio is 0.8% or more, the transmittance of the first transparent conductive layer becomes large, and when the aperture ratio is 37% or less, the reduction in the haze index of the first transparent conductive layer is suppressed.

Further, the reason why the average radius of the opening portion of the first transparent conductive layer is preferably 3.13 μm or less is that when the average radius is 3.13 μm or less, the reduction in the haze index of the first transparent conductive layer is suppressed. On the other hand, a lower limit of the average radius of the opening portion is not particularly limited as long as the aperture ratio is 0.8 to 37%, but it is desirable from the viewpoint of improving the transmittance for light of this wavelength that the opening portion has a diameter of one-tenth or more of the wavelength to contribute to the photoelectric conversion. Thinking about a solar cell, in order to obtain a sufficient effect of improving the transmittance for the light of 150 nm, a lower limit of a blackbody radiation spectra of 6000K which is generally used as an approximation of sun light spectra, it is preferred that there exists an opening portion having a diameter of not less than 15 nm (an average radius of not less than 7 nm), which is one-tenth of the above wavelength.

Here, the "aperture ratio of the first transparent conductive layer" can be determined by (1) observing a specified area (for example, area of 0.1 mm×0.1 mm) with an optical microscope of a magnification of about 3000 times, (2) summing areas of all opening portions contained in the area, and (3) dividing the summed areas of the opening portions by an area of the above specified area. And, the "average radius of the opening portion" can be determined by (1) observing a specified area (for example, area of 0.1 mm×0.1 mm) with an optical microscope of a magnification of about 3000 times, (2) deriving a radius $r_n$ from the following equation 1 on respective opening portions n (assume that k of the opening portions exist) contained in the area, and (3) calculating an average value of radius $r_n$ derived. And, number of opening portions per unit area is defined as a "density of the opening portion".

$$r_n = (S_n/\pi)^{1/2} \quad \text{(Equation 1)}$$

In the above equation, n is an integer from 1 to k, $r_n$ is a radius of the respective opening portions n, and $S_n$ is an area of the respective opening portions n.

Further, an "opening portion" refers to a region where the first transparent conductive layer is fully removed and optical transmittance observed with an optical microscope is substantially constant.

1-5. Second Transparent Conductive

And, the substrate for a photoelectric conversion device of the present embodiment may further includes a second transparent conductive layer covering the opening portion of the first transparent conductive layer on the first transparent conductive layer.

In this case, since a sheet resistance of the overall transparent conductive layer can be reduced, a series resistance can be reduced and in addition the photoelectric conversion efficiency in the photoelectric conversion device can be improved.

And, the second transparent conductive layer can be formed so as to have a thinner film thickness than that of the first transparent conductive layer, and a reduction in the substantial transmittance of the overall transparent conductive layer can be made small. And, in this case, the second transparent conductive layer does not change the transmittance at the opening portion of the first transparent conductive layer and the configuration of a texture structure of a portion other than the opening portion by large amounts. Accordingly, in this case, it is possible to achieve a low sheet resistance, a high haze index and high transmittance simultaneously.

Specifically, the second transparent conductive layer preferably has a film thickness of about 10 to 100 nm. When the film thickness is 10 nm or more, a low sheet resistance can be realized, and when the film thickness is 100 nm or less, high transmittance can be realized.

In addition, when the substrate includes the second transparent conductive layer, the opening portion of the first transparent conductive layer is covered by the second transparent conductive layer, but even in this case, the opening portion of the first transparent conductive layer can be identified from the difference of optical transmittance observed with an optical microscope. And, in this case, "an opening portion" defined above is a region where the transparent conductive layer is formed as a thin film, and it is also possible to define the opening portion as a region where optical transmittance is substantially constant when observing the transparent conductive layer with an optical microscope.

And, the second transparent conductive layer preferably has a texture structure on its surface. The reason for this is that in this case, the photoelectric conversion efficiency can be further improved.

The second transparent conductive layer can be formed from the same material group and by the same fabrication method group as those in the first transparent conductive layer.

In addition, the first and the second transparent conductive layers preferably have a synthesized sheet resistance of 5 to 25 Ω/□. A "synthesized sheet resistance" refers to a sheet resistance of the overall transparent conductive layer consisting of the first transparent conductive layer and the second transparent conductive layer.

Here, when the synthesized sheet resistance is 5 Ω/□ or more, since a film thickness of the second transparent conductive layer is adequately thin, the high transmittance can be achieved, and when it is 25 Ω/□ or less, a series resistance becomes small and the form factor can be enhanced. Thereby, the photoelectric conversion efficiency of the photoelectric conversion device fabricated using the substrate of the present embodiment is improved.

In addition, the substrate for a photoelectric conversion device of the present embodiment may further includes a metal film covering the opening portion of the first transparent conductive layer on the first transparent conductive layer.

2. Second Embodiment

In a photoelectric conversion device of the second embodiment of the first aspect, a photoelectric conversion layer and a backside electrode layer are stacked in this order on the substrate for a photoelectric conversion device in the first embodiment. Hereinafter, a photoelectric conversion device having a structure of a superstrate type will be described, but these descriptions can also be applied to the case where the photoelectric conversion device has a structure of a substrate type.

Since the photoelectric conversion layer is formed on the substrate of the first embodiment, the quantity of light entering the photoelectric conversion layer can be enhanced and the short circuit current density of a photoelectric conversion device can be improved.

2-1. Photoelectric Conversion Layer

The photoelectric conversion layer is formed on the substrate for a photoelectric conversion device of the first embodiment. Generally, a p-n junction having a p-type semiconductor layer and an n-type semiconductor layer, or a p-i-n junction having a p-type semiconductor layer, an intrinsic (i-type) semiconductor layer, and an n-type semiconductor layer forms the photoelectric conversion layer, but a Schottky junction which has only either one of the p-type semiconductor layer or the n-type semiconductor layer or another publicly known semiconductor junction may form the photoelectric conversion layer. And, the above-mentioned intrinsic semiconductor layer may be one which exhibits weak p-type or n-type conductivity as long as it does not impair a photoelectric conversion function.

Examples of materials constituting semiconductor layers described above include element semiconductors such as silicon and the like, silicon alloys such as silicon doped with impurities such as carbon, germanium or the like, Group III-Group V compound semiconductors such as gallium arsenide, indium phosphide and the like, Group II-Group VI compound semiconductors such as cadmium telluride, cadmium sulfide and the like, multicomponent compound semiconductors such as copper-indium-gallium-selenium and the like, and porous film of titanium oxide and the like with a pigment or the like absorbed. As a method of producing these semiconductors, a publicly known production method such as molecular beam epitaxy (MBE), CVD, vapor deposition, closed-spaced sublimation, a sputtering method, a sol-gel method, a spraying method, screen printing or the like can be appropriately used in accordance with the semiconductor material. Examples of the above-mentioned CVDs include atmospheric pressure CVD, reduced pressure CVD, plasma CVD, thermal CVD, hot wire CVD, MOCVD and the like.

A method of forming the photoelectric conversion layer will be described taking the case where the photoelectric conversion layer is made up of a p-i-n junction formed using hydrogenated microcrystalline silicon as an example. Incidentally, when a crystalline silicon thin film is prepared at low temperature using a non-equilibrium process such as plasma CVD or the like, a crystal particle size is small (from several tens to 1000 Å) and a silicon thin film often becomes a mixed phase of crystalline silicon and amorphous silicon, and a silicon thin film in such a state is collectively called hydrogenated microcrystalline silicon.

The photoelectric conversion layer is made up of a p-type semiconductor layer, an i-type semiconductor layer and an n-type semiconductor layer, and it is formed by depositing these semiconductor layers in the order of p, i, and n from the entrance side. Here, it is also possible to form the photoelectric conversion layer by depositing these semiconductor layers in the order of n, i, and p. The p-type semiconductor layer is formed by doping a hydrogenated microcrystalline silicon semiconductor with impurity atoms to provide p-type conductivity such as boron, aluminum or the like. The i-type semiconductor layer is made of hydrogenated microcrystalline silicon semiconductor not doped with impurities. However, the i-type semiconductor layer may contain a small amount of impurity element as long as it is substantially an intrinsic semiconductor. The n-type semiconductor layer is formed by doping the above semiconductor layer with impurity atoms to provide n-type conductivity such as phosphorus, nitrogen, oxygen or the like. Here, as the above-mentioned respective semiconductor layers, silicon alloys of which a bandgap is modified by doping silicon with an element such as carbon, germanium, or the like may be appropriately used.

And, a film thickness of the i-type semiconductor layer (optically active layer) is not particularly limited but it is desirably about 1 to 10 μm from the viewpoint of not impairing a photoelectric conversion function and reducing a production cost. Since the p-type semiconductor layer and the n-type semiconductor layer are not optically active layers, their film thicknesses are preferably thin to the extent that a photoelectric conversion function is not impaired. Accordingly, their film thicknesses are not particularly limited but they are preferably 100 nm or thinner.

The backside electrode layer may have at least one conductive layer and preferably has a higher optical reflectance and a higher conductivity. As a material satisfying these requirements, a metal material such as silver, aluminum, titanium, palladium or the like, which has a high optical reflectance, or alloys thereof is used, and using the material, the backside electrode layer is formed on the photoelectric conversion layer by CVD, a sputtering method, vacuum deposition, electron beam deposition, a spraying method, screen printing or the like.

And, the backside electrode layer preferably is made up of a backside transparent conductive layer and a conductive layer, which are stacked on the photoelectric conversion layer in this order. When the backside transparent conductive layer is provided, an effect of improving optical confinement or an effect of improving an optical reflectance on incident light, respectively, can be attained and the diffusion of elements contained in the conductive layer into the photoelectric conversion layer can be inhibited.

The backside electrode layer can be expected to improve the photoelectric conversion efficiency by reflecting the light which has not been fully absorbed in the photoelectric conversion layer to return it to the photoelectric conversion layer again. However, when the first aspect is applied to the structure of a substrate type, the above-mentioned backside electrode layer is preferably in the shape of a grid such as a shape of comb or the like, which does not cover the surface uniformly.

By employing the above-mentioned constitution, a photoelectric conversion device having high photoelectric conversion efficiency using the substrate for a photoelectric conversion device of the first embodiment can be obtained.

3. Third Embodiment

In a stacked photoelectric conversion device of the third embodiment of the first aspect, a plurality of photoelectric conversion layers and a backside electrode layer are stacked in this order on the substrate for a photoelectric conversion device in the first embodiment. Hereinafter, a stacked photoelectric conversion device having a structure of a superstrate type will be described, but these descriptions can also be applied to the case where the stacked photoelectric conversion device has a structure of a substrate type.

Since the stacked photoelectric conversion device of the present embodiment has a plurality of photoelectric conversion layers, it can receive the split light spectrum in each photoelectric conversion layer by splitting a wide light spectrum region and make effective use of light. And, since the open circuit voltage is sum of the electromotive forces in the respective photoelectric conversion layers, the open circuit voltage becomes high.

The stacked photoelectric conversion device of the present embodiment may include a first intermediate layer sandwiched between at least a pair of adjacent two photoelectric conversion layers (referred to as a first photoelectric conversion layer and a second photoelectric conversion layer in order from an entrance side).

Since the first intermediate layer reflects part of light having reached the first intermediate layer and passes the remainder of the light, it can increases the quantity of incident light entering a photoelectric conversion layer on the entrance side of the first intermediate layer (the first photoelectric conversion layer) and increase a photocurrent in the first photoelectric conversion layer.

When semiconductor layers, having different conductive types, of the first and the second photoelectric conversion layers (for example, an n-type semiconductor layer of the first photoelectric conversion layer and a p-type semiconductor layer of the second photoelectric conversion layer) come into contact directly with each other, a phenomenon that it becomes hard to obtain an ohmic contact characteristic may occur, but if the first and the second photoelectric conversion layers come into contact with each other interposing the intermediate layer between these two photoelectric conversion layers, the occurrence of such a phenomenon can be prevented. Further, the first intermediate layer can protect the first photoelectric conversion layer and inhibit the damage to the first photoelectric conversion layer during forming the second photoelectric conversion layer. By these effects, the photoelectric conversion efficiency of the stacked photoelectric conversion device is improved.

Characteristics of the first intermediate layer to be desired are that an optical absorption coefficient is small at least in a wavelength region, light of which can be absorbed in the photoelectric conversion layer on the backside electrode layer side of the first intermediate layer (the second photoelectric conversion layer) and that the first intermediate layer has an electrical conductivity of such a degree that a large series resistance is not produced, and a material satisfying these requirements is preferably used.

The first intermediate layer can be formed using, for example, the same material and fabrication method as in the first or second transparent conductive layer. In addition, a plurality of texture structures are preferably formed on the first intermediate layer.

An average film thickness of the first intermediate layer is preferably 5 to 500 nm, and more preferably 10 to 200 nm. The reason for this is that when the average film thickness of the first intermediate layer is 5 nm or more, the above-mentioned effect of the intermediate layer is shown, and when it is 500 nm or less, high transmittance can be achieved. Thereby, the photoelectric conversion efficiency is improved.

The first intermediate layer preferably has at least an opening portion through which a pair of photoelectric conversion layers, between which the first intermediate layer is sandwiched, come into contact with each other. The opening portion of the first intermediate layer can be identified by observing the transparent conductive layer with an optical microscope or the like. And, "an opening portion" in this case means a region where the first intermediate layer is fully removed and optical transmittance observed with an optical microscope is substantially constant.

The opening portion of the first intermediate layer can be formed using the same method as that used in forming the opening portion of the first transparent conductive layer.

Since the light passing through the opening portion of the first intermediate layer is not affected by an optical loss due to the first intermediate layer, the quantity of light guided to the second photoelectric conversion layer increases. That is, since a substantial transmittance of the first intermediate layer is improved, the quantity of light, which is available in the second photoelectric conversion layer, can be further increased. Consequently, the photocurrent of the photoelectric conversion device can be increased and the photoelectric conversion efficiency can be improved.

And, the stacked photoelectric conversion device of the present embodiment preferably further includes a second intermediate layer covering the opening portion of the first intermediate layer between the first intermediate layer and the photoelectric conversion layer thereon (the second photoelectric conversion layer)

The second intermediate layer can be formed using, for example, the same material and fabrication method as in the first or second transparent conductive layer. By providing the second intermediate layer, a sheet resistance of the overall intermediate layer can be reduced. And, the second intermediate layer can prevent a phenomenon that it becomes hard to obtain an ohmic contact characteristic when semiconductor layers, having different conductive types, of the first and the second photoelectric conversion layers (for example, an n-type semiconductor layer of the first photoelectric conversion layer and a p-type semiconductor layer of the second photoelectric conversion layer) come into contact directly with each other. Further, the second intermediate layer can protect the first photoelectric conversion layer and inhibit the damage to the first photoelectric conversion layer during forming the second photoelectric conversion layer. By these effects, the photoelectric conversion efficiency of the stacked photoelectric conversion device is improved.

The second intermediate layer is desirably formed so as to have a thinner film thickness than that of the first intermediate layer in order not to change the transmittance at the opening portion of the first intermediate layer and the configuration of a texture structure of a portion other than the opening portion by large amounts. Further, more preferably, a texture structure is also present on the surface of the second intermediate layer.

The texture structures formed on the surfaces of the first and the second intermediate layers refracts or scatters light having pass through the first photoelectric conversion layer at the interface between the first and the second photoelectric conversion layers. Consequently, an optical path length of light is extended, and thereby the optical confinement effect is enhanced and the quantity of light, which is substantially available in the first and the second photoelectric conversion layers, can be increased.

The second photoelectric conversion layer is formed on the first or second intermediate layer. The second photoelectric conversion layer can be formed by the same fabrication method as in the photoelectric conversion layer in the second embodiment.

The backside electrode layer is formed on the second photoelectric conversion layer. The backside electrode layer can be formed by the same fabrication method as that described in the second embodiment.

However, when the present invention is applied to the structure of a substrate type, it should be noted that the descriptions of the above first and second photoelectric conversion layers change places.

By employing the above-mentioned constitution, a stacked photoelectric conversion device having high photoelectric conversion efficiency can be obtained.

Embodiment of Second Aspect

A stacked photoelectric conversion device of the second aspect includes a plurality of photoelectric conversion layers with these layers stacked, and an intermediate layer is sandwiched between at least a pair of adjacent photoelectric conversion layers and the intermediate layer has at least an opening portion, and a pair of photoelectric conversion layers, between which the intermediate layer is sandwiched, come into contact with each other through the above-mentioned opening portion. The photoelectric conversion layer may be composed of two layers or three or more layers, and the intermediate layer having at least an opening portion may be formed between at least a pair of adjacent photoelectric conversion layers of these photoelectric conversion layers.

And, noting a pair of photoelectric conversion layers between which the intermediate layer is sandwiched, the above description can translate to that the stacked photoelectric conversion device of the second aspect includes a first photoelectric conversion layer, an intermediate layer and a second photoelectric conversion layer with these layers stacked in this order, and the intermediate layer has at least an opening portion, and a first photoelectric conversion layer and a second photoelectric conversion layer come into contact with each other through the above-mentioned opening portion.

The stacked photoelectric conversion device of the second aspect is specifically in the following form.

1. First Embodiment (a Structure of a Superstrate Type)

A photoelectric conversion device of the first embodiment of the second aspect includes a front transparent conductive layer, a plurality of photoelectric conversion layers and a backside electrode layer with these layers stacked in this order on a transparent substrate, and an intermediate layer is sandwiched between at least a pair of adjacent photoelectric conversion layers and the intermediate layer has at least an opening portion, and a pair of photoelectric conversion layers (referred to as a first photoelectric conversion layer and a second photoelectric conversion layer in order from a transparent substrate side), between which the intermediate layer is sandwiched, come into contact with each other through the above-mentioned opening portion.

And, noting a pair of photoelectric conversion layers between which the intermediate layer is sandwiched, the above description can translate to that the photoelectric conversion device of the present embodiment includes a front transparent conductive layer, a first photoelectric conversion layer, an intermediate layer, a second photoelectric conversion layer and a backside electrode layer with these layers stacked in this order, and the intermediate layer has at least an opening portion, and a first photoelectric conversion layer and a second photoelectric conversion layer come into contact with each other through the above-mentioned opening portion.

In this case, the side of a transparent substrate is a plane of incidence, and a first photoelectric conversion layer is a top cell and a second transparent conductive layer is a bottom cell.

1-1. Transparent Substrate

As a transparent substrate, glass, transparent resins having heat resistance such as polyimide, polyvinyl or the like, a laminate thereof or the like are suitably used, but the transparent substrate is not particularly limited as long as it has high light transparency and can support the whole photoelectric conversion device structurally. And, its surface may be coated with a metal film, a transparent conductive film, an insulating film or the like.

1-2. Front Transparent Conductive Layer

The front transparent conductive layer is made of transparent conductive materials and for example, a transparent conductive film of ITO, tin oxide, zinc oxide or the like may be used. Further, a material for the front transparent conductive layer may be doped with a trace of impurities. For example, when zinc oxide is a principal component on this material, if the material contains a Group IIIB element such as gallium, aluminum or boron, or a Group IB element such as copper in an amount about $5 \times 10^{20}$ to $5 \times 10^{21}$ cm$^{-3}$, the material is suitable for use as an electrode because relative resistance is reduced. The front transparent conductive layer can be prepared by a publicly known method such as a sputtering method, atmospheric pressure CVD, reduced pressure CVD, MOCVD, electron beam deposition, a sol-gel method, an electrodeposition method, a spraying method or the like.

And, a texture structure may be formed on the surface of the front transparent conductive layer. The reason for this is that by this texture structure, optical scattering or refraction occur, the optical confinement effect in the first photoelectric conversion layer and the second photoelectric conversion layer can be attained, and an improvement in the short circuit current density can be expected. This texture structure can be formed by applying dry etching or wet etching to the surface of the transparent substrate and the front transparent conductive layer. In the above-mentioned dry etching, an etching gas is ionized or converted to radical by a plasma discharge and the resulting gas is irradiated to etch physically or chemically to form a texture structure. An inert gas such as argon (Ar) or the like is used as an etching gas for physical etching and a fluorine base gas such as carbon tetrafluoride ($CF_4$), sulfur hexafluoride ($SF_6$) or the like, or a chlorine base gas such as carbon tetrachloride ($CCl_4$), silicon tetrachloride ($SiCl_4$) or the like is used as an etching gas for chemical etching. As the above-mentioned wet etching, for example, a method immersing the transparent substrate or the front transparent conductive layer in an acid solution or an alkaline solution can be employed. Examples of acid solutions which can be used in this time include hydrochloric acid, sulfuric acid, nitric acid, hydrofluoric acid, acetic acid, formic acid, perchloric acid and the like, and a mixture of two or more species of these acids. Examples of alkaline solutions include sodium hydroxide, ammonium, potassium hydroxide, calcium hydroxide or aluminum hydroxide and the like, and a mixture of two or more species of these alkaline. And, the texture structure can be formed by machining such as sandblast. Further, there is given, for example, a method of using a surface texture structure formed by crystal growth of a material for a transparent conductive film during depositing the transparent conductive film by CVD, a method of using a regular surface texture structure formed because the plane of crystal growth is oriented, or a method of using a crystal particle size-dependent texture structure formed during forming the transparent conductive film by a sol-gel method or a spraying method, without performing etching like the above description, can also be employed.

1-3. First Photoelectric Conversion Layer

Generally, a p-n junction having a p-type semiconductor layer and an n-type semiconductor layer, or a p-i-n junction having a p-type semiconductor layer, an intrinsic semiconductor layer, and an n-type semiconductor layer forms the first photoelectric conversion layer, but a Schottky junction which has only either one of the p-type semiconductor layer or the n-type semiconductor layer or another publicly known semiconductor junction may form the photoelectric conversion layer. And, the above-mentioned intrinsic semiconductor layer may be one which exhibits weak p-type or n-type conductivity as long as it does not impair a photoelectric conversion function. Examples of materials constituting semiconductor layers described above include element semiconductors such as silicon and the like, silicon alloys such as silicon doped with impurities such as carbon, germanium or the like, Group III-Group V compound semiconductors such as gallium arsenide, indium phosphide and the like, Group II-Group VI compound semiconductors such as cadmium telluride, cadmium sulfide and the like, multicomponent compound semiconductors such as copper-indium-gallium-selenium and the like, and porous film of titanium oxide or the like with a pigment or the like absorbed. As a method of producing these semiconductors, a publicly known production method such as molecular beam epitaxy (MBE), CVD, vapor deposition, closed-spaced sublimation, a sputtering method, a sol-gel method, a spraying method, screen printing or the like can be appropriately used in accordance with the semiconductor material. Examples of the above-mentioned CVDs include atmospheric pressure CVD, reduced pressure CVD, plasma CVD, thermal CVD, hot wire CVD, MOCVD and the like.

Here, the p-i-n junction using hydrogenated amorphous silicon (bandgap up to 1.7 eV) as a semiconductor material constituting the first photoelectric conversion layer will be described as an example. The first photoelectric conversion layer is made up of a p-type semiconductor layer, an i-type semiconductor layer and an n-type semiconductor layer, and it was formed by depositing these semiconductor layers in the order of p, i, and n from the entrance side. But, it is also possible to form the photoelectric conversion layer by depositing these semiconductor layers in the order of n, i, and p. The p-type semiconductor layer is formed by doping a hydrogenated amorphous silicon semiconductor with impurity atoms to provide p-type conductivity such as boron, aluminum or the like. The i-type semiconductor layer is made of hydrogenated amorphous silicon semiconductor not doped with impurities. However, the i-type semiconductor layer may contain a small amount of impurity element as long as it is substantially an intrinsic semiconductor. The n-type semiconductor layer is formed by doping the above semiconductor layer with impurity atoms to provide n-type conductivity such as phosphorus, nitrogen, oxygen or the like. Here, as the above-mentioned respective semiconductor layers, silicon alloys of which a bandgap is modified by doping silicon with an element such as carbon, germanium, or the like may be appropriately used.

And, a film thickness of the i-type semiconductor layer (optically active layer) is not particularly limited but it is desirably about 100 to 500 nm from the viewpoint of not impairing a photoelectric conversion function, inhibiting optical damage, and reducing a production cost. Since the p-type semiconductor layer and the n-type semiconductor layer are not optically active layers, their film thicknesses are preferably thin to the extent that a photoelectric conversion function is not impaired. Accordingly, their film thicknesses are not particularly limited but they are preferably 100 nm or thinner.

1-4. Intermediate Layer

Figure 17:
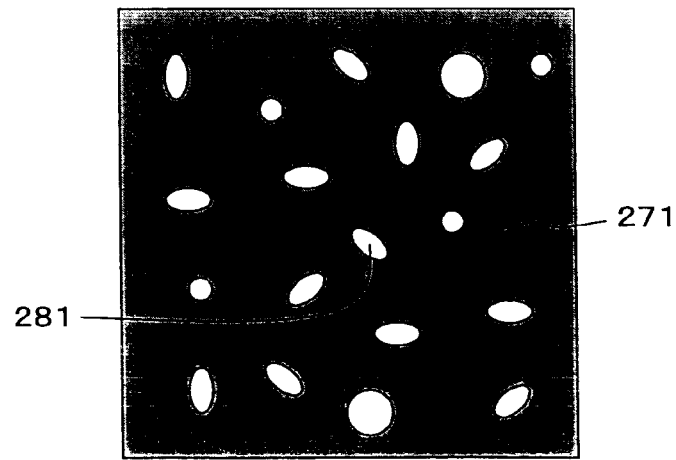
FIG. 17 is a plan view showing a shape of an opening portion of an intermediate layer of the second aspect of the present invention.
Figure 18:
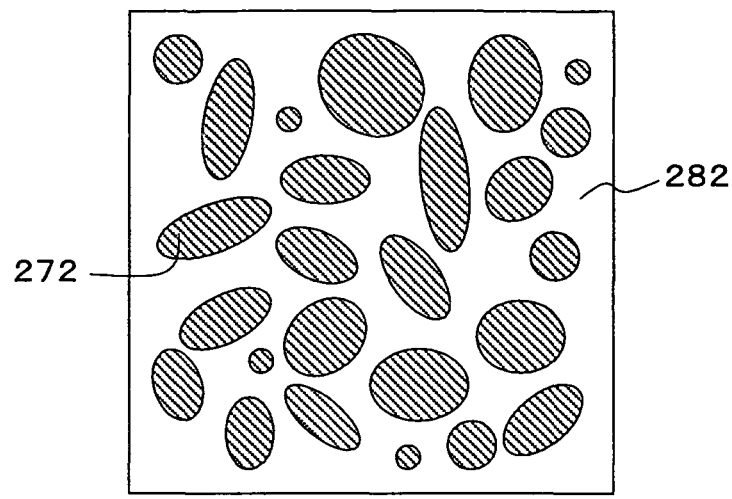
FIG. 18 is a plan view showing a shape of an opening portion of an intermediate layer of the second aspect of the present invention.
Figure 19:
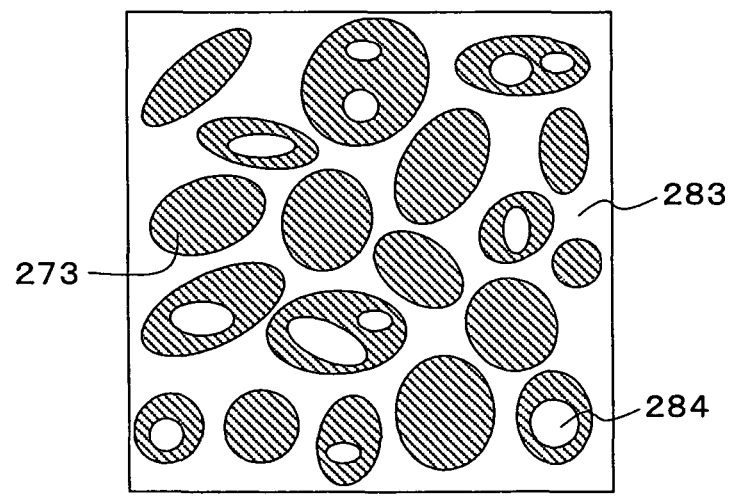
FIG. 19 is a plan view showing a shape of an opening portion of an intermediate layer of the second aspect of the present invention.

The intermediate layer is formed on the first photoelectric conversion layer. In the intermediate layer, at least an opening portion is formed so that the first photoelectric conversion layer is exposed. An opening portion is a region through which the first photoelectric conversion layer and the second photoelectric conversion layer, between which the intermediate layer is sandwiched, come into contact with each other. More specifically, aspects of the opening portion include the case where the opening portions in the form of isle are interspersed in the intermediate layer, as shown in FIG. 17, and the case where the intermediate layer in the form of isle are formed in the opening portion, as shown in FIG. 18. Further, as shown in, for example, FIG. 19, in the intermediate layer in the form of isle, there may exist a region through which the first photoelectric conversion layer and the second photoelectric conversion layer come into contact with each other. Further, number of opening portions, and a shape, a size and an arrangement of the opening portion vary. Since the intermediate layer has at least an opening portion, light having reached the intermediate layer can pass through the intermediate layer at high transmittance. Consequently, the quantity of incident light entering the second photoelectric conversion layer increases. The quantity of incident light entering the second photoelectric conversion layer can be controlled by controlling a size, a density or the like of the opening portion formed in the intermediate layer. Therefore, it is possible to form the opening portion in such a way that the short circuit current density of the first photoelectric conversion layer becomes equal to that of the second photoelectric conversion layer and thus a high-efficiency stacked photoelectric conversion device can be obtained. Further, number of the opening portions may be single or multiple as long as effects of the second aspect are attained.

Generally, the first photoelectric conversion layer is made of a material having a large bandgap, and therefore much of the short-wavelength light is absorbed in the first photoelectric conversion layer and the long-wavelength light is not absorbed so much. Accordingly, in this case, much of the long-wavelength light reaches the intermediate layer. When the intermediate layer does not have the opening portions, most of this long-wavelength light is reflected and is not used for the photoelectric conversion. But, in accordance with the present embodiment, since the intermediate layer has opening portions, this long-wavelength light passes through the intermediate layer efficiently and contributes to photoelectric conversion in the second photoelectric conversion layer. Thus, in accordance with the present embodiment, the efficiency in use of the long-wavelength light can be enhanced. And, thus, in accordance with the present embodiment, since, particularly, the efficiency in use of the long-wavelength light can be enhanced and by controlling a size, a density or the like of the opening portion, high current values can be realized in both the first photoelectric conversion layer and the second photoelectric conversion layer. Thus a stacked photoelectric conversion device having high photoelectric conversion efficiency can be obtained. When an average film thickness of the intermediate layer is 5 nm or more, an effect of reflecting light to the first photoelectric conversion layer is remarkably shown, and since light absorption in the intermediate layer increases with increase in the average film thickness, the average film thickness is preferably 500 nm or less in order to suppress the light absorption. The average film thickness is more preferably 10 nm to 200 nm. Herein, the average film thickness refers to an average film thickness of an intermediate layer portion other than the opening portion. And, the average film thickness can be measured by observing with an electron microscope, an optical microscope, an atomic force microscope or the like.

And, a texture structure may be present on the surface of the intermediate layer. The reason for this is that an improvement in the photoelectric conversion efficiency of the stacked photoelectric conversion device can be expected since the values of photocurrent generated in both the first photoelectric conversion layer and the second photoelectric conversion layer can be respectively enhanced by virtue of the optical confinement effect such as optical scattering, refraction or the like by the texture structure on the surface of the intermediate layer. This texture structure configuration may be a configuration reflecting a texture structure configuration of the front transparent conductive layer when a texture structure is formed in the front transparent conductive layer, or may be a configuration that is originated in the intermediate.

Desired characteristics of materials constituting the intermediate layer are that an optical absorption coefficient is small at least in a wavelength region, light of which can be absorbed in a photoelectric conversion layer on the opposite side to entrance side of the intermediate layer (the second photoelectric conversion layer) and that the intermediate layer has an electrical conductivity of such a degree that a large series resistance is not produced, and materials satisfying these requirements are preferably used. The intermediate layer can be formed using, for example, the same material and fabrication method as in the front transparent conductive layer. As a method of forming the opening portion, the same method as a method of forming the surface texture structure of the front transparent conductive layer can be used. Here, a texture structure configuration may be simultaneously formed on the surface of the intermediate layer when the opening portion is formed. And, the opening portion may be formed, for example, by forming a resist having opening portions on the intermediate layer and then performing dry etching, wet etching or the like. As the above-mentioned resist, for example, a photoresist or the like can be employed.

1-5. Aperture Ratio of Intermediate Layer

"The aperture ratio of the intermediate layer" can be determined by observing a cross section (for example, FIG. 15) of the stacked photoelectric conversion device with an optical microscope such as a laser microscope or an electron microscope such as SEM, TEM or the like, summing all the width (line segment) 214 of the respective opening portions, and dividing this summed width by the width (line segment) 215 of the stacked photoelectric conversion device to obtain a quotient. In this time, it is preferred to employ such an observation condition that the width (line segment) 215 of the stacked photoelectric conversion device is 0.1 mm or more so that the estimation accuracy of the aperture ratio becomes high.

When the aperture ratio of the intermediate layer is 0.5% or more, the transmittance of the long-wavelength light in the intermediate layer is significantly enhanced, and when it is 90% or less, a high effect of reflecting the short-wavelength light to the first photoelectric conversion layer can be attained.

Therefore, in order to attain a higher short circuit current density in any of the first photoelectric conversion layer and the second photoelectric conversion layer, the aperture ratio is preferably 0.5 to 90%, more preferably 16 to 63%.

1-6. Second Photoelectric Conversion Layer

The second photoelectric conversion layer is formed on the intermediate layer (on a second intermediate layer when the second intermediate layer is formed on the intermediate layer). The first photoelectric conversion layer and the second photoelectric conversion layer come into contact with each other through the opening portion of the intermediate layer. The constitution and semiconductor material of the second photoelectric conversion layer, and a method of preparing he second photoelectric conversion layer are similar to those of the first photoelectric conversion layer, and any kind of them may be employed in principle, but it is desirable that a bandgap of an optically active layer is smaller than the first photoelectric conversion layer. When a combination of the first photoelectric conversion layer and the second photoelectric conversion layer is considered, if optically active materials of respective photoelectric conversion layers are expressed by A and B, respectively, the combination of A and B may be such as a-Si and a-Si, μc-Si and μc-Si, a-SiC and a-Si, a-Si and a-SiGe, a-Si and c-Si, a-Si and μc-Si, GaInP and GaAs, $CuGaSe_2$ and $CuInSe_2$ or the like. Such a combination of materials belonging to the same family is desirable because there are advantages, for example, that their coefficients of thermal expansion are close to each other and procedures of preparing them are similar.

Here, the p-i-n junction using hydrogenated microcrystalline silicon (bandgap up to 1.1 eV) as a semiconductor material constituting the second photoelectric conversion layer will be described as an example. When a crystalline silicon thin film is prepared at low temperature using a non-equilibrium process such as a plasma CVD method or the like, a crystal particle size is small (from several tens to 1000 Å) and a silicon thin film often becomes a mixed phase of crystalline silicon and amorphous silicon, and a silicon thin film in such a state is collectively called hydrogenated microcrystalline silicon.

The second photoelectric conversion layer is made up of a p-type semiconductor layer, an i-type semiconductor layer and an n-type semiconductor layer, and it is formed by depositing these semiconductor layers in the order of p, i, and n from the entrance side. Here, it is also possible to form the second photoelectric conversion layer by depositing these semiconductor layers in the order of n, i, and p, but in doing so, the first photoelectric conversion layer should also be formed by depositing in the order of n, i, and p. That is, it is necessary that the direction of a junction in the first photoelectric conversion layer is identical with that of the second photoelectric conversion layer. The p-type semiconductor layer is formed by doping a hydrogenated microcrystalline silicon semiconductor with impurity atoms to provide p-type conductivity such as boron, aluminum or the like. The i-type semiconductor layer is made of hydrogenated microcrystalline silicon semiconductor not doped with impurities. However, the i-type semiconductor layer may contain a small amount of impurity element as long as it is substantially an intrinsic semiconductor. The n-type semiconductor layer is formed by doping the above semiconductor layer with impurity atoms to provide n-type conductivity such as phosphorus, nitrogen, oxygen or the like. Here, as the above-mentioned respective semiconductor layers, silicon alloys of which a bandgap is modified by doping silicon with an element such as carbon, germanium or the like may be appropriately used.

And, a film thickness of the i-type semiconductor layer (optically active layer) is not particularly limited but it is desirably about 1 to 100 μm from the viewpoint of not impairing a photoelectric conversion function and reducing a production cost. Further, it is desirable to employ a film thickness which is sufficient for generating a photocurrent equivalent to a photocurrent generated in the first photoelectric conversion layer. Since the p-type semiconductor layer and the n-type semiconductor layer are not optically active layers, their film thicknesses are preferably thin to the extent that a photoelectric conversion function is not impaired. Accordingly, their film thicknesses are not particularly limited but they are preferably 100 nm or thinner.

1-7. Backside Electrode Layer

The backside electrode layer may have at least one conductive layer and preferably has a high optical reflectance and a high conductivity. The conductive layer can be formed from a metal material such as silver, aluminum, titanium, palladium or the like, which has a high reflectance for visible light, or alloys thereof or the like. The conductive layer can be formed by CVD, a sputtering method, vacuum deposition, electron beam deposition, a spraying method, screen printing or the like. The conductive layer contributes to an improvement in the photoelectric conversion efficiency because it reflects the light which has not been absorbed in the photoelectric conversion layer to return it to the photoelectric conversion layer again.

The backside electrode layer preferably includes a backside transparent conductive layer and a conductive layer with these conductive layers stacked in this order. In this case, an effect of improving optical confinement or an effect of improving an optical reflectance on incident light, respectively, can be attained. And, the diffusion of elements contained in the conductive layer into the photoelectric conversion layer can be inhibited. The backside transparent conductive layer can be formed from the same material and by the same fabrication method as those in the backside transparent conductive layer described in a paragraph 1-2.

2. Second Embodiment (Structure of a Substrate Type)

A photoelectric conversion device of the second embodiment of the second aspect includes a plurality of photoelectric conversion layers, a transparent conductive layer and a grid electrode with these layers stacked in this order on a substrate made of metal or a substrate, the surface of which is coated with metal, and an intermediate layer is sandwiched between at least a pair of adjacent photoelectric conversion layers and the intermediate layer has at least an opening portion, and a pair of photoelectric conversion layers (referred to as a first photoelectric conversion layer and a second photoelectric conversion layer in order from a substrate side), between which the intermediate layer is sandwiched, come into contact with each other through the above-mentioned opening portion.

And, noting a pair of photoelectric conversion layers between which the intermediate layer is sandwiched, the above description can translate to that the photoelectric conversion device of the present embodiment includes a first photoelectric conversion layer, an intermediate layer, a second photoelectric conversion layer, a transparent conductive layer and a grid electrode with these layers stacked in this order on a substrate made of metal or a substrate, the surface of which is coated with metal, and the intermediate layer has at least an opening portion, and a first photoelectric conversion layer and a second photoelectric conversion layer come into contact with each other through the above-mentioned opening portion.

In this case, the side of a grid electrode is a plane of incidence.

2-1. Substrate

As a substrate, a substrate of metal or the like such as stainless steel (SUS), aluminum or the like can be used. And, a substrate formed by coating glass, heat resistant polymer film (polyimide, PET, PEN, PES, Teflon (registered trademark) or the like), ceramic or the like with metal or the like may be used. A laminate thereof may be used as a substrate.

2-2. First and Second Photoelectric Conversion Layers

A constitution, a fabrication method and the like of the first and the second photoelectric conversion layers are the same as those described in First embodiment. However, in the present embodiment, the first photoelectric conversion layer becomes a bottom cell and the second transparent conductive layer becomes a top cell. Therefore, it is preferred to employ the second photoelectric conversion layer having a larger bandgap than that of the first photoelectric conversion layer. In this case, short-wavelength light can be mainly absorbed in the second transparent conductive layer and long-wavelength light can be mainly absorbed in the first transparent conductive layer, and therefore it is possible to make effective use of incident light. Specifically, for example, the second transparent conductive layer is formed from hydrogenated amorphous silicon and the first photoelectric conversion layer is formed from hydrogenated microcrystalline silicon.

2-3. Intermediate Layer

A constitution, a fabrication method and the like of the intermediate layer are the same as those described in First embodiment.

2-4. Transparent Conductive Layer

A constitution, a fabrication method and the like of the transparent conductive layer are the same as those described in the paragraph 1-2.

2-5. Grid Electrode

A grid electrode is preferably formed on the transparent conductive layer. As a constitution, a fabrication method and the like of the grid electrode, publicly known one can be employed.

3. Others

As described above, one of the first and the second photoelectric conversion layers (a pair of photoelectric conversion layers between which the intermediate layer is sandwiched) preferably has a larger bandgap than the other. The reason for this is that by employing a photoelectric conversion layer of the top cell having a larger bandgap than that of a photoelectric conversion layer of the bottom cell, it is possible to make effective use of the incident light. One of the first and the second photoelectric conversion layers (a pair of photoelectric conversion layers between which the intermediate layer is sandwiched) is preferably made of hydrogenated amorphous silicon and the other is preferably made of hydrogenated microcrystalline silicon. In this case, the bandgap of one photoelectric conversion layer becomes larger than the other photoelectric conversion layer.

Further, descriptions of the first aspect hold for the second aspect as long as they are not contrary to their gist, and the reverse holds true. For example, the stacked photoelectric conversion device of the second aspect can be formed using the substrate of the first aspect.

Hereinafter, the examples of the first and the second aspects will be described.

EXAMPLES OF THE FIRST ASPECT

Examples with regards to effect by forming an opening portion in a transparent conductive layer (Examples 1 to 12)

Example 1

Hereinafter, examples of the first aspect will be described.

Further, in these examples, a hydrogenated microcrystalline silicon photoelectric conversion device of a superstrate type and a hydrogenated amorphous silicon/hydrogenated microcrystalline silicon stacked photoelectric conversion device of a superstrate type are taken as an example of a photoelectric conversion device and described.

FIG. 1 is a sectional view showing a substrate 1 for a photoelectric conversion device of Example 1. The substrate 1 for a photoelectric conversion device includes a first transparent conductive layer 5 formed on at least a part of the surface region of a transparent substrate 3 and the first transparent conductive layer 5 has at least an opening portion 7 exposing the transparent substrate. And, the first transparent conductive layer 5 has a texture structure 9 on its surface.

Hereinafter, a method of fabricating a substrate 1 for a photoelectric conversion device will be described referring to FIG. 1.

First, zinc oxide was deposited on the transparent substrate 3 consisting of a smooth-surfaced glass substrate so as to be 800 nm in thickness at a substrate temperature of 200° C. by a magnetron sputtering method to form a first transparent conductive layer 5.

Next, the surface of the first transparent conductive layer 5 was etched. The first transparent conductive layer 5 was immersed in a 0.5% aqueous solution of hydrochloric acid of 25° C. for 150 seconds, and then the surface of the first transparent conductive layer 5 was washed well with pure water and dried. The first transparent conductive layer 5 after etching had a sheet resistance of 22 Ω/□, a film thickness of 300 nm, and transmittance of 85% and a haze index of 71% for light with a wavelength of 550 nm. Further, the surface configuration of the first transparent conductive layer 5 was observed with an optical microscope in order to investigate the surface configuration in detail. As a result of this, it was found that opening portions 7, through which the transparent substrate 3 was exposed to the side of the transparent conductive layer 5, were interspersed in the first transparent conductive layer 5.

Example 2

Figure 2:
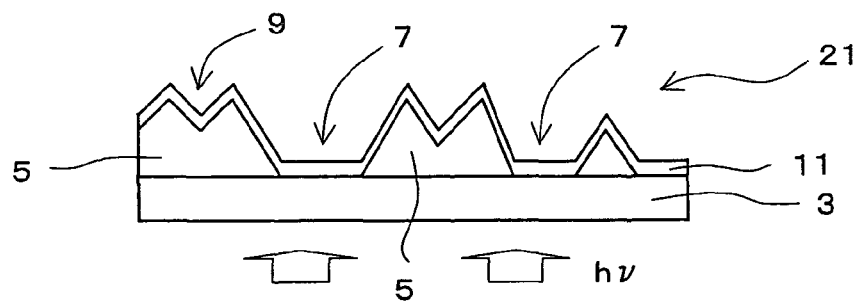
FIG. 2 is a sectional view showing a substrate for a photoelectric conversion device of Example 2 of the first aspect of the present invention.

FIG. 2 is a sectional view showing a substrate 21 for a photoelectric conversion device of Example 2. The substrate for a photoelectric conversion device of Example 2 is different from that of Example 1 in that a second transparent conductive layer 11 covering the opening portion 7 of the first transparent conductive layer 5 is formed on the first transparent conductive layer 5.

After following the same procedure as in Example 1 to the step of forming the first transparent conductive layer 5, zinc oxide was deposited on the first transparent conductive layer 5 so as to be 80 nm in thickness at a substrate temperature of 200° C. by a magnetron sputtering method to form the second transparent conductive layer 11.

The overall transparent conductive layer after forming the second transparent conductive layer 11 had a sheet resistance of 15 Ω/□, and transmittance of 85% and a haze index of 70% for light with a wavelength of 550 nm. It was found that the sheet resistance was reduced and the transmittance and the haze index hardly vary compared with Example 1.

In order to investigate the surface configuration of the transparent conductive layer in detail, the surface configuration was observed with an optical microscope and an atomic force microscope. As a result of this, it was found that the second transparent conductive layer 11 covers the opening portion 7 of the first transparent conductive layer 5.

Example 3

Figure 3:
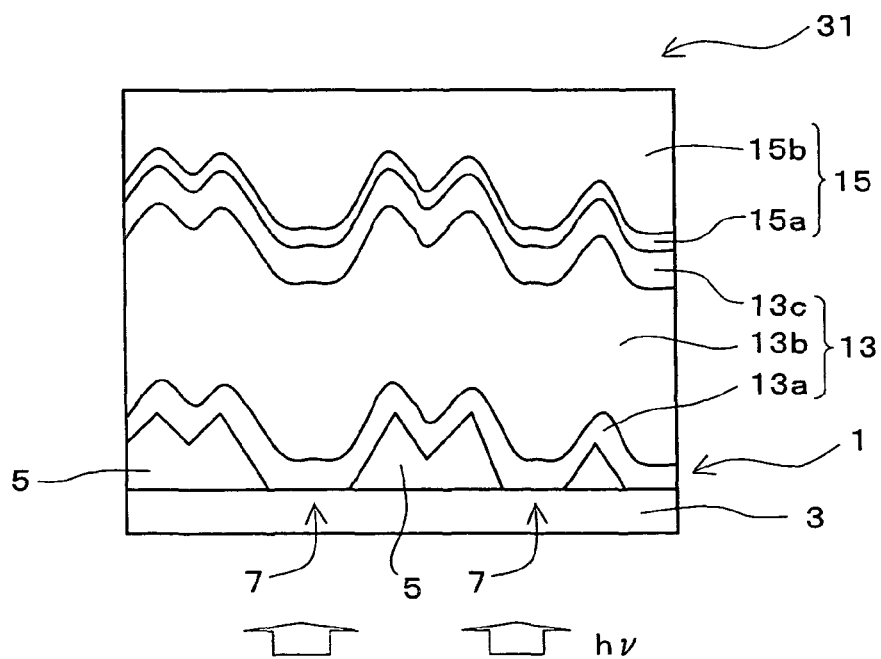
FIG. 3 is a sectional view showing a photoelectric conversion device of Example 3 of the first aspect of the present invention.

FIG. 3 is a sectional view showing a photoelectric conversion device 31 of Example 3. In the photoelectric conversion device 31, a photoelectric conversion layer 13 and a backside electrode layer 15 are stacked in this order on the substrate 1 for a photoelectric conversion device obtained in Example 1. In the photoelectric conversion layer 13, a p-type semiconductor layer 13a, an i-type semiconductor layer 13b and an n-type semiconductor layer 13c are stacked in this order. In the backside electrode layer 15, a backside transparent conductive layer 15a and a conductive layer 15b are stacked in this order.

Hereinafter, a method of fabricating the photoelectric conversion device 31 will be described referring to FIG. 3.

First, a p-type semiconductor layer 13a was formed by depositing a p-type microcrystalline silicon layer with a thickness of 20 nm on the substrate 1 for a photoelectric conversion device obtained in Example 1 in such a way that the silicon layer was doped in an amount 0.02 atomic percentages with boron, which is a p-type conductive impurity atom, by a plasma CVD method, using $SiH_4$, $H_2$, and $B_2H_6$ as process gases. Next, an i-type semiconductor layer 13b was formed by depositing an i-type microcrystalline silicon layer with a thickness of 2.5 μm on the p-type semiconductor layer 13a, using $SiH_4$ and $H_2$ as process gases. Next, an n-type semiconductor layer 13c was formed by depositing an n-type amorphous silicon layer with a thickness of 25 nm in such a way that the silicon layer was doped in an amount 0.2 atomic percentages with phosphorus, which is an n-type conductive impurity atom, using $SiH_4$, $H_2$, and $PH_3$ as process gases. Thereby, a photoelectric conversion layer 13 was formed. A substrate temperature during depositing a layer was set at 200° C. in each layer.

Next, zinc oxide was deposited on the photoelectric conversion layer 13 with a thickness of 50 nm by a magnetron sputtering method to form the backside transparent conductive layer 15a, and further silver was deposited on the backside transparent conductive layer 15a with a thickness of 500 nm to form the conductive layer 15b, and these layers 15a and 15b constitute the backside electrode layer 15. By the above process steps, the photoelectric conversion device 31, in which light enters from a transparent substrate 3 side, was fabricated.

A current-voltage characteristic at a cell area of 1 $cm^2$ of the obtained photoelectric conversion device 31 was measured under the irradiation condition of AM 1.5 (100 mW/$cm^2$), and consequently a short circuit current density was 26.6 mA/$cm^2$, an open circuit voltage was 0.52 V, a form factor was 70.1%, and a photoelectric conversion efficiency was 9.7%.

Example 4

Figure 4:
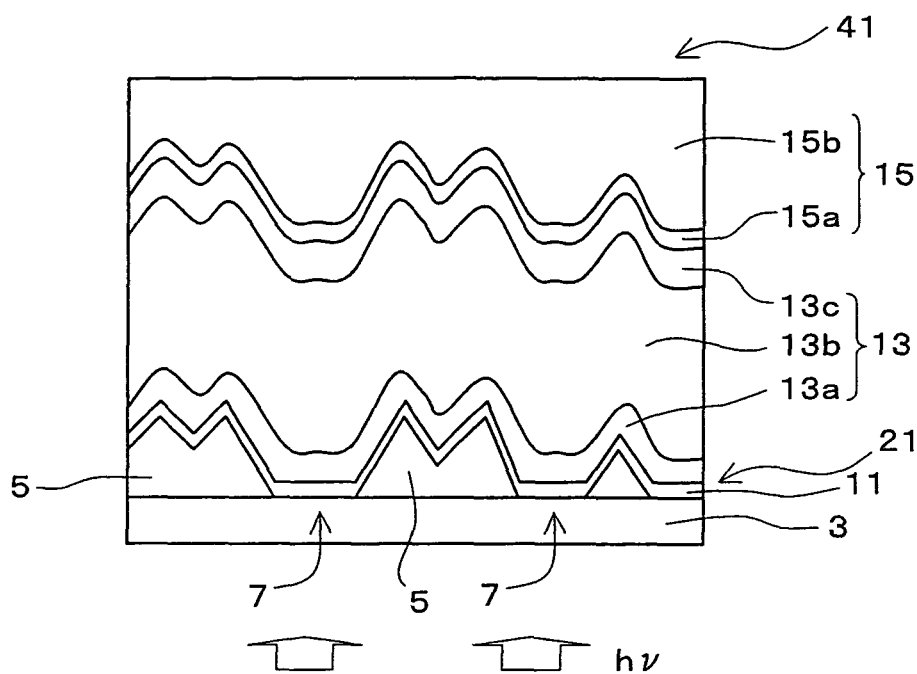
FIG. 4 is a sectional view showing a photoelectric conversion device of Example 4 of the first aspect of the present invention.

FIG. 4 is a sectional view showing a photoelectric conversion device 41 of Example 4. The photoelectric conversion device 41 was fabricated by stacking a photoelectric conversion layer 13 and a backside electrode layer 15 under the same conditions as in Example 3 on the substrate 21 obtained in Example 2.

A current-voltage characteristic at a cell area of 1 $cm^2$ of the obtained photoelectric conversion device 41 was measured under the irradiation condition of AM 1.5 (100 mW/$cm^2$), and consequently a short circuit current density was 26.5 mA/$cm^2$, an open circuit voltage was 0.53 V, a form factor was 73.0%, and a photoelectric conversion efficiency was 10.3%.

Example 5

Figure 5:
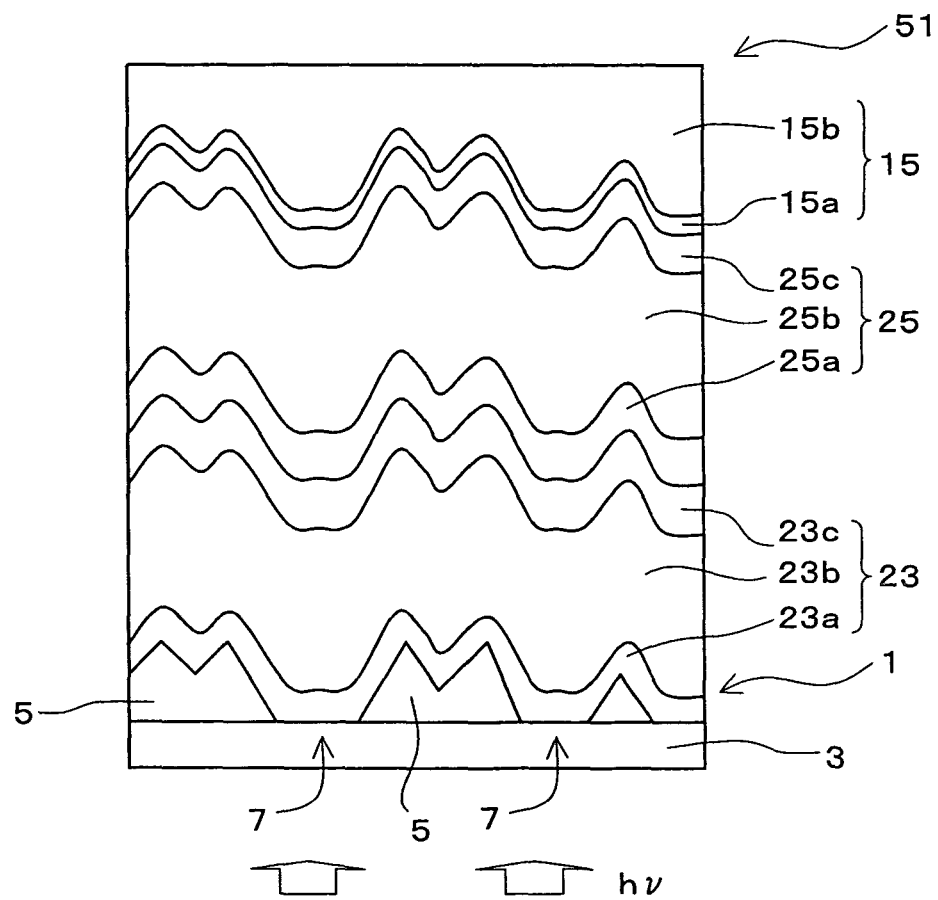
FIG. 5 is a sectional view showing a stacked photoelectric conversion device of Example 5 of the first aspect of the present invention.

FIG. 5 is a sectional view showing a stacked photoelectric conversion device 51 of Example 5. In the stacked photoelectric conversion device 51, a first photoelectric conversion layer 23, a second photoelectric conversion layer 25, and a backside electrode layer 15 are stacked in this order on the substrate 1 for a photoelectric conversion device obtained in Example 1.

Hereinafter, a method of fabricating the stacked photoelectric conversion device 51 will be described referring to FIG. 5.

First, a p-type semiconductor layer 23a was formed by depositing a p-type microcrystalline silicon layer with a thickness of 15 nm on the substrate 1 for a photoelectric conversion device obtained in Example 1 in such a way that the silicon layer was doped in an amount 0.2 atomic percentages with boron, which is a p-type conductive impurity atom, by a plasma CVD method, using $SiH_4$, $H_2$, and $B_2H_6$ as process gases. Next, an i-type semiconductor layer 23b was formed by depositing an i-type microcrystalline silicon layer with a thickness of 300 nm on the p-type semiconductor layer 23a, using $SiH_4$ and $H_2$ as process gases. Next, an n-type semiconductor layer 23c was formed by depositing an n-type amorphous silicon layer with a thickness of 25 nm in such a way that the silicon layer was doped in an amount 0.2 atomic percentages with phosphorus, which is an n-type conductive impurity atom, using $SiH_4$, $H_2$, and $PH_3$ as process gases. Thereby, a first photoelectric conversion layer 23 was formed. A substrate temperature during depositing a layer was set at 200° C. in each layer.

Next, the second photoelectric conversion layer 25 was formed under the same conditions as that under which the photoelectric conversion layer 13 was formed in Example 3. Further, the backside electrode layer 15 was formed under the same conditions as in Example 3.

By the above process steps, the stacked photoelectric conversion device 51, which light enters from a transparent substrate 3 side, was fabricated.

A current-voltage characteristic at a cell area of 1 cm² of the obtained stacked photoelectric conversion device 51 was measured under the irradiation condition of AM 1.5 (100 mW/cm²), and consequently a short circuit current density was 13.1 mA/cm², an open circuit voltage was 1.35 V, a form factor was 71.8%, and a photoelectric conversion efficiency was 12.7%.

Example 6

Figure 6:
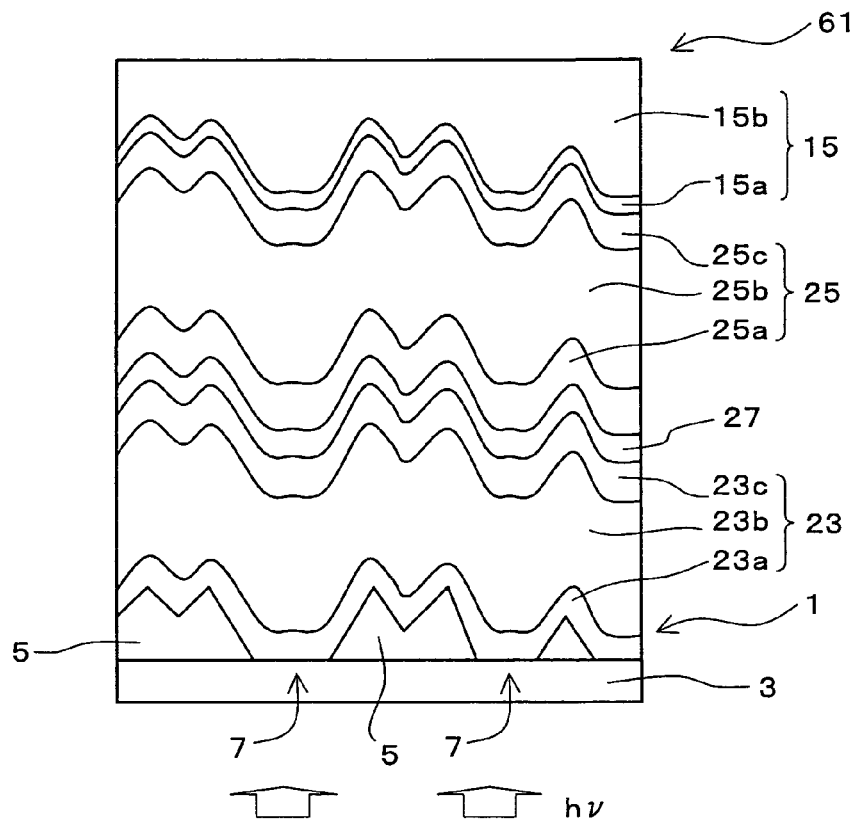
FIG. 6 is a sectional view showing a stacked photoelectric conversion device of Example 6 of the first aspect of the present invention.

FIG. 6 is a sectional view showing a stacked photoelectric conversion device 61 of Example 6. The stacked photoelectric conversion device of Example 6 is different from that of Example 5 in that a first intermediate layer 27 is formed between the first and the second photoelectric conversion layers 23 and 25.

Hereinafter, a method of fabricating the stacked photoelectric conversion device 61 will be described referring to FIG. 6.

First, the same procedure as in Example 5 was performed to the step of forming the first photoelectric conversion layer 23.

Next, zinc oxide was deposited on the first photoelectric conversion layer 23 with a thickness of 100 nm at a substrate temperature of 200° C. by a magnetron sputtering method to form the first intermediate layer 27.

Next, the second photoelectric conversion layer 25 and a backside electrode layer 15 were formed by the same method as in Example 5.

By the above process steps, the stacked photoelectric conversion device 61, which light enters from a transparent substrate 3 side, was fabricated.

A current-voltage characteristic at a cell area of 1 cm² of the obtained stacked photoelectric conversion device 61 was measured under the irradiation condition of AM 1.5 (100 mW/cm²), and consequently a short circuit current density was 13.3 mA/cm², an open circuit voltage was 1.38 V, a form factor was 73.1%, and a photoelectric conversion efficiency was 13.4%.

Example 7

Figure 7:
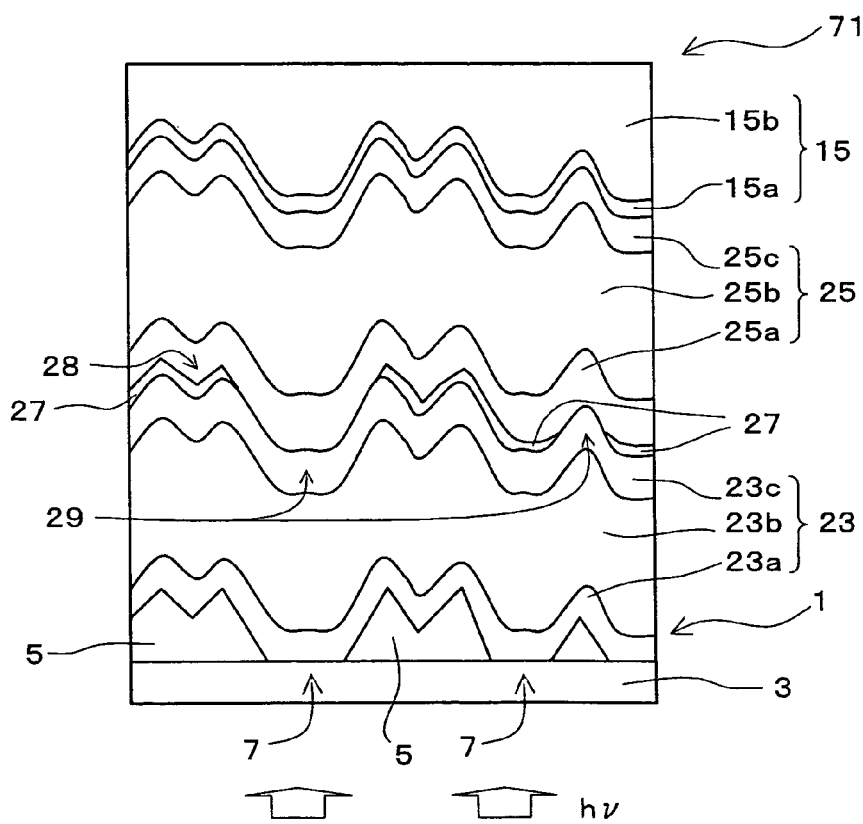
FIG. 7 is a sectional view showing a stacked photoelectric conversion device of Example 7 of the first aspect of the present invention.

FIG. 7 is a sectional view showing a stacked photoelectric conversion device 71 of Example 7. The stacked photoelectric conversion device of Example 7 is different from that of Example 6 in that the first intermediate layer 27 has at least an opening portion 29 through which the first photoelectric conversion layer 23 and the second photoelectric conversion layer 25 come into contact with each other.

Hereinafter, a method of fabricating the stacked photoelectric conversion device 71 will be described referring to FIG. 7.

First, the same procedure as in Example 5 was performed to the step of forming the first photoelectric conversion layer 23.

Next, zinc oxide was deposited on the first photoelectric conversion layer 23 with a thickness of 200 nm at a substrate temperature of 200° C. by a magnetron sputtering method to form the first intermediate layer 27.

Next, the opening portion 29 was formed by etching the surface of the first intermediate layer 27 by the same procedure as in etching the first transparent conductive layer 5 in Example 1 except that an etching time was 20 seconds. In order to investigate the surface configuration of the first intermediate layer 27 thus obtained in detail, the surface configuration was observed with an optical microscope and an atomic force microscope. As a result of this, it was found that opening portions 29, through which the first photoelectric conversion layer 23 was exposed, were interspersed in the first intermediate layer 27. And, a texture structure 28 was formed on the surface of the first intermediate layer 27.

Next, a second photoelectric conversion layer 25 and a backside electrode layer 15 were formed by the same method as in Example 5.

By the above process steps, the stacked photoelectric conversion device 71, which light enters from a transparent substrate 3 side, was fabricated.

A current-voltage characteristic at a cell area of 1 cm² of the obtained stacked photoelectric conversion device 71 was measured under the irradiation condition of AM 1.5 (100 mW/cm²), and consequently a short circuit current density was 13.7 mA/cm², an open circuit voltage was 1.37 V, a form factor was 72.9%, and a photoelectric conversion efficiency was 13.7%.

Example 8

Figure 8:
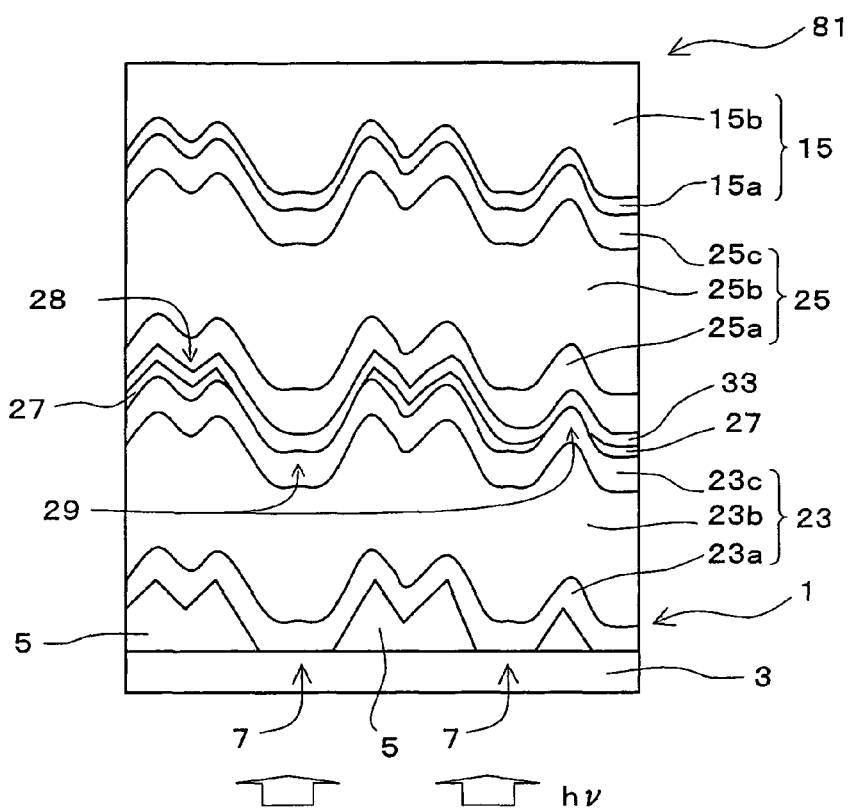
FIG. 8 is a sectional view showing a stacked photoelectric conversion device of Example 8 of the first aspect of the present invention.

FIG. 8 is a sectional view showing a stacked photoelectric conversion device 81 of Example 8. The stacked photoelectric conversion device of Example 8 is different from that of Example 7 in that a second intermediate layer 33 covering the opening portion 29 of the first intermediate layer 27 is formed between the first intermediate layer 27 and the second photoelectric conversion layer 25.

Hereinafter, a method of fabricating the stacked photoelectric conversion device 81 will be described referring to FIG. 8.

First, the same procedure as in Example 7 was performed to the steps of forming the first intermediate layer 27 and forming the opening portion 29 by etching the first intermediate layer 27.

Next, zinc oxide was deposited with a thickness of 15 nm by the same method as the method of fabricating the second transparent conductive layer 11 to form the second intermediate layer 33.

Here, in order to investigate the surface configuration of the second intermediate layer 33 in detail, the surface configuration was observed with an optical microscope and an atomic force microscope. As a result of this, it was found that the second intermediate layer 33 covers the opening portion 29 of the first intermediate layer 27.

Next, a second photoelectric conversion layer 25 and a backside electrode layer 15 were formed by the same method as in Example 5.

By the above process steps, the stacked photoelectric conversion device 81, which light enters from a transparent substrate 3 side, was fabricated.

A current-voltage characteristic at a cell area of 1 cm² of the obtained stacked photoelectric conversion device 81 was measured under the irradiation condition of AM 1.5 (100 mW/cm²), and consequently a short circuit current density was 13.6 mA/cm², an open circuit voltage was 1.39 V, a form factor was 73.6%, and a photoelectric conversion efficiency was 13.9%.

Example 9

Figure 9:
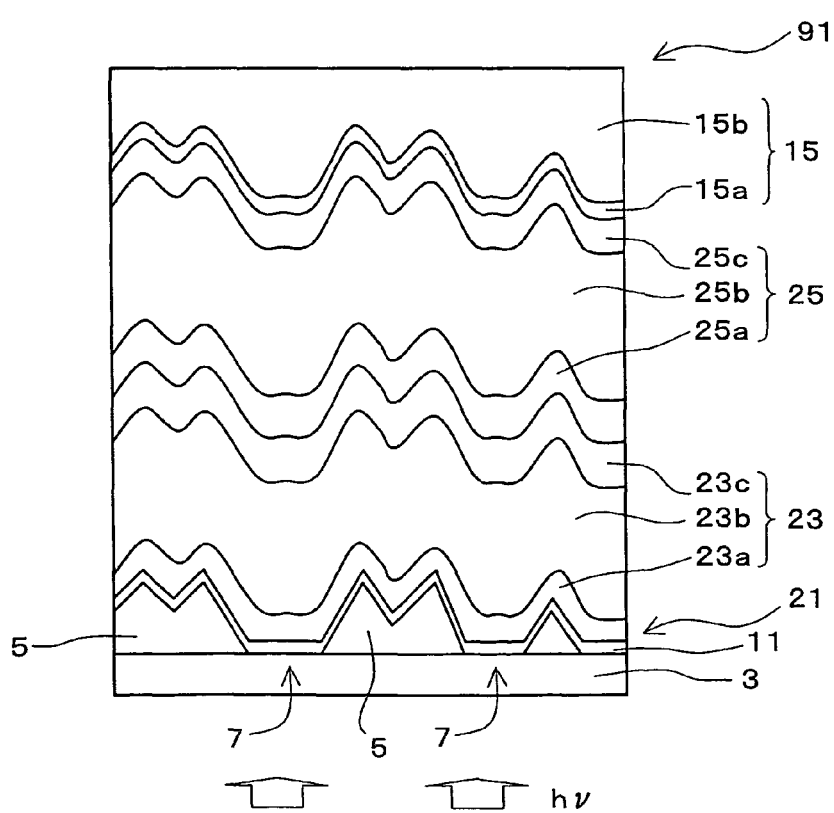
FIG. 9 is a sectional view showing a stacked photoelectric conversion device of Example 9 of the first aspect of the present invention.

FIG. 9 is a sectional view showing a stacked photoelectric conversion device 91 of Example 9. The stacked photoelectric conversion device of Example 9 is different from that of Example 5 in that in this Example, the first photoelectric conversion layer 23, the second photoelectric conversion layer 25, and the backside electrode layer 15 are stacked in this order on the substrate obtained in Example 2.

The first photoelectric conversion layer 23, the second photoelectric conversion layer 25, and the backside electrode layer 15 were formed by the same method as in Example 5. Thereby, the stacked photoelectric conversion device 91, which light enters from a transparent substrate 3 side, was fabricated.

A current-voltage characteristic at a cell area of 1 cm² of the obtained stacked photoelectric conversion device 91 was measured under the irradiation condition of AM 1.5 (100 mW/cm²), and consequently a short circuit current density was 13.0 mA/cm², an open circuit voltage was 1.36 V, a form factor was 72.8%, and a photoelectric conversion efficiency was 12.9%.

Example 10

Figure 10:
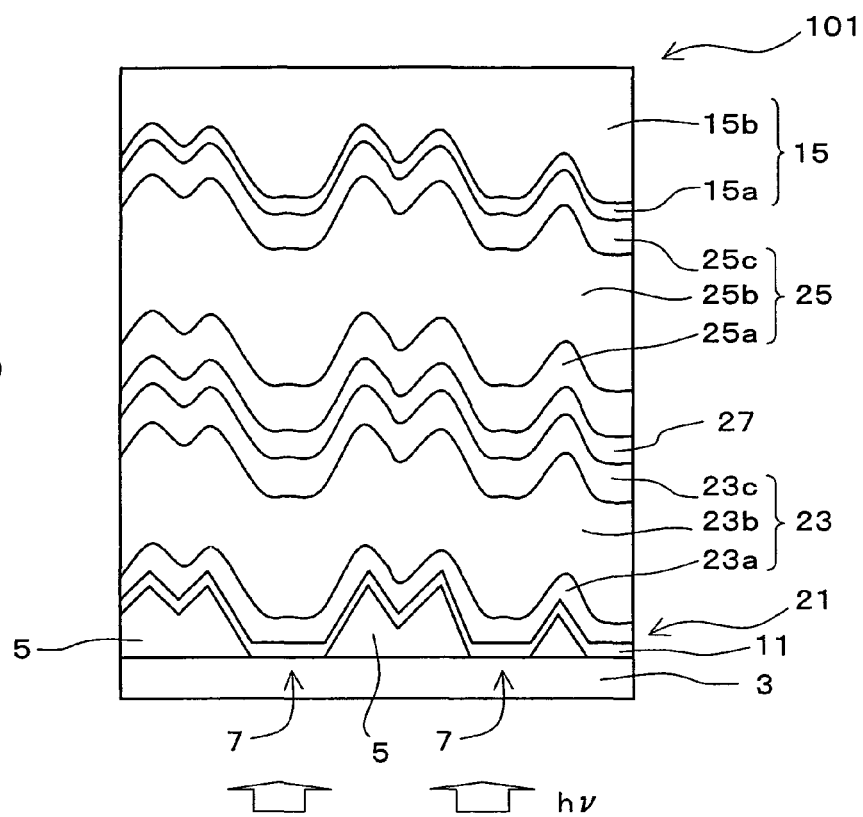
FIG. 10 is a sectional view showing a stacked photoelectric conversion device of Example 10 of the first aspect of the present invention.

FIG. 10 is a sectional view showing a stacked photoelectric conversion device 101 of Example 10. The stacked photoelectric conversion device of Example 10 is different from that of Example 6 in that in this Example, the first photoelectric conversion layer 23, the first intermediate layer 27, the second photoelectric conversion layer 25, and the backside electrode layer 15 are stacked in this order on the substrate obtained in Example 2.

The first photoelectric conversion layer 23, the second photoelectric conversion layer 25, the first intermediate layer 27, and the backside electrode layer 15 were formed by the same method as in Example 6. Thereby, the stacked photoelectric conversion device 101, which light enters from a transparent substrate 3 side, was fabricated.

A current-voltage characteristic at a cell area of 1 cm² of the obtained stacked photoelectric conversion device 101 was measured under the irradiation condition of AM 1.5 (100 mW/cm²), and consequently a short circuit current density was 13.2 mA/cm², an open circuit voltage was 1.39 V, a form factor was 73.5%, and a photoelectric conversion efficiency was 13.5%.

Example 11

Figure 11:
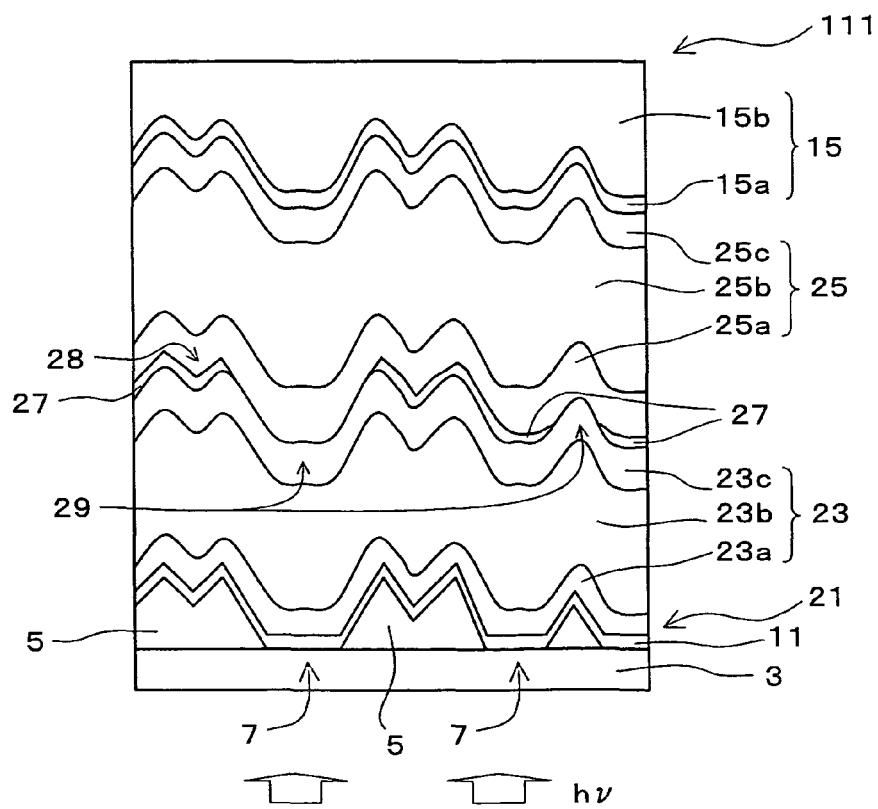
FIG. 11 is a sectional view showing a stacked photoelectric conversion device of Example 11 of the first aspect of the present invention.

FIG. 11 is a sectional view showing a stacked photoelectric conversion device 111 of Example 11. The stacked photoelectric conversion device of Example 11 is different from that of Example 7 in that in this Example, the first photoelectric conversion layer 23, the first intermediate layer 27 having an opening portion 29, the second photoelectric conversion layer 25, and the backside electrode layer 15 are stacked in this order on the substrate obtained in Example 2.

The first photoelectric conversion layer 23, the second photoelectric conversion layer 25, the first intermediate layer 27 having an opening portion 29, and the backside electrode layer 15 were formed by the same method as in Example 7. Thereby, the stacked photoelectric conversion device 111, which light enters from a transparent substrate 3 side, was fabricated.

A current-voltage characteristic at a cell area of 1 cm² of the obtained stacked photoelectric conversion device 111 was measured under the irradiation condition of AM 1.5 (100 mW/cm²), and consequently a short circuit current density was 13.6 mA/cm², an open circuit voltage was 1.38 V, a form factor was 73.4%, and a photoelectric conversion efficiency was 13.8%.

Example 12

Figure 12:
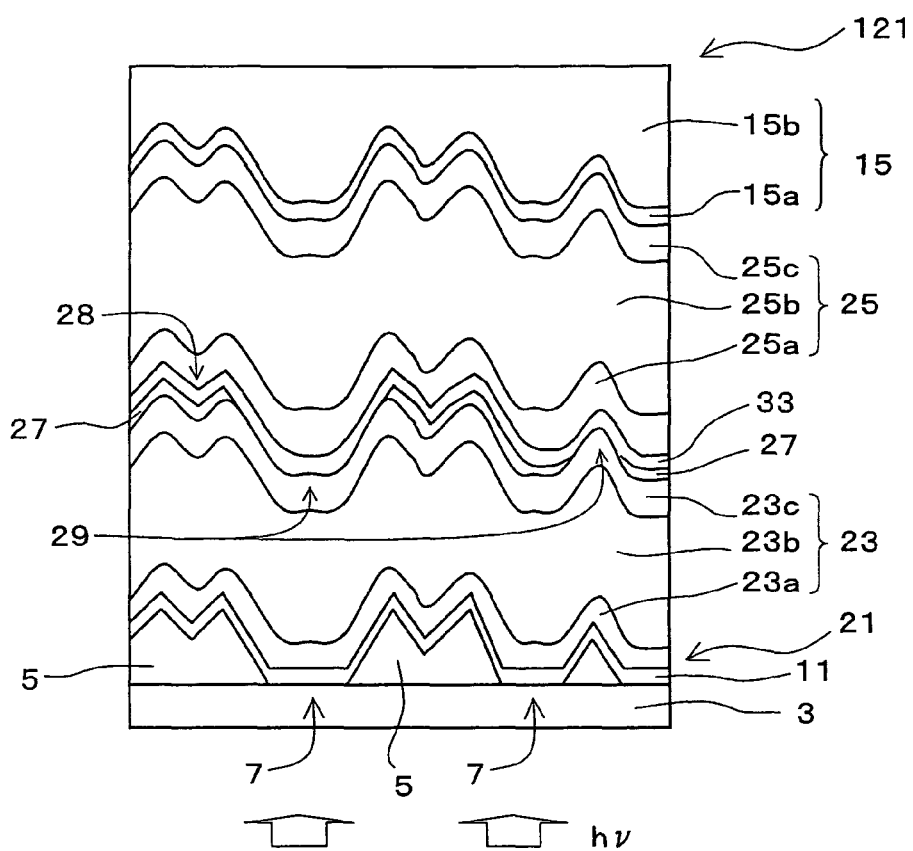
FIG. 12 is a sectional view showing a stacked photoelectric conversion device of Example 12 of the first aspect of the present invention.

FIG. 12 is a sectional view showing a stacked photoelectric conversion device 121 of Example 12. The stacked photoelectric conversion device of Example 12 is different from that of Example 8 in that in this Example, the first photoelectric conversion layer 23, the first intermediate layer 27 having an opening portion 29, the second intermediate layer 33, the second photoelectric conversion layer 25, and the backside electrode layer 15 are stacked in this order on the substrate obtained in Example 2.

The first photoelectric conversion layer 23, the second photoelectric conversion layer 25, the first intermediate layer 27 having an opening portion 29, the second intermediate layer 33, and the backside electrode layer 15 were formed by the same method as in Example 8. Thereby, the stacked photoelectric conversion device 121, which light enters from a transparent substrate 3 side, was fabricated.

A current-voltage characteristic at a cell area of 1 cm² of the obtained stacked photoelectric conversion device 121 was measured under the irradiation condition of AM 1.5 (100 mW/cm²), and consequently a short circuit current density was 13.5 mA/cm², an open circuit voltage was 1.41 V, a form factor was 74.3%, and a photoelectric conversion efficiency was 14.1%.

Comparative Example 1

Comparative Example 1 is different from Example 1 in that in Comparative Example 1, an opening portion 7 is not formed and only a surface texture structure 9 is present in the first transparent conductive layer 5.

A substrate for a photoelectric conversion device of Comparative Example 1 was fabricated by the same method as in Example 1 except for forming the first transparent conductive layer 5 so as to be 500 nm in a film thickness and setting a time of etching by an aqueous solution of hydrochloric acid at 90 seconds.

In this case, the first transparent conductive layer 5 had an average film thickness of 380 nm, a sheet resistance of 15 Ω/□, and transmittance of 80% and a haze index of 45% for light with a wavelength of 550 nm and does not have the opening portion 7.

Comparative Example 2

Comparative Example 2 is different from Example 3 in that in Comparative Example 2, a photoelectric conversion layer 13 and a backside electrode layer 15 are stacked in this order on the substrate obtained in Comparative Example 1.

A method of forming the photoelectric conversion layer 13 and the backside electrode layer 15 is the same as in Example 3.

A current-voltage characteristic at a cell area of 1 cm² of the obtained photoelectric conversion device was measured under the irradiation condition of AM 1.5 (100 mW/cm²), and consequently a short circuit current density was 23.5 mA/cm², an open circuit voltage was 0.52 V, a form factor was 71.0%, and a photoelectric conversion efficiency was 8.1%.

Comparative Example 3

Comparative Example 3 is different from Example 6 in that in Comparative Example 3, a first photoelectric conversion layer 23, a first intermediate layer 27, a second photoelectric conversion layer 25, and a backside electrode layer 15 are stacked in this order on the substrate obtained in Comparative Example 1.

A method of forming the first photoelectric conversion layer 23, the first intermediate layer 27, the second photoelectric conversion layer 25, and the backside electrode layer 15 is the same as in Example 6.

A current-voltage characteristic at a cell area of 1 cm² of the obtained stacked photoelectric conversion device was measured under the irradiation condition of AM 1.5 (100 mW/cm²), and consequently a short circuit current density was 11.8 mA/cm², an open circuit voltage was 1.38 V, a form factor was 73.2%, and a photoelectric conversion efficiency was 11.9%.

(Consideration)

The substrate for a photoelectric conversion device of Example 1 can realize a higher haze index and obtain higher transmittance than those of Comparative Example 1, which is a conventional substrate for a photoelectric conversion device. On the other hand, the sheet resistance increases slightly, but since the sheet resistance is 25 Ω/□ or less, the substrate for a photoelectric conversion device of Example 1 has characteristics which is desired for a substrate for a photoelectric conversion device.

And, it is found that Example 2 realized a high haze index and high transmittance of Example 1 and in addition to this could reduce the a sheet resistance.

Consequently, it has been proven that any of the substrates for a photoelectric conversion device of Examples 1 and 2 has more desirable characteristics as a substrate for a photoelectric conversion device than Comparative Example 1.

In Table 1, the results of measurement of photoelectric conversion characteristics of the photoelectric conversion devices of the above Comparative Examples 2 and 3 and Examples 3 to 12 are shown. In the photoelectric conversion device including a photoelectric conversion layer, it is evident from Table 1 that any structure of Examples 3 and 4 could attain a higher short circuit current density than the structure of Comparative Example 2 which uses a conventional substrate for a photoelectric conversion device, and thereby any structure of Examples 3 and 4 could improve a photoelectric conversion efficiency. Also in the stacked photoelectric conversion device including a plurality of photoelectric conversion layers, it is evident from Table 1 that any structure of Examples 5 to 12 could attain a higher short circuit current density than the structure of Comparative Example 3 which uses a conventional substrate for a photoelectric conversion device and intermediate layer, and thereby any structure of Examples 5 to 12 could improve a photoelectric conversion efficiency.

TABLE 1

| | SHORT CIRCUIT CURRENT (mA/cm²) | OPEN CIRCUIT VOLTAGE (V) | FORM FACTOR (%) | CONVERSION EFFICIENCY (%) |
|---|---|---|---|---|
| EX. 3 | 26.6 | 0.52 | 70.1 | 9.7 |
| EX. 4 | 26.5 | 0.53 | 73.0 | 10.3 |
| EX. 5 | 13.1 | 1.35 | 71.8 | 12.7 |
| EX. 6 | 13.3 | 1.38 | 73.1 | 13.4 |
| EX. 7 | 13.7 | 1.37 | 72.9 | 13.7 |
| EX. 8 | 13.6 | 1.39 | 73.6 | 13.9 |
| EX. 9 | 13.0 | 1.36 | 72.8 | 12.9 |
| EX. 10 | 13.2 | 1.39 | 73.5 | 13.5 |
| EX. 11 | 13.6 | 1.38 | 73.4 | 13.8 |
| EX. 12 | 13.5 | 1.41 | 74.3 | 14.1 |
| COMP. EX. 2 | 23.5 | 0.52 | 71.0 | 8.1 |
| COMP. EX. 3 | 11.8 | 1.38 | 73.2 | 11.9 |

CONP. EX. = CONPARATIVE EXAMPLE
EX. = EXAMPLE

Examples of the First Aspect

Examples with regards to effect by varying an aperture ratio and a size of an opening portion of a transparent conductive layer (Examples 13 to 36)

Example 13

The photoelectric conversion device 31 having a structure shown in FIG. 3 was prepared according to the following procedure.

First, a smooth-surfaced glass substrate was used as a transparent substrate 3, and a layer of zinc oxide as a first transparent conductive layer 5 was formed on this transparent substrate 3 so as to be 600 nm in thickness at a substrate temperature of 200° C. by a magnetron sputtering method. Subsequently, the surface of the first transparent conductive layer 5 was etched. The first transparent conductive layer 5 was immersed in a 0.5% aqueous solution of hydrochloric acid of 25° C. for 110 seconds, and then the surface of the first transparent conductive layer 5 was washed well with pure water and dried. The first transparent conductive layer 5 after etching had a sheet resistance of 25 Ω/□, a film thickness of about 380 nm, and transmittance of 78.0% and a haze index of 67% for light with a wavelength of 550 nm. Further, the surface configuration of the first transparent conductive layer 5 was observed with an optical microscope in order to investigate the surface configuration in detail. As a result of this, it was found that opening portions 7, through which the transparent substrate 3 was exposed, were interspersed in the first transparent conductive layer 5. And, an average radius of an opening portion was 0.51 µm, a density of an opening portion was 9735 mm⁻² and an aperture ratio of the first transparent conductive layer 5 was 0.8%. By the above process steps, a substrate for a photoelectric conversion device was obtained.

Next, a p-type semiconductor layer 13a was formed by depositing a p-type microcrystalline silicon layer with a thickness of 20 nm on the obtained substrate for a photoelectric conversion device in such a way that the silicon layer was doped in an amount 0.02 atomic percentages with boron, which is a p-type conductive impurity atom, by a plasma CVD method, using $SiH_4$, $H_2$, and $B_2H_6$ as process gases. Next, an i-type semiconductor layer 13b was formed by depositing an i-type microcrystalline silicon layer with a thickness of 2.5 µm on the p-type semiconductor layer 13a, using $SiH_4$ and $H_2$ as process gases. Next, an n-type semiconductor layer 13c was formed by depositing an n-type amorphous silicon layer with a thickness of 25 nm in such a way that the silicon layer was doped in an amount 0.2 atomic percentages with phosphorus, which is an n-type conductive impurity atom, using $SiH_4$, $H_2$, and $PH_3$ as process gases. Thereby, a photoelectric conversion layer 13 was formed. A substrate temperature during depositing a layer was set at 200° C. in each layer.

Next, zinc oxide was deposited on the photoelectric conversion layer 13 with a thickness of 50 nm by a magnetron sputtering method to form the backside transparent conductive layer 15a, and further silver was deposited on the backside transparent conductive layer 15a with a thickness of 500 nm to form the conductive layer 15b, and these layers 15a and 15b were used together as the backside electrode layer 15. By the above process steps, the photoelectric conversion device 31, which light enters from a transparent substrate 3 side, was prepared.

A current-voltage characteristic at a cell area of 1 cm² of the obtained photoelectric conversion device was measured under the irradiation condition of AM 1.5 (100 mW/cm²), and consequently a short circuit current density was 23.3 mA/cm², an open circuit voltage was 0.52 V, a form factor was 72%, and a photoelectric conversion efficiency was 8.7%.

Example 14

In the photoelectric conversion device having a structure shown in FIG. 3, a substrate for a photoelectric conversion device was formed by the same method as in Example 13 except that a pre-etching thickness of the first transparent conductive layer 5 was 650 nm and an etching time of the first transparent conductive layer 5 was 120 seconds.

The first transparent conductive layer 5 after etching had a sheet resistance of 24 Ω/□, an average film thickness of 380 nm, and transmittance of 84.0% and a haze index of 65% for light with a wavelength of 550 nm. And, the surface configuration of the first transparent conductive layer 5 was observed with an optical microscope, and consequently an average radius was 0.91 μm, a density of an opening portion was 14735 mm⁻² and an aperture ratio was 3.8%.

A photoelectric conversion layer 13 and a backside electrode layer 15 were formed on the substrate for a photoelectric conversion device by the same method as in Example 13 to prepare a photoelectric conversion device which light enters from a transparent substrate 3 side.

A current-voltage characteristic at a cell area of 1 cm² of the obtained photoelectric conversion device was measured under the irradiation condition of AM 1.5 (100 mW/cm²), and consequently a short circuit current density was 24.2 mA/cm², an open circuit voltage was 0.52 V, a form factor was 71%, and a photoelectric conversion efficiency was 8.9%.

Example 15

In the photoelectric conversion device having a structure shown in FIG. 3, a substrate for a photoelectric conversion device was formed by the same method as in Example 13 except that a pre-etching thickness of the first transparent conductive layer 5 was 700 nm and an etching time of the first transparent conductive layer 5 was 130 seconds.

The first transparent conductive layer 5 after etching had a sheet resistance of 22 Ω/□, a film thickness of 390 nm, and transmittance of 83.8% and a haze index of 71% for light with a wavelength of 550 nm. And, the surface configuration of the first transparent conductive layer 5 was observed with an optical microscope, and consequently an average radius was 1.27 μm, a density of an opening portion was 15009 mm⁻² and an aperture ratio was 7.6%.

A photoelectric conversion layer 13 and a backside electrode layer 15 were formed on the substrate for a photoelectric conversion device by the same method as in Example 13 to prepare a photoelectric conversion device which light enters from a transparent substrate 3 side.

A current-voltage characteristic at a cell area of 1 cm² of the obtained photoelectric conversion device was measured under the irradiation condition of AM 1.5 (100 mW/cm²), and consequently a short circuit current density was 25.5 mA/cm², an open circuit voltage was 0.52 V, a form factor was 71%, and a photoelectric conversion efficiency was 9.4%.

Example 16

In the photoelectric conversion device having a structure shown in FIG. 3, a substrate for a photoelectric conversion device was formed by the same method as in Example 13 except that a pre-etching thickness of the first transparent conductive layer 5 was 750 nm and an etching time of the first transparent conductive layer 5 was 140 seconds.

The first transparent conductive layer 5 after etching had a sheet resistance of 23 Ω/□, a film thickness of 390 nm, and transmittance of 84.3% and a haze index of 76% for light with a wavelength of 550 nm. And, the surface configuration of the first transparent conductive layer 5 was observed with an optical microscope, and consequently an average radius was 1.45 μm, a density of an opening portion was 15388 mm⁻² and an aperture ratio was 10.1%.

A photoelectric conversion layer 13 and a backside electrode layer 15 were formed on the substrate for a photoelectric conversion device by the same method as in Example 13 to prepare a photoelectric conversion device which light enters from a transparent substrate 3 side.

A current-voltage characteristic at a cell area of 1 cm² of the obtained photoelectric conversion device was measured under the irradiation condition of AM 1.5 (100 mW/cm²), and consequently a short circuit current density was 26.3 mA/cm², an open circuit voltage was 0.52 V, a form factor was 71%, and a photoelectric conversion efficiency was 9.7%.

Example 17

In the photoelectric conversion device having a structure shown in FIG. 3, a substrate for a photoelectric conversion device was formed by the same method as in Example 13 except that a pre-etching thickness of the first transparent conductive layer 5 was 800 nm and an etching time of the first transparent conductive layer 5 was 150 seconds.

The first transparent conductive layer 5 after etching had a sheet resistance of 21 Ω/□, a film thickness of 400 nm, and transmittance of 83.0% and a haze index of 78% for light with a wavelength of 550 nm. And, the surface configuration of the first transparent conductive layer 5 was observed with an optical microscope, and consequently an average radius was 1.45 μm, a density of an opening portion was 19435 mm⁻² and an aperture ratio was 12.8%.

A photoelectric conversion layer 13 and a backside electrode layer 15 were formed on the substrate for a photoelectric conversion device by the same method as in Example 13 to prepare a photoelectric conversion device which light enters from a transparent substrate 3 side.

A current-voltage characteristic at a cell area of 1 cm² of the obtained photoelectric conversion device was measured under the irradiation condition of AM 1.5 (100 mW/cm²), and consequently a short circuit current density was 26.6 mA/cm$^2$, an open circuit voltage was 0.52 V, a form factor was 71%, and a photoelectric conversion efficiency was 9.8%.

Example 18

In the photoelectric conversion device having a structure shown in FIG. 3, a substrate for a photoelectric conversion device was formed by the same method as in Example 13 except that a pre-etching thickness of the first transparent conductive layer 5 was 850 nm and an etching time of the first transparent conductive layer 5 was 160 seconds.

The first transparent conductive layer 5 after etching had a sheet resistance of 20 Ω/□, a film thickness of 400 nm, and transmittance of 82.2% and a haze index of 78% for light with a wavelength of 550 nm. And, the surface configuration of the first transparent conductive layer 5 was observed with an optical microscope, and consequently an average radius was 2.18 μm, a density of an opening portion was 16795 mm$^{-2}$ and an aperture ratio was 25.0%.

A photoelectric conversion layer 13 and a backside electrode layer 15 were formed on the substrate for a photoelectric conversion device by the same method as in Example 13 to prepare a photoelectric conversion device which light enters from a transparent substrate 3 side.

A current-voltage characteristic at a cell area of 1 cm$^2$ of the obtained photoelectric conversion device was measured under the irradiation condition of AM 1.5 (100 mW/cm$^2$), and consequently a short circuit current density was 26.3 mA/cm$^2$, an open circuit voltage was 0.52 V, a form factor was 71%, and a photoelectric conversion efficiency was 9.7%.

Example 19

In the photoelectric conversion device having a structure shown in FIG. 3, a substrate for a photoelectric conversion device was formed by the same method as in Example 13 except that a pre-etching thickness of the first transparent conductive layer 5 was 900 nm and an etching time of the first transparent conductive layer 5 was 170 seconds.

The first transparent conductive layer 5 after etching had a sheet resistance of 21 Ω/□, a film thickness of 410 nm, and transmittance of 80.9% and a haze index of 72% for light with a wavelength of 550 nm. And, the surface configuration of the first transparent conductive layer 5 was observed with an optical microscope, and consequently an average radius was 2.73 μm, a density of an opening portion was 12065 mm$^{-2}$ and an aperture ratio was 28.2%.

A photoelectric conversion layer 13 and a backside electrode layer 15 were formed on the substrate for a photoelectric conversion device by the same method as in Example 13 to prepare a photoelectric conversion device which light enters from a transparent substrate 3 side.

A current-voltage characteristic at a cell area of 1 cm$^2$ of the obtained photoelectric conversion device was measured under the irradiation condition of AM 1.5 (100 mW/cm$^2$), and consequently a short circuit current density was 25.0 mA/cm$^2$, an open circuit voltage was 0.52 V, a form factor was 71%, and a photoelectric conversion efficiency was 9.2%.

Example 20

In the photoelectric conversion device having a structure shown in FIG. 3, a substrate for a photoelectric conversion device was formed by the same method as in Example 13 except that a pre-etching thickness of the first transparent conductive layer 5 was 950 nm and an etching time of the first transparent conductive layer 5 was 180 seconds.

The first transparent conductive layer 5 after etching had a sheet resistance of 22 Ω/□, a film thickness of 420 nm, and transmittance of 81.0% and a haze index of 68% for light with a wavelength of 550 nm. And, the surface configuration of the first transparent conductive layer 5 was observed with an optical microscope, and consequently an average radius was 2.92 μm, a density of an opening portion was 11981 mm$^{-2}$ and an aperture ratio was 32.1%.

A photoelectric conversion layer 13 and a backside electrode layer 15 were formed on the substrate for a photoelectric conversion device by the same method as in Example 13 to prepare a photoelectric conversion device which light enters from a transparent substrate 3 side.

A current-voltage characteristic at a cell area of 1 cm$^2$ of the obtained photoelectric conversion device was measured under the irradiation condition of AM 1.5 (100 mW/cm$^2$), and consequently a short circuit current density was 24.6 mA/cm$^2$, an open circuit voltage was 0.52 V, a form factor was 70%, and a photoelectric conversion efficiency was 9.0%.

Example 21

In the photoelectric conversion device having a structure shown in FIG. 3, a substrate for a photoelectric conversion device was formed by the same method as in Example 13 except that a pre-etching thickness of the first transparent conductive layer 5 was 1000 nm and an etching time of the first transparent conductive layer was 190 seconds.

The first transparent conductive layer 5 after etching had a sheet resistance of 22 Ω/□, a film thickness of 420 nm, and transmittance of 81.3% and a haze index of 66% for light with a wavelength of 550 nm. And, the surface configuration of the first transparent conductive layer 5 was observed with an optical microscope, and consequently an average radius was 3.13 μm, a density of an opening portion was 12012 mm$^{-2}$ and an aperture ratio was 36.9%.

A photoelectric conversion layer 13 and a backside electrode layer 15 were formed on the substrate for a photoelectric conversion device by the same method as in Example 13 to prepare a photoelectric conversion device which light enters from a transparent substrate 3 side.

A current-voltage characteristic at a cell area of 1 cm$^2$ of the obtained photoelectric conversion device was measured under the irradiation condition of AM 1.5 (100 mW/cm$^2$), and consequently a short circuit current density was 23.5 mA/cm$^2$, an open circuit voltage was 0.52 V, a form factor was 70%, and a photoelectric conversion efficiency was 8.5%.

Comparative Example 4

In the photoelectric conversion device having a structure shown in FIG. 3, a substrate for a photoelectric conversion device was formed by the same method as in Example 13 except that a pre-etching thickness of the first transparent conductive layer 5 was 1100 nm and an etching time of the first transparent conductive layer 5 was 210 seconds.

The first transparent conductive layer 5 after etching had a sheet resistance of 23 Ω/□, a film thickness of 430 nm, and transmittance of 85.9% and a haze index of 52% for light with a wavelength of 550 nm. And, the surface configuration of the first transparent conductive layer 5 was observed with an optical microscope, and consequently an average radius was 3.50 μm, a density of an opening portion was 9732 mm$^{-2}$ and an aperture ratio was 37.4%.

A photoelectric conversion layer 13 and a backside electrode layer 15 were formed on the substrate for a photoelectric conversion device by the same method as in Example 13 to prepare a photoelectric conversion device which light enters from a transparent substrate 3 side.

A current-voltage characteristic at a cell area of 1 cm$^2$ of the obtained photoelectric conversion device was measured under the irradiation condition of AM 1.5 (100 mW/cm$^2$), and consequently a short circuit current density was 22.0 mA/cm$^2$, an open circuit voltage was 0.51 V, a form factor was 70%, and a photoelectric conversion efficiency was 7.9%.

Conventional Example 1

In FIG. 3, the photoelectric conversion device, which has the same structure as in FIG. 3 except that the first transparent conductive layer 5 of a substrate for a photoelectric conversion device has a monolayer structure, does not have an opening portion 7 and has only a surface texture structure, was prepared according to the following procedure.

A smooth-surfaced glass substrate was used as a transparent substrate 3, and a layer of zinc oxide as a first transparent conductive layer 5 was formed on this transparent substrate 3 so as to be 600 nm in thickness, and the resulting first transparent conductive layer 5 was processed by the same method as in Example 13 except for immersing the first transparent conductive layer 5 in a 0.5% aqueous solution of hydrochloric acid of 25° C. for 90 seconds and then washing well the surface of the substrate with pure water to form a substrate for a photoelectric conversion device. This first transparent conductive layer 5 had an average film thickness of 380 nm, a sheet resistance of 15 Ω/□, and transmittance of 76.0% and a haze index of 66% for light with a wavelength of 550 nm and does not have the opening portion 7.

A photoelectric conversion layer 13 and a backside electrode layer 15 were formed on the substrate for a photoelectric conversion device by the same method as in Example 13 to prepare a photoelectric conversion device which light enters from a transparent substrate 3 side.

A current-voltage characteristic at a cell area of 1 cm$^2$ of the obtained photoelectric conversion device was measured under the irradiation condition of AM 1.5 (100 mW/cm$^2$), and consequently a short circuit current density was 22.5 mA/cm$^2$, an open circuit voltage was 0.52 V, a form factor was 72%, and a photoelectric conversion efficiency was 8.4%.

Consideration of Results of Conventional Example 1, Comparative Example 4 and Examples 13 to 21

In Table 2, the results of measurement of various characteristics of the substrates for a photoelectric conversion device and photoelectric conversion characteristics of the photoelectric conversion devices of the above Examples 13 to 21, Comparative Example 4 and Conventional example 1 are shown.

TABLE 2

| | HAZE INDEX (%) | TRANS-MITTANCE (%) | AVERAGE RADIUS (mM) | DENSITY OF OPENING PORTION (PARTS/mm$^2$) | APERTURE RATIO (%) | SHORT CIRCUIT CURRENT DENSITY (mA/cm$^2$) | OPEN CIRCUIT VOLTAGE (V) | FORM FACTOR (%) | PHOTO-ELECTRIC CONVERSION EFFICIENCY (%) |
|---|---|---|---|---|---|---|---|---|---|
| CONV. EX. 1 | 66 | 76.0 | 0.00 | 0 | 0.0 | 22.5 | 0.52 | 72 | 8.4 |
| EX. 13 | 67 | 78.0 | 0.51 | 9735 | 0.8 | 23.3 | 0.52 | 72 | 8.7 |
| EX. 14 | 65 | 84.0 | 0.91 | 14735 | 3.8 | 24.2 | 0.52 | 71 | 8.9 |
| EX. 15 | 71 | 83.8 | 1.27 | 15009 | 7.6 | 25.5 | 0.52 | 71 | 9.4 |
| EX. 16 | 76 | 84.3 | 1.45 | 15388 | 10.1 | 26.3 | 0.52 | 71 | 9.7 |
| EX. 17 | 78 | 83.0 | 1.45 | 19435 | 12.8 | 26.6 | 0.52 | 71 | 9.8 |
| EX. 18 | 78 | 82.2 | 2.18 | 16795 | 25.0 | 26.3 | 0.52 | 71 | 9.7 |
| EX. 19 | 72 | 80.9 | 2.73 | 12065 | 28.2 | 25.0 | 0.52 | 71 | 9.2 |
| EX. 20 | 68 | 81.0 | 2.92 | 11981 | 32.1 | 24.6 | 0.52 | 70 | 9.0 |
| EX. 21 | 66 | 81.3 | 3.13 | 12012 | 36.9 | 23.5 | 0.52 | 70 | 8.5 |
| CONP. EX. 4 | 52 | 85.9 | 3.50 | 9732 | 37.4 | 22.0 | 0.51 | 70 | 7.9 |

CONV. EX. = CONVENTIONAL EXAMPLE
EX. = EXAMPLE
COMP. EX. = CONPARATIVE EXAMPLE

First, characteristics of the substrate for a photoelectric conversion device will be considered. In preparing the substrate for a photoelectric conversion device, the etching time was shorten when the pre-etching film thickness was thin and lengthened when the pre-etching film thickness was thick so that a sheet resistance became substantially constant at 25 Ω/□ or less. Therefore, there is a tendency that an average film thickness after etching increases with increase in an aperture ratio.

From Table 2, it has been proven that the aperture ratio increases as an average radius of an opening portion increases in the order of Conventional Example 1, Examples 13 to 21, and Comparative Example 4. On the other hand, the density of the opening portion varied in an upward convex curve which has a maximum at the points of Example 17. This tendency of the change in the opening portion's density occurs presumably because when the average radius is small, the density of the opening portion as well as the average radius can increase, but when the average radius exceeds a certain size, opening portions come into contact with each other and join into one gradually and therefore the density of the opening portion becomes smaller.

Next, we will consider how the haze index (550 nm) and the transmittance, which have large effects on the photoelectric conversion characteristics, vary in accordance with the aperture ratio. It has been proven that the haze index (550 nm) and the transmittance tends to vary in an upward convex curve which has a maximum at the points of Examples 15 to 18 as the aperture ratio increases in the order of Conventional Example 1, Examples 13 to 21, and Comparative Example 4. And, it was found that any of the haze indexes (550 nm) and the transmittance of Examples 13 to 21 is higher than that of Conventional Example 1.

Figure 13:
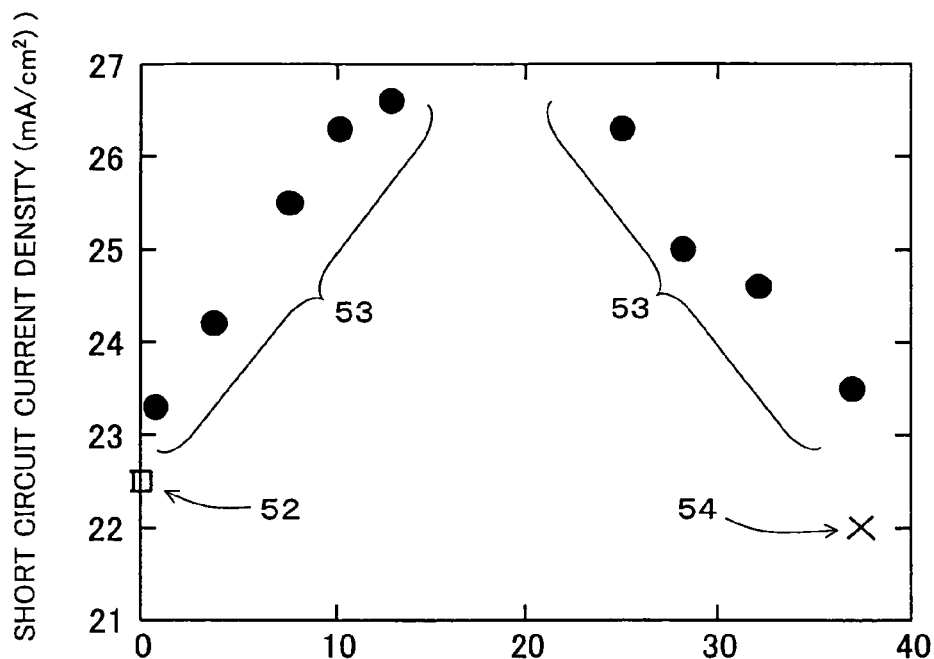
FIG. 13 is a graph showing a relationship between an aperture ratio and a short circuit current density of a first transparent conductive layer of Examples 13 to 21 of the first aspect of the present invention.

Subsequently, effects of the characteristics of the substrate for a photoelectric conversion device on the characteristics of the photoelectric conversion device will be considered. The dependency of the short circuit current density on the aperture ratio is shown in FIG. 13. In FIG. 13, a symbol 52 (□) represents the data of Conventional Example 1, a symbol 53 (●) represents the data of Examples 13 to 21, and a symbol 54 (×) represents the data of Comparative Example 4.

It is shown from FIG. 13 that the short circuit current density increases with increase in an aperture ratio in the case of a low aperture ratio. When the aperture ratio reaches about 10 to 25%, an increase in the short circuit current density stops and a relative maximum is formed. Further, when the aperture ratio exceeds 25%, the short circuit current density begins to decrease. And, it is evident that Examples in the range of the aperture ratio of 0.8 to 37% have a higher short circuit current density than that of Conventional Example 1 in which the opening portion is not present (aperture ratio 0%). And, when comparing Example 21 with Comparative Example 4, their aperture ratios are around 37%, respectively, and are not so different from each other, but the short circuit current density of Comparative Example 4 is significantly lower than Example 21. From Table 2, it is thought that this results from that the haze index drops rapidly because the average radius becomes as too large as 3.5 μm. And, from Table 2, the open circuit voltage and the form factor are not reduced by large amounts in a range of the aperture ratio of 0.8 to 37%. From the above description, it has become evident that the photoelectric conversion efficiency exhibits about the same tendency as that of the short circuit current density.

Therefore, it is understood that the aperture ratio is preferably in the range of 0.8 to 37% and further the average radius is preferably 3.13 μm or less in order to improve the photoelectric conversion efficiency of the photoelectric conversion device.

It is thought that the short circuit current density could be significantly improved with little reduction in the open circuit voltage and the form factor from these effects, and thereby the photoelectric conversion efficiency could be improved.

Example 22

The photoelectric conversion device 41 having a structure shown in FIG. 4 was prepared according to the following procedure.

After following the same procedure as in Example 17 to the step of forming a first transparent conductive layer 5, zinc oxide was deposited on the first transparent conductive layer 5 so as to be 5 nm in thickness as a second transparent conductive layer 11 at a substrate temperature of 200° C. by a magnetron sputtering method to form a substrate for a photoelectric conversion device. The transparent conductive layer after forming the second transparent conductive layer 11 had a sheet resistance of 21 Ω/□, and transmittance of 83.0% and a haze index of 78% for light with a wavelength of 550 nm. It became evident that any of the transmittance, the haze index and the sheet resistance did not vary compared with Example 17. In order to investigate the surface configuration of the second transparent conductive layer 11 in detail, the surface configuration was observed with an optical microscope and an atomic force microscope. As a result of this, it was found that the second transparent conductive layer 11 covers the opening portion 7.

A photoelectric conversion layer 13 and a backside electrode layer 15 were formed in this order on the above-mentioned substrate for a photoelectric conversion device by the same method as in Example 13 to prepare a photoelectric conversion device which light enters from a transparent substrate 3 side.

A current-voltage characteristic at a cell area of 1 cm$^2$ of the obtained photoelectric conversion device was measured under the irradiation condition of AM 1.5 (100 mW/cm$^2$), and consequently a short circuit current density was 26.6 mA/cm$^2$, an open circuit voltage was 0.52 V, a form factor was 71%, and a photoelectric conversion efficiency was 9.8%.

Example 23

In the photoelectric conversion device having a structure shown in FIG. 4, a substrate for a photoelectric conversion device was formed by the same method as in Example 22 except that a film thickness of the second transparent conductive layer 11 was 10 nm.

The transparent conductive layer after forming the second transparent conductive layer 11 had a sheet resistance of 18 Ω/□, and transmittance of 82.5% and a haze index of 78% for light with a wavelength of 550 nm. It became evident that the sheet resistance could be reduced with very little change of the transmittance and the haze index compared with Example 17. In order to investigate the surface configuration of the second transparent conductive layer 11 in detail, the surface configuration was observed with an optical microscope and an atomic force microscope. As a result of this, it was found that the second transparent conductive layer 11 covers the opening portion 7.

A photoelectric conversion layer 13 and a backside electrode layer 15 were formed in this order on the above-mentioned second transparent conductive layer 11 by the same method as in Example 13 to prepare a photoelectric conversion device which light enters from a transparent substrate 3 side.

A current-voltage characteristic at a cell area of 1 cm$^2$ of the obtained photoelectric conversion device was measured under the irradiation condition of AM 1.5 (100 mW/cm$^2$), and consequently a short circuit current density was 26.6 mA/cm², an open circuit voltage was 0.52 V, a form factor was 72%, and a photoelectric conversion efficiency was 9.9%.

Example 24

In the photoelectric conversion device having a structure shown in FIG. 4, a substrate for a photoelectric conversion device was formed by the same method as in Example 22 except that a film thickness of the second transparent conductive layer 11 was 20 nm.

The transparent conductive layer after forming the second transparent conductive layer 11 had a sheet resistance of 17 Ω/□, and transmittance of 82.0% and a haze index of 78% for light with a wavelength of 550 nm.

A photoelectric conversion layer 13 and a backside electrode layer 15 were formed in this order on the above-mentioned substrate for a photoelectric conversion device by the same method as in Example 13 to prepare a photoelectric conversion device which light enters from a transparent substrate 3 side.

A current-voltage characteristic at a cell area of 1 cm² of the obtained photoelectric conversion device was measured under the irradiation condition of AM 1.5 (100 mW/cm²), and consequently a short circuit current density was 26.5 mA/cm², an open circuit voltage was 0.53 V, a form factor was 73%, and a photoelectric conversion efficiency was 10.1%.

Example 25

In the photoelectric conversion device having a structure shown in FIG. 4, a substrate for a photoelectric conversion device was formed by the same method as in Example 22 except that a film thickness of the second transparent conductive layer 11 was 50 nm.

The transparent conductive layer after forming the second transparent conductive layer 11 had a sheet resistance of 15 Ω/□, and transmittance of 81.5% and a haze index of 78% for light with a wavelength of 550 nm.

A photoelectric conversion layer 13 and a backside electrode layer 15 were formed in this order on the above-mentioned substrate for a photoelectric conversion device by the same method as in Example 13 to prepare a photoelectric conversion device which light enters from a transparent substrate 3 side.

A current-voltage characteristic at a cell area of 1 cm² of the obtained photoelectric conversion device was measured under the irradiation condition of AM 1.5 (100 mW/cm²), and consequently a short circuit current density was 26.5 mA/cm², an open circuit voltage was 0.53 V, a form factor was 73%, and a photoelectric conversion efficiency was 10.2%.

Example 26

In the photoelectric conversion device having a structure shown in FIG. 4, a substrate for a photoelectric conversion device was formed by the same method as in Example 22 except that a film thickness of the second transparent conductive layer 11 was 80 nm.

The transparent conductive layer after forming the second transparent conductive layer 11 had a sheet resistance of 13 Ω/□, and transmittance of 80.5% and a haze index of 77% for light with a wavelength of 550 nm.

A photoelectric conversion layer 13 and a backside electrode layer 15 were formed in this order on the above-mentioned substrate for a photoelectric conversion device by the same method as in Example 13 to prepare a photoelectric conversion device which light enters from a transparent substrate 3 side.

A current-voltage characteristic at a cell area of 1 cm² of the obtained photoelectric conversion device was measured under the irradiation condition of AM 1.5 (100 mW/cm²), and consequently a short circuit current density was 26.0 mA/cm², an open circuit voltage was 0.53 V, a form factor was 73%, and a photoelectric conversion efficiency was 10.1%.

Example 27

In the photoelectric conversion device having a structure shown in FIG. 4, a substrate for a photoelectric conversion device was formed by the same method as in Example 22 except that a film thickness of the second transparent conductive layer 11 was 100 nm.

The transparent conductive layer after forming the second transparent conductive layer 11 had a sheet resistance of 10 Ω/□, and transmittance of 79.0% and a haze index of 77% for light with a wavelength of 550 nm.

A photoelectric conversion layer 13 and a backside electrode layer 15 were formed in this order on the above-mentioned substrate for a photoelectric conversion device by the same method as in Example 13 to prepare a photoelectric conversion device which light enters from a transparent substrate 3 side.

A current-voltage characteristic at a cell area of 1 cm² of the obtained photoelectric conversion device was measured under the irradiation condition of AM 1.5 (100 mW/cm²), and consequently a short circuit current density was 25.4 mA/cm², an open circuit voltage was 0.53 V, a form factor was 74%, and a photoelectric conversion efficiency was 9.9%.

Example 28

In the photoelectric conversion device having a structure shown in FIG. 4, a substrate for a photoelectric conversion device was formed by the same method as in Example 22 except that a film thickness of the second transparent conductive layer 11 was 120 nm.

The transparent conductive layer after forming the second transparent conductive layer 11 had a sheet resistance of 5 Ω/□, and transmittance of 77.5% and a haze index of 76% for light with a wavelength of 550 nm.

A photoelectric conversion layer 13 and a backside electrode layer 15 were formed in this order on the above-mentioned substrate for a photoelectric conversion device by the same method as in Example 13 to prepare a photoelectric conversion device which light enters from a transparent substrate 3 side.

A current-voltage characteristic at a cell area of 1 cm² of the obtained photoelectric conversion device was measured under the irradiation condition of AM 1.5 (100 mW/cm²), and consequently a short circuit current density was 24.5 mA/cm², an open circuit voltage was 0.53 V, a form factor was 74%, and a photoelectric conversion efficiency was 9.6%.

Consideration of Results of Example 17 and Examples 22 to 28

In Table 3, the results of measurement of various characteristics of the substrates for a photoelectric conversion device and photoelectric conversion characteristics of the photoelectric conversion devices of the above Example 17 and Examples 22 to 28 are shown.

TABLE 3

| | FILM THICKNESS OF 2ND TRANSPARENT CONDUCTIVE LAYER (nm) | HAZE INDEX (%) | TRANS- MITTANCE (%) | SHEET RESIS- TANCE (Ω/□) | SHORT CIRCUIT CURRENT DENSITY (mA/cm$^2$) | OPEN CIRCUIT VOLTAGE (V) | FORM FACTOR (%) | PHOTO- ELECTRIC CONVERSION EFFICIENCY (%) |
|---|---|---|---|---|---|---|---|---|
| EX. 17 | 0 | 78 | 83.0 | 21 | 26.6 | 0.52 | 71 | 9.8 |
| EX. 22 | 5 | 78 | 83.0 | 21 | 26.6 | 0.52 | 71 | 9.8 |
| EX. 23 | 10 | 78 | 82.5 | 18 | 26.6 | 0.52 | 72 | 9.9 |
| EX. 24 | 20 | 78 | 82.0 | 17 | 26.5 | 0.53 | 73 | 10.1 |
| EX. 25 | 50 | 78 | 81.5 | 15 | 26.5 | 0.53 | 73 | 10.2 |
| EX. 26 | 80 | 77 | 80.5 | 13 | 26.0 | 0.53 | 73 | 10.1 |
| EX. 27 | 100 | 77 | 79.0 | 10 | 25.4 | 0.53 | 74 | 9.9 |
| EX. 28 | 120 | 76 | 77.5 | 5 | 24.5 | 0.53 | 74 | 9.6 |

EX. = EXAMPLE

Figure 14:
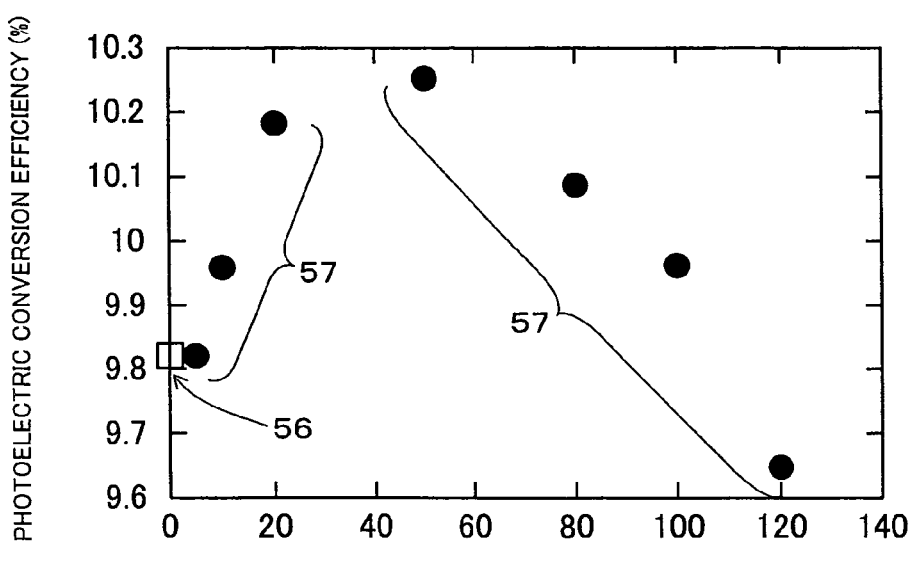
FIG. 14 is a graph showing a relationship between a film thickness and a photoelectric conversion efficiency of a second transparent conductive layer of Examples 22 to 28 of the first aspect of the present invention.

First, the characteristics of the substrate for a photoelectric conversion device will be considered. It is evident from Table 3 that the sheet resistance decreases, the transmittance is slightly reduced, and the haze index varies little as a film thickness increases in the order of Example 17, and Examples 22 to 28. The relationship between the photoelectric conversion efficiency and the film thickness of the second transparent conductive layer is shown in FIG. 14. In FIG. 14, a symbol 56 (□) represents the data of Example 17, and a symbol 57 (●) represents the data of Examples 22 to 28.

It is evident that any structure of Examples 22 to 28 can attain higher photoelectric conversion efficiency than the structure of Example 17 shown in Table 2. More specifically reviewing, when the film thickness of the second transparent conductive layer is 5 nm or less, photoelectric conversion characteristics are not different from those of Example 17 in which the second transparent conductive layer is not provided, and when the film thickness of the second transparent conductive layer is more than 120 nm, the photoelectric conversion efficiency is lower than that of Example 17, and therefore it became evident that the film thickness in a range of 10 to 100 nm where the photoelectric conversion efficiency was significantly enhanced is more preferred. The reason for this is assumed that an adequate effect is not attained because the film thickness is thin when the film thickness of the second transparent conductive layer is 5 nm or less. On the other hand, it is thought that when the film thickness of the second transparent conductive layer is 120 nm or thicker, the reduction in the short circuit current density due to reduction in the transmittance exceeds the effects of improving the form factor and the open circuit voltage by reduction in the sheet resistance. That is, it is thought that when the film thickness of the second transparent conductive layer is in a range of 10 to 100 nm, effects of improving the form factor and the open circuit voltage by reduction in the sheet resistance can be realized with little effect on the haze index and the transmittance.

Therefore, it is desired that the film thickness of the second transparent conductive layer is in a range of 10 to 100 nm in order to improve the photoelectric conversion efficiency of the photoelectric conversion device significantly.

It is thought that the open circuit voltage and the form factor could be improved with very little reduction in the short circuit current density from these effects, and thereby the photoelectric conversion efficiency could be improved.

Example 29

FIG. 5 is a sectional view showing a stacked photoelectric conversion device 51 of Example 29. The photoelectric conversion device 51 having a structure shown in FIG. 5 was prepared according to the following procedure.

After following the same procedure as in Example 17 to the step of forming a substrate for a photoelectric conversion device, a p-type semiconductor layer 23a was formed by depositing a p-type microcrystalline silicon layer with a thickness of 15 nm on the substrate for a photoelectric conversion device in such a way that the silicon layer was doped in an amount 0.2 atomic percentages with boron, which is a p-type conductive impurity atom, by a plasma CVD method, using $SiH_4$, $H_2$, and $B_2H_6$ as process gases. Next, an i-type semiconductor layer 23b was formed by depositing an i-type microcrystalline silicon layer with a thickness of 300 nm on the p-type semiconductor layer 23a, using $SiH_4$ and $H_2$ as process gases. Next, an n-type semiconductor layer 23c was formed by depositing an n-type amorphous silicon layer with a thickness of 25 nm in such a way that the silicon layer was doped in an amount 0.2 atomic percentages with phosphorus, which is an n-type conductive impurity atom, using $SiH_4$, $H_2$, and $PH_3$ as process gases. Thereby, a first photoelectric conversion layer 23 was formed. A substrate temperature during depositing a layer was set at 200° C. in each layer.

Next, a second photoelectric conversion layer 25 was formed under the same conditions as that under which the photoelectric conversion layer 13 was formed in Example 13. Further, a backside electrode layer 15 was formed under the same conditions as in Example 13.

By the above process steps, the stacked photoelectric conversion device 51, which light enters from a transparent substrate 3 side, was prepared.

A current-voltage characteristic at a cell area of 1 cm$^2$ of the obtained stacked photoelectric conversion device was measured under the irradiation condition of AM 1.5 (100 mW/cm$^2$), and consequently a short circuit current density was 13.1 mA/cm$^2$, an open circuit voltage was 1.35 V, a form factor was 72%, and a photoelectric conversion efficiency was 12.7%.

Example 30

FIG. 6 is a sectional view showing a stacked photoelectric conversion device 61 of Example 30. The stacked photoelectric conversion device of Example 30 is different from that of Example 29 in that the first intermediate layer 27 is formed between the first and the second photoelectric conversion layers 23 and 25.

Hereinafter, a method of fabricating the stacked photoelectric conversion device 61 will be described referring to FIG. 6.

First, the same procedure as in Example 29 was performed to the step of forming the first photoelectric conversion layer 23.

Next, zinc oxide was deposited on the first photoelectric conversion layer 23 with a thickness of 100 nm at a substrate temperature of 200° C. by a magnetron sputtering method to form the first intermediate layer 27.

Next, the second photoelectric conversion layer 25 and a backside electrode layer 15 were formed by the same method as in Example 29.

By the above process steps, the stacked photoelectric conversion device 61, which light enters from a transparent substrate 3 side, was prepared.

A current-voltage characteristic at a cell area of 1 cm$^2$ of the obtained stacked photoelectric conversion device was measured under the irradiation condition of AM 1.5 (100 mW/cm$^2$), and consequently a short circuit current density was 13.3 mA/cm$^2$, an open circuit voltage was 1.38 V, a form factor was 73%, and a photoelectric conversion efficiency was 13.4%.

Example 31

FIG. 7 is a sectional view showing a stacked photoelectric conversion device 71 of Example 31. The stacked photoelectric conversion device of Example 31 is different from that of Example 30 in that the first intermediate layer 27 has at least an opening portion 29 through which the first photoelectric conversion layer 23 and the second photoelectric conversion layer 25 come into contact with each other.

Hereinafter, a method of fabricating the stacked photoelectric conversion device 71 will be described referring to FIG. 7.

First, the same procedure as in Example 29 was performed to the step of forming the first photoelectric conversion layer 23.

Next, zinc oxide was deposited on the first photoelectric conversion layer 23 with a thickness of 200 nm at a substrate temperature of 200° C. by a magnetron sputtering method to form the first intermediate layer 27.

Next, the opening portion 29 was formed by etching the surface of the first intermediate layer 27 by the same procedure as in etching the first transparent conductive layer 5 in Example 17 except that an etching time was 20 seconds. In order to investigate the surface configuration of the first intermediate layer 27 thus obtained in detail, the surface configuration was observed with an optical microscope and an atomic force microscope. As a result of this, it was found that opening portions 29, through which the first photoelectric conversion layer 23 was exposed, were interspersed in the first intermediate layer 27. And, a texture structure 28 was formed on the surface of the first intermediate layer 27.

Next, a second photoelectric conversion layer 25 and a backside electrode layer 15 were formed by the same method as in Example 29.

By the above process steps, the stacked photoelectric conversion device 71, which light enters from a transparent substrate 3 side, was prepared.

A current-voltage characteristic at a cell area of 1 cm$^2$ of the obtained stacked photoelectric conversion device was measured under the irradiation condition of AM 1.5 (100 mW/cm$^2$), and consequently a short circuit current density was 13.7 mA/cm$^2$, an open circuit voltage was 1.37 V, a form factor was 73%, and a photoelectric conversion efficiency was 13.7%.

Example 32

FIG. 8 is a sectional view showing a stacked photoelectric conversion device 81 of Example 32. The stacked photoelectric conversion device of Example 32 is different from that of Example 31 in that the second intermediate layer 33 covering the opening portion 29 of the first intermediate layer 27 is formed between the first intermediate layer 27 and the second photoelectric conversion layer 25.

Hereinafter, a method of fabricating the stacked photoelectric conversion device 81 will be described referring to FIG. 8.

First, the same procedure as in Example 31 was performed to the steps of forming the first intermediate layer 27 and forming the opening portion 29 by etching the first intermediate layer 27.

Next, zinc oxide was deposited with a thickness of 15 nm by the same method as the method of fabricating the second transparent conductive layer 11 to form the second intermediate layer 33.

Here, in order to investigate the surface configuration of the second intermediate layer 33 in detail, the surface configuration was observed with an optical microscope and an atomic force microscope. As a result of this, it was found that the second intermediate layer 33 covers the opening portion 29 of the first intermediate layer 27.

Next, the second photoelectric conversion layer 25 and the backside electrode layer 15 were formed by the same method as in Example 29.

By the above process steps, the stacked photoelectric conversion device 81, which light enters from a transparent substrate 3 side, was prepared.

A current-voltage characteristic at a cell area of 1 cm$^2$ of the obtained stacked photoelectric conversion device was measured under the irradiation condition of AM 1.5 (100 mW/cm$^2$), and consequently a short circuit current density was 13.6 mA/cm$^2$, an open circuit voltage was 1.39 V, a form factor was 74%, and a photoelectric conversion efficiency was 13.9%.

Example 33

FIG. 9 is a sectional view showing a stacked photoelectric conversion device 91 of Example 33. The stacked photoelectric conversion device of Example 33 is different from that of Example 29 in that in this Example, the second transparent conductive layer 11 is formed so as to cover the opening portion 7 of the first transparent conductive layer 5.

The first photoelectric conversion layer 23, the second photoelectric conversion layer 25, and the backside electrode layer 15 were formed by the same method as in Example 29. Thereby, the stacked photoelectric conversion device 91, which light enters from a transparent substrate 3 side, was prepared.

A current-voltage characteristic at a cell area of 1 cm$^2$ of the obtained stacked photoelectric conversion device was measured under the irradiation condition of AM 1.5 (100 mW/cm$^2$), and consequently a short circuit current density was 13.0 mA/cm$^2$, an open circuit voltage was 1.36 V, a form factor was 73%, and a photoelectric conversion efficiency was 12.9%.

Example 34

FIG. 10 is a sectional view showing a stacked photoelectric conversion device 101 of Example 34. The stacked photoelectric conversion device of Example 34 is different from that of Example 30 in that in this Example, the second transparent conductive layer 11 is formed so as to cover the opening portion 7 of the first transparent conductive layer 5.

The first photoelectric conversion layer 23, the second photoelectric conversion layer 25, the first intermediate layer 27, and the backside electrode layer 15 were formed by the same method as in Example 30. Thereby, the stacked photoelectric conversion device 101, which light enters from a transparent substrate 3 side, was prepared.

A current-voltage characteristic at a cell area of 1 cm² of the obtained stacked photoelectric conversion device was measured under the irradiation condition of AM 1.5 (100 mW/cm²), and consequently a short circuit current density was 13.2 mA/cm², an open circuit voltage was 1.39 V, a form factor was 74%, and a photoelectric conversion efficiency was 13.5%.

Example 35

FIG. 11 is a sectional view showing a stacked photoelectric conversion device 111 of Example 35. The stacked photoelectric conversion device of Example 35 is different from that of Example 31 in that in this Example, the second transparent conductive layer 11 is formed so as to cover the opening portion 7 of the first transparent conductive layer 5.

The first photoelectric conversion layer 23, the second photoelectric conversion layer 25, the first intermediate layer 27 having an opening portion 29, and the backside electrode layer 15 were formed by the same method as in Example 31. Thereby, the stacked photoelectric conversion device 111, which light enters from a transparent substrate 3 side, was prepared.

A current-voltage characteristic at a cell area of 1 cm² of the obtained stacked photoelectric conversion device was measured under the irradiation condition of AM 1.5 (100 mW/cm²), and consequently a short circuit current density was 13.6 mA/cm², an open circuit voltage was 1.38 V, a form factor was 73%, and a photoelectric conversion efficiency was 13.8%.

Example 36

FIG. 12 is a sectional view showing a stacked photoelectric conversion device 121 of Example 36. The stacked photoelectric conversion device of Example 36 is different from that of Example 32 in that in this Example, the second transparent conductive layer 11 is formed so as to cover the opening portion 7 of the first transparent conductive layer 5.

The first photoelectric conversion layer 23, the second photoelectric conversion layer 25, the first intermediate layer 27 having an opening portion 29, the second intermediate layer 33, and the backside electrode layer 15 were formed by the same method as in Example 32. Thereby, the stacked photoelectric conversion device 121, which light enters from a transparent substrate 3 side, was prepared.

A current-voltage characteristic at a cell area of 1 cm² of the obtained stacked photoelectric conversion device was measured under the irradiation condition of AM 1.5 (100 mW/cm²), and consequently a short circuit current density was 13.5 mA/cm², an open circuit voltage was 1.41 V, a form factor was 74%, and a photoelectric conversion efficiency was 14.1%.

Comparative Example 5

The stacked photoelectric conversion device, which has the same structure as in FIG. 6 except that the first transparent conductive layer 5 of a substrate for a photoelectric conversion device has a monolayer structure, does not have an opening portion 7 and has only a surface texture structure, was prepared according to the following procedure.

After following the same procedure as in Conventional Example 1 to the step of forming the substrate for a photoelectric conversion device, the first photoelectric conversion layer 13 and the subsequent layers were prepared by the same method as in Example 30 to prepare a stacked photoelectric conversion device which light enters from a transparent substrate 3 side.

A current-voltage characteristic at a cell area of 1 cm² of the obtained stacked photoelectric conversion device was measured under the irradiation condition of AM 1.5 (100 mW/cm²), and consequently a short circuit current density was 11.8 mA/cm², an open circuit voltage was 1.38 V, a form factor was 73%, and a photoelectric conversion efficiency was 11.9%.

Consideration of Results of Comparative Example 5 and Examples 29 to 36

In Table 4, the results of measurement of photoelectric conversion characteristics of the stacked photoelectric conversion devices of the above Comparative Example 5 and Examples 29 to 36 are shown. From Table 4, it is evident that any structure of Examples 29 to 36 can attain a higher short circuit current density and improve photoelectric conversion efficiency more than the structure of Comparative Example 5, which has a conventional substrate for a photoelectric conversion device and a conventional intermediate layer.

TABLE 4

| | 2ND TRANSPARENT CONDUCTIVE LAYER | 1ST INTERMEDIATE LAYER | OPENING PORTION OF 1ST INTERMEDIATE LAYER | SECOND INTERMEDIATE LAYER | SHORT CIRCUIT CURRENT DENSITY (mA/cm²) | OPEN CIRCUIT VOLTAGE (V) | FORM FACTOR (%) | PHOTO-ELECTRIC CONVERSION EFFICIENCY (%) |
|---|---|---|---|---|---|---|---|---|
| EX. 29 | x | x | x | x | 13.1 | 1.35 | 72 | 12.7 |
| EX. 30 | x | ○ | x | x | 13.3 | 1.38 | 73 | 13.4 |
| EX. 31 | x | ○ | ○ | x | 13.7 | 1.37 | 73 | 13.7 |
| EX. 32 | x | ○ | ○ | ○ | 13.6 | 1.39 | 74 | 13.9 |
| EX. 33 | ○ | x | x | x | 13.0 | 1.36 | 73 | 12.9 |
| EX. 34 | ○ | ○ | x | x | 13.2 | 1.39 | 74 | 13.5 |
| EX. 35 | ○ | ○ | ○ | x | 13.6 | 1.38 | 73 | 13.8 |
| EX. 36 | ○ | ○ | ○ | ○ | 13.5 | 1.41 | 74 | 14.1 |
| COMP. EX. 5 | x | (NO OPENING) | ○ | x | x | 11.8 | 1.38 | 73 | 11.9 |

CONP. EX. = CONPARATIVE EXAMPLE
EX. = EXAMPLE

Examples of the Second Aspect

Hereinafter, examples of the second aspect will be described.

Further, in these examples, a hydrogenated amorphous silicon/hydrogenated microcrystalline silicon stacked photoelectric conversion device of a superstrate type is taken as an example of a stacked photoelectric conversion device and described.

1. Comparison of a Case of Having an Opening Portion in an Intermediate Layer and a Case of not Having it.

Example 37

1-1. Structure of Stacked Photoelectric Conversion Device

Figure 15:
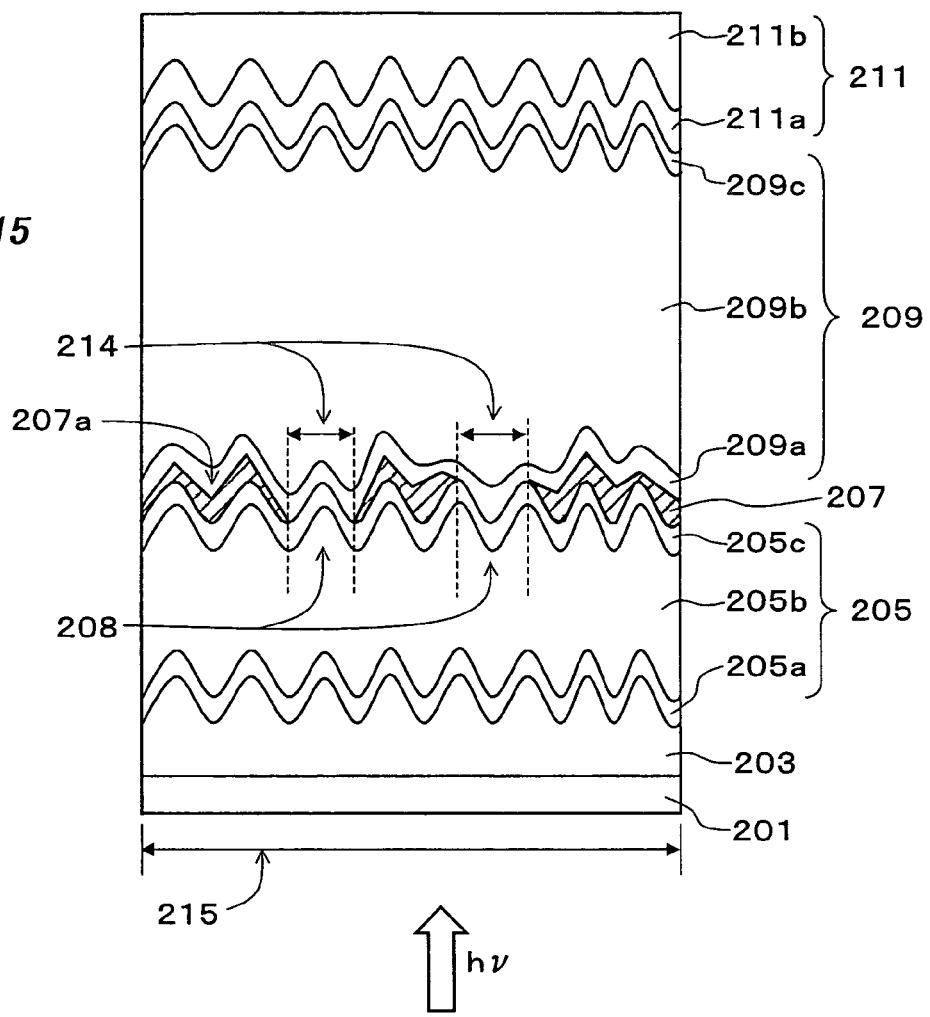
FIG. 15 is a sectional view showing a structure of a stacked photoelectric conversion device of Examples 37 to 47 of the second aspect of the present invention.

FIG. 15 is a sectional view showing a structure of a stacked photoelectric conversion device of Example 37. The stacked photoelectric conversion device of this example includes a front transparent conductive layer 203, a first photoelectric conversion layer 205, an intermediate layer 207, a second photoelectric conversion layer 209, and a backside electrode layer 211 with these layers stacked in this order on a transparent substrate 201. The intermediate layer 207 has a plurality of opening portions 208 and the first photoelectric conversion layer 205 and the second photoelectric conversion layer 209 come into contact with each other through the above-mentioned opening portion 208. And, the first photoelectric conversion layer 205 includes a p-type semiconductor layer 205a, an i-type semiconductor layer 205b and an n-type semiconductor layer 205c with these semiconductor layers stacked in this order and the second photoelectric conversion layer 209 includes a p-type semiconductor layer 209a, an i-type semiconductor layer 209b and an n-type semiconductor layer 209c with these semiconductor layers stacked in this order. The backside electrode layer 211 includes a backside transparent conductive layer 211a and a conductive layer 211b with these conductive layers stacked in this order.

1-2. Method of Fabricating Stacked Photoelectric Conversion Device

This stacked photoelectric conversion device was prepared according to the following procedure.

First, a smooth-surfaced glass substrate was used as a transparent substrate 201, and a layer of zinc oxide as a front transparent conductive layer 203 was formed on this transparent substrate 201 so as to be 500 nm in thickness at a substrate temperature of 200° C. by a magnetron sputtering method. Subsequently, the surface of the front transparent conductive layer 203 was etched. The front transparent conductive layer 203 was immersed in a 0.5% aqueous solution of hydrochloric acid of 25° C. for 90 seconds, and then the surface of the front transparent conductive layer 203 was washed well with pure water. The front transparent conductive layer 203 after etching had a sheet resistance of 15 Ω/□, a film thickness of 380 nm, and transmittance of 80% and a haze index of 45% for light with a wavelength of 550 nm.

A p-type semiconductor layer 205a was formed by depositing a p-type amorphous silicon layer with a thickness of 15 nm on the obtained substrate in such a way that the silicon layer was doped in an amount 0.2 atomic percentages with boron, which is a determinant impurity atom of a conductive type, by a plasma CVD method, using $SiH_4$, $H_2$, and $B_2H_6$ as process gases. Next, an i-type semiconductor layer 205b was formed by depositing an i-type amorphous silicon layer with a thickness of 300 nm on the p-type semiconductor layer 205a, using $SiH_4$ and $H_2$ as process gases. Next, an n-type semiconductor layer 205c was formed by depositing an n-type amorphous silicon layer with a thickness of 25 nm in such a way that the silicon layer was doped in an amount 0.2 atomic percentages with phosphorus, which is a determinant impurity atom of a conductive type, using $SiH_4$, $H_2$, and $PH_3$ as process gases. Thereby, a first photoelectric conversion layer 205 was formed. A substrate temperature during depositing a layer was set at 200° C. in each layer.

A layer of zinc oxide as the intermediate layer 207 was formed on the first photoelectric conversion layer 205 so as to be 200 nm in thickness at a substrate temperature of 200° C. by a magnetron sputtering method. Subsequently, the opening portion 208 was formed by etching the surface of the intermediate layer 207. The intermediate layer 207 was immersed in a 0.5% aqueous solution of hydrochloric acid of 25° C. for 20 seconds as in the case of etching of the front transparent conductive layer 203, and then the surface of the intermediate layer 207 was washed well with pure water and dried. In order to investigate the surface configuration of the intermediate layer 207 thus obtained in detail, the surface configuration was observed with an optical microscope. As a result of this, it was confirmed that opening portions 208, through which the n-type semiconductor layer 205c was exposed, were interspersed in the intermediate layer 207.

A p-type semiconductor layer 209a was formed by depositing a p-type microcrystalline silicon layer with a thickness of 20 nm on the intermediate layer 207 having the opening portion 208 in such a way that the silicon layer was doped in an amount 0.02 atomic percentages with boron, which is a determinant impurity atom of a conductive type, by a plasma CVD method, using $SiH_4$, $H_2$, and $B_2H_6$ as process gases. Next, an i-type semiconductor layer 209b was formed by depositing an i-type microcrystalline silicon layer with a thickness of 2.5 μm on the p-type semiconductor layer 209a, using $SiH_4$ and $H_2$ as process gases. Next, an n-type semiconductor layer 209c was formed by depositing an n-type amorphous silicon layer with a thickness of 25 nm in such a way that the silicon layer was doped in an amount 0.2 atomic percentages with phosphorus, which is a determinant impurity atom of a conductive type, using $SiH_4$, $H_2$, and $PH_3$ as process gases. Thereby, a second photoelectric conversion layer 209 was formed. A substrate temperature during depositing a layer was set at 200° C. in each layer.

A layer of zinc oxide was formed on the second photoelectric conversion layer 209 with a thickness of 50 nm as a backside transparent conductive layer 211a and a layer of silver was formed with a thickness of 500 nm as a conductive layer 211b by a magnetron sputtering method, respectively, and these layers 211a and 211b were together used as a backside electrode layer 211, and thereby the stacked photoelectric conversion device which light enters from a substrate 201 side was prepared.

A current-voltage characteristic at a light receiving area of 1 cm² of the obtained stacked photoelectric conversion device was measured under the irradiation condition of AM 1.5 (100 mW/cm²), and consequently a short circuit current density ($J_{sc}$) was 12.7 mA/cm², an open circuit voltage ($V_{oc}$) was 1.39 V, a form factor (F.F.) was 73.1%, and a photoelectric conversion efficiency (Eff.) was 12.9%.

1-3. Comparative Example 6

Figure 16:
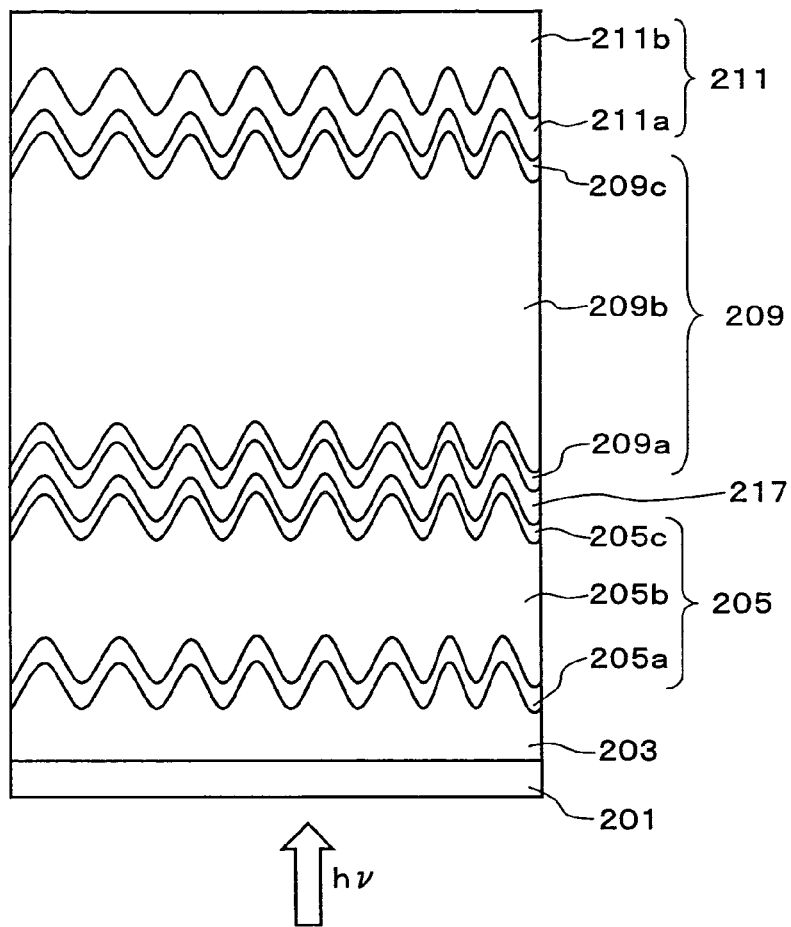
FIG. 16 is a sectional view showing a structure of a stacked photoelectric conversion device of Comparative Example 6.

FIG. 16 is a sectional view showing a structure of a stacked photoelectric conversion device of Comparative Example 6. While the device of Example 37 includes the intermediate layer 207 having an opening portion 208, the device of Comparative Example 6 includes an intermediate layer 217 not having an opening portion. The structure other than this is similar to that of Example 37.

After following the same procedure as in Example 37 to the step of forming a first transparent conductive layer 205, a layer of zinc oxide as the intermediate layer 207 was formed on the first photoelectric conversion layer 205 so as to be 100 nm in thickness at a substrate temperature of 200° C. by a magnetron sputtering method. A thickness of the zinc oxide layer was determined so as to have the same thickness as the average thickness of the intermediate layer 207 having an opening portion 208 of Example 37.

A second photoelectric conversion layer 209 and a back-side electrode layer 211 were prepared on the intermediate layer 217 by the same method as in Example 37 to prepare a stacked photoelectric conversion device which light enters from a substrate 201 side.

A current-voltage characteristic at a light receiving area of 1 cm² of the obtained stacked photoelectric conversion device was measured under the irradiation condition of AM 1.5 (100 mW/cm²), and consequently $J_{sc}$ was 11.8 mA/cm², $V_{oc}$ was 1.38 V, F. F. was 73.2%, and Eff. was 11.9%.

In Table 5, the results of measurement of photoelectric conversion characteristics of the stacked photoelectric conversion devices of the above Example 37 and Comparative Example 6 are shown.

TABLE 5

| | JSC (mA/cm²) | VOC (V) | F.F. (%) | Eff. (%) | SPECTRAL SENSITIVITY CHARACTERISTICS (RELATIVE VALUE) | |
|---|---|---|---|---|---|---|
| | | | | | FIRST PHOTOELECTRIC CONVERSION LAYER | SECOND PHOTOELECTRIC CONVERSION LAYER |
| EX. 37 | 12.7 | 1.39 | 73.1 | 12.9 | 1.02 | 1.03 |
| COMP. EX. 6 | 11.8 | 1.38 | 73.2 | 11.9 | 1.00 | 0.95 |

EX. = EXAMPLE
CONP. EX. = CONPARATIVE EXAMPLE

Here, the output current values of the first photoelectric conversion layer 205 and the second photoelectric conversion layer 209 were determined based on the spectral sensitivity characteristics obtained by measuring the first photoelectric conversion layer 205 and the second photoelectric conversion layer 209 independently, and these output current values were normalized taking the output current value of the first photoelectric conversion layer 205 of Comparative Example 6 as 1 and expressed by relative values. The results are also shown in Table 5. Incidentally, the spectral sensitivity characteristics were measured under the conditions of room temperature (25° C.), bias voltage of 0 V and a light receiving area of 0.25 cm² under the irradiation of white light (100 mW/cm²).

In Comparative Example 6, the value of output current of the first photoelectric conversion layer 205 was 1.00 but that of the second photoelectric conversion layer 209 was 0.95. This is because the light reflected in the intermediate layer 217 includes a long-wavelength light which cannot be absorbed in the bandgap of the first photoelectric conversion layer 205, does not contribute to the photoelectric conversion and become a loss. It is thought that in the stacked photoelectric conversion device, since respective photoelectric conversion layers are connected in series, the relatively small value of output current of the second photoelectric conversion layer 209 became an output current value as an overall stacked photoelectric conversion device, and therefore $J_{SC}$ of Comparative Example 6 became low.

On the other hand, in Example 37, it become possible to guide the above-mentioned long-wavelength light to the second photoelectric conversion layer 209 by the presence of the opening portion 208. And, it may be possible that by the presence of the opening portion 208, the reflection of short-wavelength light in the intermediate layer 207 decreases and the current value in the first photoelectric conversion layer 205 decreases, but in reality, the current value in the first photoelectric conversion layer 205 does not decrease. The reason for this is presumably that since most of the short-wavelength light is absorbed in the first photoelectric conversion layer 205 before it reaches the intermediate layer 207, the effect of reduction in the reflectance in the intermediate layer 207 is relatively small compared with the long-wavelength light and this effect does not lead to a decrease in the current value in the first photoelectric conversion layer 205. Therefore, it is evident from Table 5 that the value of output current of the first photoelectric conversion layer 205 does not become lower than Comparative Example 6 and the value of output current of the second photoelectric conversion layer 209 increases outstandingly compared with Comparative Example 6.

And, it is evident from Table 5 that the value of output current of the first photoelectric conversion layer 205 becomes slightly higher than Comparative Example 6. The reason for this is assumed that the optical confinement effect in the first photoelectric conversion layer 205 was improved due to the changes in the surface configuration by the opening portion 208 formed in the intermediate layer 207. From this result, it is assumed that an effect of improving the optical confinement effect in the second photoelectric conversion layer 209 by the opening portion 208 probably contributes partially to an increase in the output current value of the second photoelectric conversion layer 209. Further, it is evident from Table 5 that the presence or absence of the opening portion 208 has little effect on the open circuit voltage (Voc) and the form factor (F. F.).

It is thought that the short circuit current density (Jsc) as the overall stacked photoelectric conversion device could be increased without reduction in the open circuit voltage (Voc) and the form factor (F. F.) from these effects, and thereby the photoelectric conversion efficiency (Eff.) could be improved.

2. Changes in Characteristic in Changing Aperture Ratio of Intermediate Layer 2-1. Examples 38 to 47

In Examples 38 to 47, the stacked photoelectric conversion devices having a structure shown in FIG. 15 were prepared according to the following procedure.

First, a smooth-surfaced glass substrate was used as a transparent substrate 201, and a layer of zinc oxide as a front transparent conductive layer 203 was formed on this transparent substrate 201 so as to be 600 nm in thickness at a substrate temperature of 200° C. by a magnetron sputtering method. Subsequently, the surface of the front transparent conductive layer 203 was etched. The front transparent conductive layer 203 was immersed in a 0.5% aqueous solution of hydrochloric acid of 25° C. for 90 seconds, and then the surface of the front transparent conductive layer 203 was washed well with pure water. The front transparent conductive layer 203 after etching had a sheet resistance of 15 Ω/□, a film thickness of 380 nm, and transmittance of 80% and a haze index of 45% for light with a wavelength of 550 nm.

A p-type semiconductor layer 205a was formed by depositing a p-type amorphous silicon layer with a thickness of 15 nm on the front transparent conductive layer 203 in such a way that the silicon layer was doped in an amount 0.2 atomic percentages with boron, which is a p-type conductive impurity atom, by a plasma CVD method, using $SiH_4$, $H_2$, and $B_2H_6$ as process gases. Next, an i-type semiconductor layer 205b was formed by depositing an i-type amorphous silicon layer with a thickness of 300 nm on the p-type semiconductor layer 205a, using $SiH_4$ and $H_2$ as process gases. Next, an n-type semiconductor layer 205c was formed by depositing an n-type amorphous silicon layer with a thickness of 25 nm in such a way that the silicon layer was doped in an amount 0.2 atomic percentages with phosphorus, which is an n-type conductive impurity atom, using $SiH_4$, $H_2$, and $PH_3$ as process gases. Thereby, a first photoelectric conversion layer 205 was formed. A substrate temperature during depositing a layer was set at 200° C. in each layer.

Next, zinc oxide was deposited on the first photoelectric conversion layer 205 at a substrate temperature of 200° C. by a magnetron sputtering method with an initial film thickness varied as shown in Table 6.

Next, an intermediate layer 207 having an opening portion 208 was formed by etching the surface of zinc oxide deposited by the same procedure as in etching the front transparent conductive layer 203. But, etching times were varied as shown in Table 6. Incidentally, an average film thickness of the intermediate layers after etching was 100 nm.

In order to investigate the surface configuration of the intermediate layer 207 thus obtained in detail, the surface configuration was observed with an optical microscope and an atomic force microscope. As a result of this, it was found that opening portions 208, through which the first photoelectric conversion layer 205 was exposed, were interspersed in the intermediate layer 207. And, a texture structure 207a was formed on the surface of the intermediate layer 207.

Next, a p-type semiconductor layer 209a was formed by depositing a p-type microcrystalline silicon layer with a thickness of 20 nm on the intermediate layer 207 in such a way that the silicon layer was doped in an amount 0.02 atomic percentages with boron, which is a p-type conductive impurity atom, by a plasma CVD method, using $SiH_4$, $H_2$, and $B_2H_6$ as process gases. Next, an i-type semiconductor layer 209b was formed by depositing an i-type microcrystalline silicon layer with a thickness of 2.5 μm on the p-type semiconductor layer 209a, using $SiH_4$ and $H_2$ as process gases. Next, an n-type semiconductor layer 209c was formed by depositing an n-type amorphous silicon layer with a thickness of 25 nm in such a way that the silicon layer was doped in an amount 0.2 atomic percentages with phosphorus, which is an n-type conductive impurity atom, using $SiH_4$, $H_2$, and $PH_3$ as process gases. Thereby, a second photoelectric conversion layer 209 was formed. A substrate temperature during depositing a layer was set at 200° C. in each layer.

Next, zinc oxide was deposited on the second photoelectric conversion layer 209 with a thickness of 50 nm by a magnetron sputtering method to form a backside transparent conductive layer 211a, and further silver was deposited with a thickness of 500 nm to form a conductive layer 211b, and these layers 211a and 211b were together used as a backside electrode layer 211. By the above process steps, the stacked photoelectric conversion devices, which light enters from a transparent substrate 201 side, were prepared.

2-2. Comparative Examples 7 and 8

In Comparative Example 7, the stacked photoelectric conversion device in which an intermediate layer 217 not having an opening portion is present as shown in FIG. 16 was prepared according to the following procedure, and in Comparative Example 8, the stacked photoelectric conversion device not having an intermediate layer was prepared similarly. In addition, in Comparative Examples 7 and 8, layers other than the intermediate layers have the same structure as in Examples 38 to 47.

After following the same procedure as in Examples 38 to 47 to the step of forming a first transparent conductive layer 205, in Comparative Example 7, a layer of zinc oxide was deposited on the first photoelectric conversion layer 205 with a thickness of 100 nm at a substrate temperature of 200° C. by a magnetron sputtering method to form the intermediate layer 217. In Comparative Example 8, an intermediate layer was not formed.

Next, a second photoelectric conversion layer 209 and a backside electrode layer 211 were formed on the intermediate layer 217 in Comparative Example 7 and on the first photoelectric conversion layer 205 in Comparative Example 8, respectively, by the same method as in Examples 38 to 47. By the above process steps, the stacked photoelectric conversion devices, which light enters from a transparent substrate 201 side, were prepared.

2-3. Example 48

Example 48 will be described referring to FIG. 15 for convenience sake, but the surface configuration of the intermediate layer 207 is different as described below.

In Example 48, prepared as follows was a stacked photoelectric conversion device which has the opening portion 208 in the intermediate layer 207, and does not have a texture structure configuration on the surface of the intermediate layer 207 other than the opening portion 208 except a texture structure configuration reflecting a texture structure configuration of the first photoelectric conversion layer 205.

After following the same procedure as in Examples 38 to 47 to the step of forming a first transparent conductive layer 205, a layer of zinc oxide was formed on the first photoelectric conversion layer 205 so as to be 100 nm in thickness at a substrate temperature of 200° C. by a magnetron sputtering method and a photoresist having an opening portion was formed on the intermediate layer 207, and then the surface of the intermediate layer 207 was etched using the same aqueous solution of hydrochloric acid as in Examples 38 to 47. In order to investigate the surface configuration of the intermediate layer 207 having the opening portion 208 thus obtained in detail, the surface configuration was observed with an optical microscope and an atomic force microscope. As a result of this, it became evident that opening portions 208, through which the first photoelectric conversion layer 205 was exposed, were interspersed in the intermediate layer 207 and a new texture structure by etching was not formed on the surface of an intermediate layer 207 other than the opening portion 208. Therefore, it can be mentioned that only the opening portion 208 could be selectively formed without changing another surface configuration by etching using the photoresist. And, the aperture ratio was 38%.

Next, a second photoelectric conversion layer 209 and a backside electrode layer 211 were formed on the intermediate layer 207 by the same method as in Examples 38 to 47. By the above process steps, the stacked photoelectric conversion devices, which light enters from a transparent substrate 201 side, were prepared.

Figure 20:
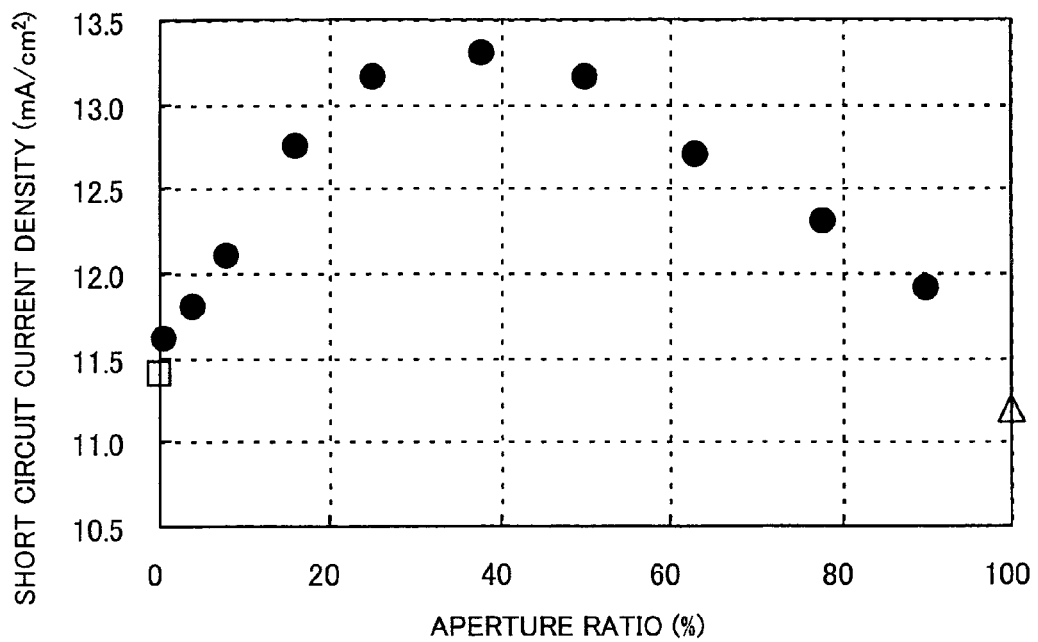
FIG. 20 is a graph showing a relationship between an aperture ratio and a short circuit current density of an intermediate layer of Examples 38 to 47 and Comparative Examples 7 to 8 of the second aspect of the present invention.
Figure 21:
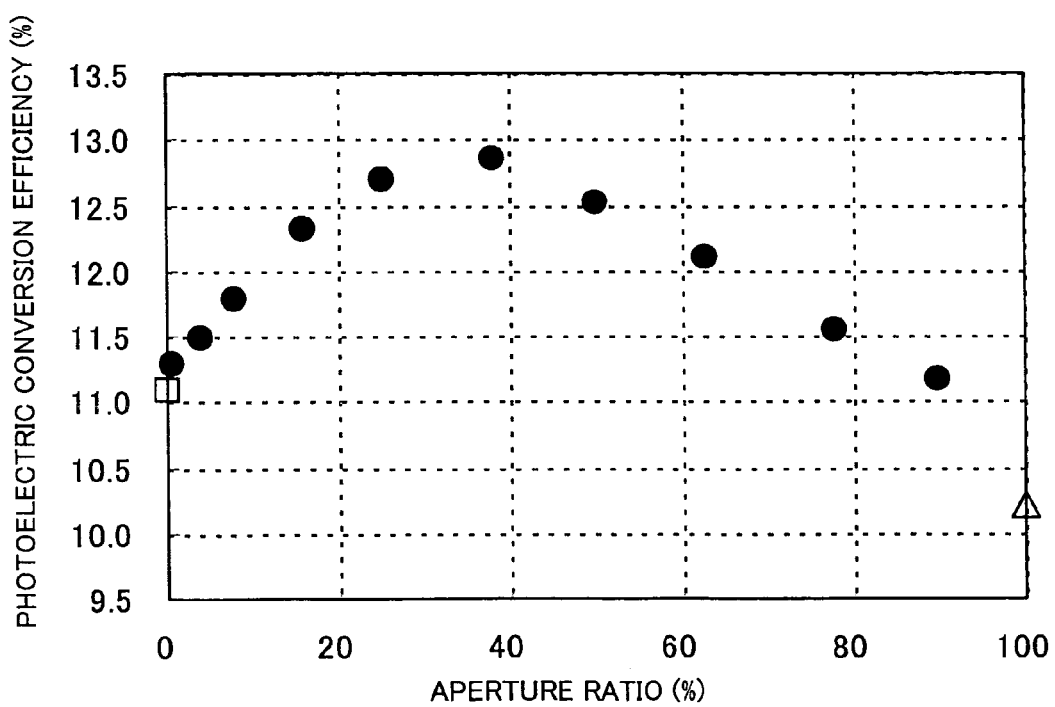
FIG. 21 is a graph showing a relationship between an aperture ratio and a photoelectric conversion efficiency of an intermediate layer of Examples 38 to 47 and Comparative Examples 7 to 8 of the second aspect of the present invention.

With respect to the stacked photoelectric conversion devices of the present Examples 38 to 47, Comparative Examples 7 and 8 and Example 48, thus obtained, a current-voltage characteristic at a cell area of 1 cm² of each photoelectric conversion device was measured under the irradiation condition of AM 1.5 (100 mW/cm²). The results of measurement of the photoelectric conversion efficiency obtained are shown in Table 6. Particularly, the dependency of the short circuit current density on the aperture ratio is shown in FIGS. 20 and 21. In FIGS. 20 and 21, (□) represents the data of Comparative Example 7, (●) represents the data of Examples 38 to 47, and (Δ) represents the data of Comparative Example 8.

when the aperture ratio is more than 50%, since a reflection effect in the intermediate layer 207 is deteriorated and the quantity of light contributing to photoelectric conversion in the first photoelectric conversion layer 205 is reduced, the short circuit current density is decreased. And, from Table 6, it is evident that a higher short circuit current density than that of the conventional photoelectric conversion device is attained in the range of the aperture ratio of 0.5 to 90%. From the above description, it has become evident that the photoelectric conversion efficiency exhibits about the same tendency as that of the short circuit current density.

When comparing Example 43 with Example 48, their aperture ratios are the same 38%, but in Example 43, a higher short circuit current than Example 48 is attained. As a reason for this, it is thought that the values of photocurrent generated in both the first photoelectric conversion layer 205 and the second photoelectric conversion layer 209 can be respectively enhanced by virtue of the optical confinement effect by opti-

TABLE 6

| | INITIAL FILM THICKNESS (nm) | ETCHING TIME (s) | APERTURE RATIO (%) | SHORT CIRCUIT CURRENT DENSITY (mA/cm²) | OPEN CIRCUIT VOLTAGE (V) | FORM FACTOR (%) | PHOTO ELECTRIC-CONVERSION EFFICIENCY (%) |
|---|---|---|---|---|---|---|---|
| COMP. EX. 7 | 100 | 0 | 0 | 11.4 | 1.37 | 0.71 | 11.1 |
| EX. 38 | 170 | 10 | 0.5 | 11.6 | 1.37 | 0.71 | 11.3 |
| EX. 39 | 200 | 20 | 4 | 11.8 | 1.37 | 0.71 | 11.5 |
| EX. 40 | 230 | 30 | 8 | 12.1 | 1.37 | 0.71 | 11.8 |
| EX. 41 | 260 | 40 | 16 | 12.8 | 1.37 | 0.71 | 12.4 |
| EX. 42 | 290 | 50 | 25 | 13.2 | 1.37 | 0.71 | 12.8 |
| EX. 43 | 320 | 60 | 38 | 13.3 | 1.37 | 0.71 | 12.9 |
| EX. 44 | 350 | 70 | 50 | 13.2 | 1.37 | 0.7 | 12.6 |
| EX. 45 | 380 | 80 | 63 | 12.7 | 1.36 | 0.7 | 12.1 |
| EX. 46 | 410 | 90 | 78 | 12.3 | 1.36 | 0.69 | 11.5 |
| EX. 47 | 430 | 100 | 90 | 11.9 | 1.36 | 0.69 | 11.2 |
| COMP. EX. 8 | 0 | 0 | 100 | 11.2 | 1.34 | 0.68 | 10.2 |
| EX. 48 | 100 | | 38 | 12.9 | 1.37 | 0.71 | 12.5 |

CONP. EX. = CONPARATIVE EXAMPLE
EX. = EXAMPLE 2-4. Consideration of Results of Examples 38 to 47, and Comparative Examples 7 and 8 and Example 48

First, a relationship between an initial film thickness and an etching time of the zinc oxide layer will be described. In preparing the intermediate layer 207, the etching time of the zinc oxide layer was shorten when the pre-etching initial film thickness was thin and lengthened when the initial film thickness was thick so that an average film thickness of the intermediate layer 207 after etching became a substantially constant thickness of 100 nm.

As a result, it is shown in FIG. 20 that the short circuit current density increases with increase in an aperture ratio in the case of a low aperture ratio. When the aperture ratio reaches about 40 to 50%, an increase in the short circuit current density stops and a relative maximum is formed. Further, when the aperture ratio exceeds 50%, the short circuit current density begins to decrease. From this result, it is thought that when the aperture ratio is 50% or lower, since the long-wavelength light passes through the intermediate layer 207 efficiently with increase in the aperture ratio and contributes to photoelectric conversion in the second photoelectric conversion layer 209, the short circuit current increases, but cal scattering, refraction or the like because the texture structure 207a is present on the surface of the intermediate layer 207 in Example 43.

Therefore, it is preferred to bring the aperture ratio into the range of 0.5 to 90% in order to improve the photoelectric conversion efficiency of the stacked photoelectric conversion device. Further, bringing the aperture ratio into the range of 16 to 63% it is more preferred because higher photoelectric conversion efficiency can be attained.

It is thought that the short circuit current density could be significantly improved with very little reduction in the open circuit voltage and the form factor from these effects, and thereby the photoelectric conversion efficiency could be improved.

The invention claimed is:
1. A photoelectric conversion device comprising:
  a photoelectric conversion layer stacked above a structure; and
  a backside electrode layer stacked above the photoelectric conversion layer;
  wherein the structure comprises:
    a substrate; and
    a transparent electrode layer formed on at least a part of a surface region of the substrate, the transparent elec- trode layer having at least an opening portion within which the transparent electrode layer is absent,
wherein the opening portion does not completely physically divide the transparent electrode layer, and
wherein the opening portion is not covered by the transparent electrode layer.

2. A stacked photoelectric conversion device, comprising:
a first photoelectric conversion layer stacked above a structure;
a first intermediate layer stacked above the first photoelectric conversion layer;
a second photoelectric conversion layer stacked above the first intermediate layer such that the first intermediate layer is sandwiched between the first and second photoelectric conversion layers; and
a backside electrode layer stacked above the second photoelectric conversion layer,
wherein the structure comprises:
a substrate; and
a first transparent electrode layer formed on at least a part of a surface region of the substrate, the first transparent electrode layer having at least an opening portion within which the first transparent electrode layer is absent,
wherein the opening portion does not completely physically divide the first transparent electrode layer, and
wherein the opening portion is not covered by the first transparent electrode layer.

3. The device of claim 2, wherein the first intermediate layer has at least an opening portion within which the first intermediate layer is absent, and the first and second photoelectric conversion layers sandwiching the first intermediate layer therebetween come into contact with each other through the opening portion of the first intermediate layer.

4. The device of claim 2, wherein the first intermediate layer has at least an opening portion within which the first intermediate layer is absent, the device further comprising a second intermediate layer between the first intermediate layer and the second photoelectric conversion layer, the second intermediate layer covering the opening portion of the first intermediate layer.

5. The device of claim 4, wherein the second intermediate layer has a thinner film thickness than that of the first intermediate layer.

6. The device of claim 1, wherein the substrate is a transparent substrate such that the transparent electrode layer is formed on the surface region of the transparent substrate.

7. The device of claim 6, wherein the transparent electrode layer has a texture structure on its surface.

8. The device of claim 6, wherein
a haze index at 550 nm wavelength of the transparent electrode layer measured ranges is substantially at least 65% and
a light transmittance of a combination of the transparent substrate and the transparent electrode layer is substantially at least 78%.

9. The device of claim 6, wherein
an aperture ratio of the transparent electrode layer substantially ranges between 0.8% to 37%, the aperture ratio being defined as a sum of areas of the opening portions over a surface area divided by the surface area, the surface area being an area of the surface region of the transparent substrate on which the transparent electrode layer is formed, and
wherein an average radius of the opening portions over the surface area is substantially equal to or less than 3.13 μm, in which a radius $r_n$ of an n'th opening portion is calculated by a formula $r_n=(S_n/\pi)^{1/2}$, n being an integer from 1 to k in which k is a number of the opening portions, and $S_n$ being an area of the n'th opening portion.

10. The device of claim 6, wherein the opening portions do not include grooves for completely physically separating a transparent electrode provided for forming an integrated structure in which a plurality of photoelectric conversion cells are electrically connected in series.

11. The device of claim 6, wherein the transparent electrode layer is a first transparent electrode layer, the device further comprising:
a second transparent electrode layer formed on the first transparent electrode layer so as to be formed in between the first transparent electrode layer and the photoelectric conversion layer, wherein
the second transparent electrode layer covers some or all of the opening portions.

12. The device of claim 11, wherein a thickness of the second transparent electrode layer is less than a thickness of the first transparent electrode layer.

13. The device of claim 11, wherein
the thickness of the first transparent electrode layer ranges substantially between 500 nm and 1300 nm, and
the thickness of the second transparent electrode layer ranges substantially between 10 nm and 100 nm.

14. The device of claim 11, wherein a synthesized sheet resistance of the first and the second transparent electrode substantially ranges between 5 Ω/□ and 25 Ω/□.

15. The device of claim 1, wherein the substrate has a metal film, a transparent conductive film, or an insulating film on the surface thereof.

16. The device of claim 6, wherein the photoelectric conversion layer is a first photoelectric conversion layer, the device further comprising:
an intermediate layer formed on the first photoelectric conversion layer; and
a second photoelectric conversion layer formed on the intermediate layer.

17. The device of claim 16, wherein
the opening portions of the transparent electrode layer are first opening portions, and
the intermediate layer has a plurality of second opening portions within which the intermediate layer is absent.

18. The device of claim 17, wherein the first and second photoelectric conversions layers are in contact through some or all second opening portions.

19. The device of claim 17, wherein the intermediate layer is a first intermediate layer, the device further comprising:
a second intermediate layer formed on the first intermediate layer so as to be formed in between the first intermediate layer and the second photoelectric conversion layer, wherein
the second intermediate layer covers some or all of the second opening portions.

20. The device of claim 16, wherein an aperture ratio of the intermediate layer substantially ranges between 0.5% and 90%, the aperture ratio being defined as a sum of widths of the intermediate layer opening portions over a cross section divided by a width of the cross section.

21. The device of claim 20, wherein the aperture ratio of the intermediate layer substantially ranges between 16% and 63%.

22. The device of claim 16, wherein the intermediate layer has a texture structure on its surface.

23. The device of claim 16, wherein a short circuit current density of the first and second photoelectric conversion layers are substantially equal.

24. The device of claim 1, wherein a plurality of opening portions are interspersed in the transparent electrode.

25. The device of claim 2, wherein a plurality of opening portions are interspersed in the first transparent electrode.

26. The device of claim 6, wherein the transparent substrate is made of glass or resin having heat resistance.

27. The device of claim 6, wherein the transparent substrate is made of glass or resin having heat resistance, and is coated with an insulating film.

28. The device of claim 1, wherein the photoelectric conversion layer comprises
- a p-n junction having a p-type semiconductor layer and a n-type semiconductor layer, or
- a p-i-n junction having a p-type semiconductor layer, an i-type semiconductor layer, and a n-type semiconductor layer.

29. The device of claim 2, wherein the first photoelectric conversion layer comprises
- a p-n junction having a p-type semiconductor layer and a n-type semiconductor layer, or
- a p-i-n junction having a p-type semiconductor layer, an i-type semiconductor layer, and a n-type semiconductor layer.

30. The device of claim 29, wherein the second photoelectric conversion layer comprises
- a p-n junction having a p-type semiconductor layer and a n-type semiconductor layer, or
- a p-i-n junction having a p-type semiconductor layer, an i-type semiconductor layer, and a n-type semiconductor layer.

31. The device of claim 2, wherein the second photoelectric conversion layer comprises
- a p-n junction having a p-type semiconductor layer and a n-type semiconductor layer, or
- a p-i-n junction having a p-type semiconductor layer, an i-type semiconductor layer, and a n-type semiconductor layer.

32. The device of claim 16, wherein the second photoelectric conversion layer comprises
- a p-n junction having a p-type semiconductor layer and a n-type semiconductor layer, or
- a p-i-n junction having a p-type semiconductor layer, an i-type semiconductor layer, and a n-type semiconductor layer.

* * * * *